United States Patent
Sasaki

(10) Patent No.: US 7,923,197 B2
(45) Date of Patent: Apr. 12, 2011

(54) LITHOGRAPHIC PRINTING PLATE PRECURSOR

(75) Inventor: Tomoya Sasaki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 32 days.

(21) Appl. No.: 12/408,876

(22) Filed: Mar. 23, 2009

(65) Prior Publication Data

US 2009/0246692 A1 Oct. 1, 2009

(30) Foreign Application Priority Data

Mar. 25, 2008 (JP) ................................. 2008-079331

(51) Int. Cl.
*G03F 7/11* (2006.01)
*G03F 7/027* (2006.01)

(52) U.S. Cl. ............... 430/272.1; 430/271.1; 430/276.1; 430/302

(58) Field of Classification Search ........................ None
See application file for complete search history.

(56) References Cited

U.S. PATENT DOCUMENTS

| 2004/0068026 A1 | 4/2004 | Kunita et al. |
| 2005/0048398 A1 | 3/2005 | Yamasaki et al. |
| 2006/0194149 A1 | 8/2006 | Yamasaki et al. |
| 2006/0210920 A1 | 9/2006 | Shibuya |

FOREIGN PATENT DOCUMENTS

| JP | 2005-238816 A | 9/2005 |
| JP | 2006-239860 A | 9/2006 |
| JP | 2006-239867 A | 9/2006 |
| JP | 2006-264333 A | 10/2006 |
| JP | 2007237517 A | 9/2007 |
| JP | 2008020615 A | 1/2008 |

OTHER PUBLICATIONS

English translation of JP2006-239860, A (2006) from machine translation from AIPN Japan Patent Office National center for Industrial Property Information and Training, generated May 26, 2010, 65 pages and 26 pages.*
English translation of JP2006-239867, A (2006) from machine translation from AIPN Japan Patent Office National center for Industrial Property Information and Training, generated May 27, 2010, 67 pages and 25 pages.*
English translation of JP2007-237517, A (2007) from machine translation from AIPN Japan Patent Office National center for Industrial Property Information and Training, generated May 27, 2010, 57 pages and 26 pages.*
English translation of JP2008-020615, A (2008) from machine translation from AIPN Japan Patent Office National center for Industrial Property Information and Training, generated Jun. 20, 2010, 50 pages and 42 pages.*
Extended European Search Report dated Jul. 30, 2009.

* cited by examiner

*Primary Examiner* — Cynthia Hamilton
(74) *Attorney, Agent, or Firm* — Sughrue Mion, PLLC

(57) ABSTRACT

A lithographic printing plate precursor includes, in the following order: a support; an intermediate layer; and an image-forming layer, and the intermediate layer contains a polymer (A) comprising a repeating unit (a1) represented by the formula (I) as defined herein.

13 Claims, 1 Drawing Sheet

LITHOGRAPHIC PRINTING PLATE PRECURSOR

FIELD OF THE INVENTION

The present invention relates to a lithographic printing plate precursor, particularly, to a lithographic printing plate precursor which provide a lithographic printing plate excellent in both stain resistance and printing durability even when the lithographic printing plate precursor is preserved before image exposure.

BACKGROUND OF THE INVENTION

In general, a lithographic printing plate is composed of an oleophilic image area accepting ink and a hydrophilic non-image area accepting dampening water in the process of printing. Lithographic printing is a printing method utilizing the nature of water and printing ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (also referred to as a photosensitive layer, an image-recording layer or an image-forming layer) has heretofore been broadly used. Ordinarily, the lithographic printing plate is obtained by conducting plate making according to a method of exposing the lithographic printing plate precursor through an original, for example, a lith film, and then while leaving the image-recording layer corresponding to the image area, removing other unnecessary image-recording layer by dissolving with an alkaline developer or an organic solvent to reveal the hydrophilic surface of support thereby forming the non-image area.

With the developments of image-forming technology in recent years, a computer-to-plate technique in which plate making is performed by directly exposing a lithographic printing plate precursor with laser based on digitalized data, for example, from a computer without using a lith film has been developed and high-sensitive lithographic printing plate precursors of laser recording system for use in the technique have also been developed.

On the other hand, instead of the process of removing the unnecessary image-recording layer by dissolution with the alkaline developer or the like after the image exposure, a method of obtaining a lithographic printing plate by processing with a developer closer to neutral region or a method referred to as on-press development in which after the image exposure, the non-image area is removed on a printing machine to obtain a lithographic printing plate has been proposed.

In order to respond to these image exposure and development processing, various developments have been made. In particular, for the purpose of improving printing durability and stain resistance of lithographic printing plate, a large number of proposals with respect to a lithographic printing plate precursor and a processing method have been made. For example, in JP-A-2005-238816 (the term "JP-A" as used herein means an "unexamined published Japanese patent application"), with the intention to the improvements in the printing durability and the like, a technique of incorporating a low molecular weight compound having a functional group capable of interacting with the surface of support into an image-forming layer or an undercoat layer provided on the support is proposed and as examples of the low molecular weight compound having a functional group capable of interacting with the surface of support, compounds having a group connecting a support-adsorbing group through a hetero atom in an α-position of an ethylenically unsaturated bond are described. Also, in JP-A-2006-239860, JP-A-2006-239867 and JP-A-2006-264333, with the intention to the improvements in the printing durability and the like, techniques of incorporating a copolymer containing a repeating unit having an ethylenically unsaturated bond and a repeating unit having a functional group capable of interacting with the surface of support into an image-forming layer or an undercoat layer provided on the support are proposed and copolymers containing as the repeating unit having an ethylenically unsaturated bond, a repeating unit having a group connecting the ethylenically unsaturated bond through a hetero atom in its α-position are described.

According to these prior arts, although the printing durability and the like are improved, further improvements have been desired. In particular, a lithographic printing plate precursor which can prepare a lithographic printing plate excellent in stain resistance as well as the printing durability and which is prevented from deterioration of the stain resistance even when the lithographic printing plate precursor is preserved has been desired.

SUMMARY OF THE INVENTION

Therefore, an object of the present invention is to provide a lithographic printing plate precursor which can prepare a lithographic printing plate excellent in both stain resistance and printing durability and in which the stain resistance is well maintained even when the lithographic printing plate precursor is preserved before image exposure.

As a result of the intensive investigations, the inventor has found that the object described above can be achieved by using an intermediate layer containing a polymer including a specific repeating unit.

The present invention includes the following items.

(1) A lithographic printing plate precursor comprising a support, an intermediate layer and an image-forming layer in this order, wherein the intermediate layer contains a polymer (A) containing a repeating unit (a1) represented by the following formula (I):

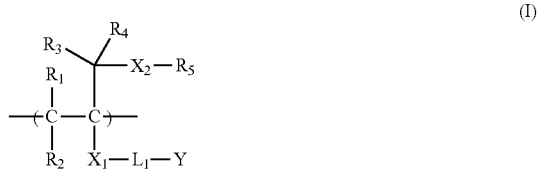

In formula (I), $R_1$ and $R_2$ each independently represents a hydrogen atom, an alkyl group having from 1 to 6 carbon atoms, an aryl group or an aralkyl group;

$R_3$ and $R_4$ each independently represents a hydrogen atom, an alkyl group having from 1 to 6 carbon atoms, an aryl group or an aralkyl group;

$R_5$ represents a hydrogen atom, an alkyl group having from 1 to 6 carbon atoms, an aryl group, an aralkyl group or $-L_2-Z$;

$X_1$ represents —O—, —CO—, —CO—O—, —O—CO—, —NR$_{500}$—, —NR$_{500}$—CO— or —CO—NR$_{500}$—;

$X_2$ represents —O—, —S— or —NR$_{500}$—;

$L_1$ represents a single bond, —CO—, —O—, —NR$_{500}$—, —S—, a divalent aliphatic group, a divalent aromatic group or a divalent connecting group selected from groups formed by combination of these groups;

Y represents a hydrogen atom, an alkyl group having from 1 to 6 carbon atoms, an aryl group, —OH, an alkoxy group, —N(R$_{500}$)(R$_{501}$), a cyano group, a group selected from a group Q shown below, an amido group, a poly(ethyleneoxy) group or a carboxylic acid group not belonging to the group Q or a salt thereof;

Q group includes a phosphonic acid group or a salt thereof, a phosphoric acid ester group or a salt thereof, a sulfonic acid group or a salt thereof, a sulfuric acid ester group or a salt thereof, an ammonium group or a salt thereof, a pyridinium group or a salt thereof, a 1,2-dicarboxylic acid group or a salt thereof, a phthalic acid group or a salt thereof, a 1,3-dicarboxylic acid group or a salt thereof, a 1,2-diol group, a catechol group or a salt thereof, a salicylic acid group or a salt thereof, a boronic acid group or a salt thereof, a trialkoxysilyloxy group and a 1,3-dicarbonyl group;

$L_2$ represents —CO—, —O—, —NR$_{500}$—, —S—, a divalent aliphatic group, a divalent aromatic group or a divalent connecting group selected from groups formed by combination of these groups;

Z represents a hydrogen atom, an alkyl group having from 1 to 6 carbon atoms, an aryl group, —OH, an alkoxy group, —N(R$_{500}$)(R$_{501}$), a cyano group, a group selected from the group Q shown above, an amido group, a poly(ethyleneoxy) group or a carboxylic acid group not belonging to the group Q or a salt thereof; and $R_{500}$ and $R_{501}$ each independently represents a hydrogen atom, an alkyl group, an aryl group or an aralkyl group.

(2) The lithographic printing plate precursor as described in (1) above, wherein $X_2$ in formula (I) is —O—.

(3) The lithographic printing plate precursor as described in (2) above, wherein $R_5$ in formula (I) is a hydrogen atom.

(4) The lithographic printing plate precursor as described in (1) or (2) above, wherein $R_5$ in formula (I) is -$L_2$—Z, and Z is a group selected from the group Q shown above, an amido group, a poly(ethyleneoxy) group or a carboxylic acid group not belonging to the group Q or a salt thereof (5) The lithographic printing plate precursor as described in (4) above, wherein Z is a phosphoric acid ester group or a salt thereof, a phosphonic acid group or a salt thereof, an ammonium group, a sulfonic acid group or a salt thereof, an amido group, a poly(ethyleneoxy) group or a carboxylic acid group or a salt thereof (6) The lithographic printing plate precursor as described in any one of (1) to (5) above, wherein Y in formula (I) is a group selected from the group Q shown above, an amido group, a poly(ethyleneoxy) group or a carboxylic acid group not belonging to the group Q or a salt thereof.

(7) The lithographic printing plate precursor as described in (6) above, wherein Y is a phosphoric acid ester group or a salt thereof, a phosphonic acid group or a salt thereof, an ammonium group, a sulfonic acid group or a salt thereof, an amido group, a poly(ethyleneoxy) group or a carboxylic acid group or a salt thereof.

(8) The lithographic printing plate precursor as described in any one of (1) to (7) above, wherein the polymer (A) contains a repeating unit (a2) having at least one ethylenically unsaturated bond in addition to the repeating unit (a1).

(9) The lithographic printing plate precursor as described in (8) above, wherein the polymer (A) further contains a repeating unit (a3) having at least one functional group capable of interacting with a surface of the support and/or a repeating unit (a4) having at least one hydrophilic group, other than the repeating unit (a1).

(10) The lithographic printing plate precursor as described in any one of (1) to (9) above, wherein the image-forming layer contains (B) a polymerization initiator, (C) a polymerizable compound and (D) a binder polymer.

(11) The lithographic printing plate precursor as described in (10) above, wherein the image-recording layer further contains (E) a sensitizing dye.

(12) A method of preparing a lithographic printing plate comprising after imagewise exposure of the lithographic printing plate precursor as described in any one of (1) to (11) above, conducting development processing and gum treatment with one solution in an automatic processor.

(13) The method of preparing a lithographic printing plate as described in (12) above, wherein pH of the solution is from 2 to 10.

According to the present invention, a lithographic printing plate precursor which can prepare a lithographic printing plate excellent in both stain resistance and printing durability and in which the stain resistance is well maintained even when the lithographic printing plate precursor is preserved before image exposure can be provided.

DESCRIPTION OF REFERENCE NUMERALS AND SIGNS

Figure 1:
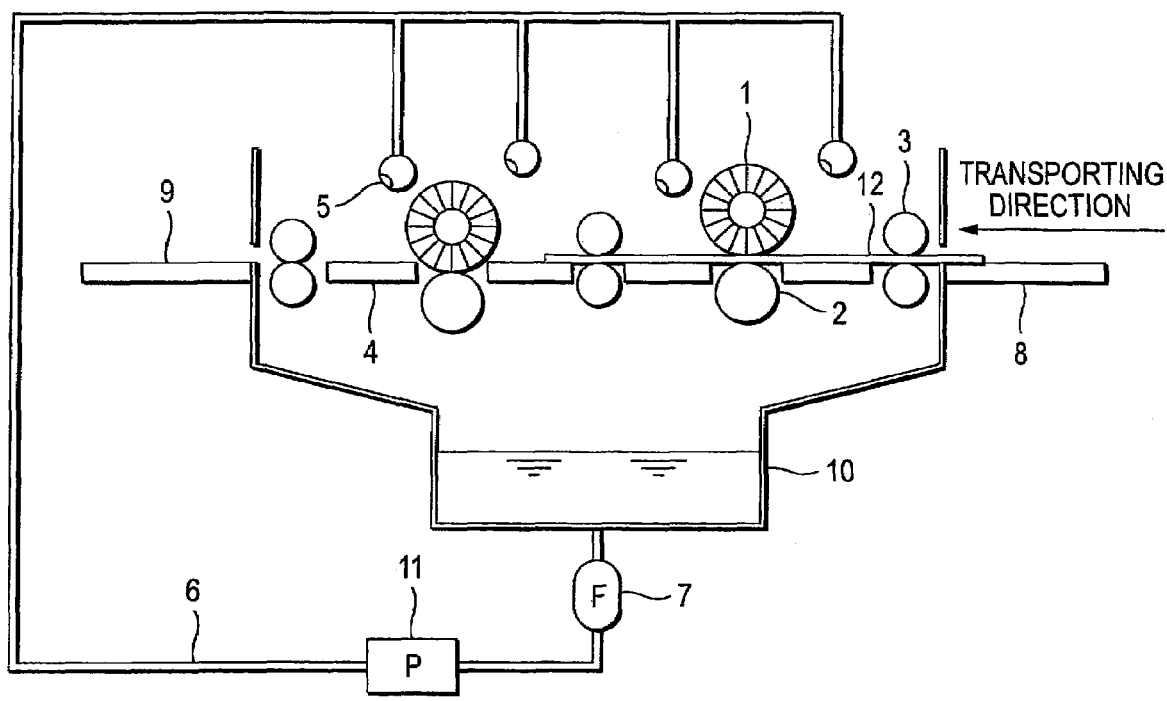
FIG. 1 is an illustration for showing a structure of an automatic development processor.

1: Rotating brush roller
2: Backing roller
3: Transport roller
4: Transport guide plate
5: Spray pipe
6: Pipe line
7: Filter
8: Plate supply table
9: Plate discharge table
10: Developer tank
11: Circulating pump
12: Plate

DETAILED DESCRIPTION OF THE INVENTION

In the specification, with respect to the description of a group in a compound represented by a formula, when the group is not indicated whether substituted or unsubstituted, unless otherwise indicated specifically, the group includes not only the unsubstituted group but also the substituted group, if the group is able to have a substituent. For example, the description "R represents an alkyl group, an aryl group or a heterocyclic group" in a formula means that R represents an unsubstituted alkyl group, a substituted alkyl group, an unsubstituted aryl group, a substituted aryl group, an unsubstituted heterocyclic group or a substituted heterocyclic group.

The lithographic printing plate precursor according to the invention comprises a support, an intermediate layer and an image-forming layer in this order, wherein the intermediate layer contains a polymer including a specific repeating unit.

[Intermediate Layer]

The intermediate layer will be described in detail below.

The polymer for use in the intermediate layer is characterized by containing a repeating unit (a1) represented by the following formula (I):

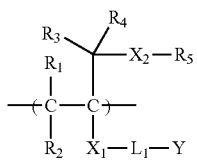

In formula (I), $R_1$ and $R_2$ each independently represents a hydrogen atom, an alkyl group having from 1 to 6 carbon atoms, an aryl group or an aralkyl group;

$R_3$ and $R_4$ each independently represents a hydrogen atom, an alkyl group having from 1 to 6 carbon atoms, an aryl group or an aralkyl group;

$R_5$ represents a hydrogen atom, an alkyl group having from 1 to 6 carbon atoms, an aryl group, an aralkyl group or -$L_2$—Z;

$X_1$ represents —O—, —CO—, —CO—O—, —O—CO—, —$NR_{500}$—, —$NR_{500}$—CO— or —CO—$NR_{500}$—;

$X_2$ represents —O—, —S— or —$NR_{500}$—;

$L_1$ represents a single bond, —CO—, —O—, —$NR_{500}$—, —S—, a divalent aliphatic group, a divalent aromatic group or a divalent connecting group selected from groups formed by combination of these groups;

Y represents a hydrogen atom, an alkyl group having from 1 to 6 carbon atoms, an aryl group, —OH, an alkoxy group, —$N(R_{500})(R_{501})$, a cyano group, a group selected from a group Q shown below, an amido group, a poly(ethyleneoxy) group or a carboxylic acid group not belonging to the group Q or a salt thereof;

Q group includes a phosphonic acid or a salt thereof, a phosphoric acid ester group or a salt thereof, a sulfonic acid group or a salt thereof, a sulfuric acid ester group or a salt thereof, an ammonium group or a salt thereof, a pyridinium group or a salt thereof, a 1,2-dicarboxylic acid group or a salt thereof, a phthalic acid group or a salt thereof, a 1,3-dicarboxylic acid group or a salt thereof, a 1,2-diol group, a catechol group or a salt thereof, a salicylic acid group or a salt thereof, a boronic acid group or a salt thereof, a trialkoxysilyloxy group and a 1,3-dicarbonyl group;

$L_2$ represents —CO—, —O—, —$NR_{500}$—, —S—, a divalent aliphatic group, a divalent aromatic group or a divalent connecting group selected from groups formed by combination of these groups;

Z represents a hydrogen atom, an alkyl group having from 1 to 6 carbon atoms, an aryl group, —OH, an alkoxy group, —$N(R_{500})(R_{501})$, a cyano group, a group selected from the group Q shown above, an amido group, a poly(ethyleneoxy) group or a carboxylic acid group not belonging to the group Q or a salt thereof; and $R_{500}$ and $R_{501}$ each independently represents a hydrogen atom, an alkyl group, an aryl group or an aralkyl group.

In the repeating unit (a1), when $X_2$ represents —O—, —S— or —$NR_{500}$—, the printing durability and stain resistance are improved and the effect of well maintaining the stain resistance is obtained even when the lithographic printing plate precursor is preserved before image exposure.

In the repeating unit (a1), the group belonging to the group Q is ordinarily a functional group having high interaction with a metal support, for example, an aluminum support. The group is also a group having high hydrophilicity. Specific examples of the group belonging to the group Q are set forth below.

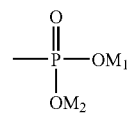
(1)

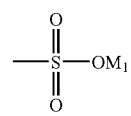
(2)

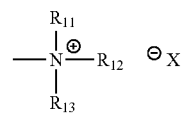
(3)

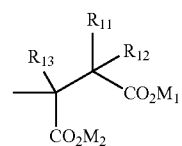
(4)

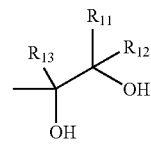
(5)

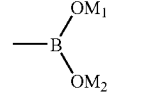
(6)

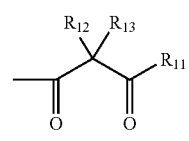
(7)

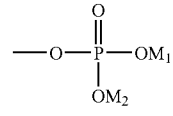
(8)

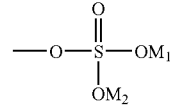
(9)

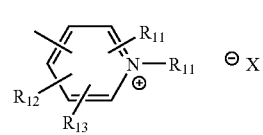
(10)

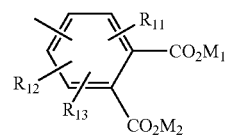
(11)

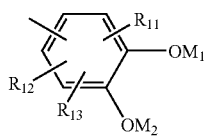

(12)

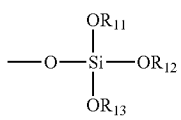

(13)

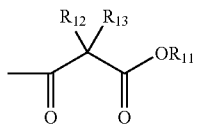

(14)

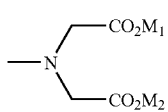

(15)

In formulae described above, $R_{11}$ to $R_{13}$ each independently represents a hydrogen atom, an alkyl group, an aryl group, an alkynyl group or an alkenyl group, $M_1$ and $M_2$ each independently represents a hydrogen atom, a metal atom or an ammonium group, and $X^-$ represents a counter anion.

Of the groups belonging to the group Q, the groups represented by formulae (1) to (3), (8) to (10) and (15) are preferable, and the groups represented by formulae (1) to (3), (8), (9) and (15) are more preferable.

Preferable embodiments of formula (I) are set forth below.

$R_1$ and $R_2$ each independently represents a hydrogen atom, a methyl group or an ethyl group.

$R_3$ and $R_4$ each independently represents a hydrogen atom, a methyl group, an ethyl group or a phenyl group.

$X_2$ represents —O—

$R_5$ represents a hydrogen atom, a methyl group or $-L_2-Z$, wherein $L_2$ represents —O—, —S—, —CO—O—, —O—CO—, —CO—NR$_{500}$—, —NR$_{500}$—CO—, a divalent aliphatic group or a divalent connecting group selected from groups formed by combination of these groups, and Z represents a group selected from the group Q shown above, an amido group, a poly(ethyleneoxy) group or a carboxylic acid group not belonging to the group Q or a salt thereof.

$X_1$ represents —CO—, —CO—O— or —CO—NR$_{500}$—.

$L_1$ represents a single bond, —O—, —S—, —CO—O—, —O—CO—, —CO—NR$_{500}$—, —NR$_{500}$—CO—, a divalent aliphatic group or a divalent connecting group selected from groups formed by combination of these groups.

Y represents a hydrogen atom, a methyl group or an ethyl group, when $L_1$ represents a single bond, and Y represents a group selected from the group Q shown above, an amido group, a poly(ethyleneoxy) group or a carboxylic acid group not belonging to the group Q or a salt thereof, when $L_1$ represents the group other than the single bond.

In more Preferable embodiment, in formula (1), $X_2$ is —O—, and $R_5$ is a hydrogen atom.

In other more preferable embodiment, in formula (1), $R_5$ is $-L_2-Z$, and Z is a group selected from the group Q shown above, an amido group, a poly(ethyleneoxy) group or a carboxylic acid group not belonging to the group Q or a salt thereof. Still more preferably, Z is a phosphoric acid ester group or a salt thereof, a phosphonic acid group or a salt thereof, an ammonium group, a sulfonic acid group or a salt thereof, an amido group, a poly(ethyleneoxy) group or a carboxylic acid group or a salt thereof.

In other more preferable embodiment, in formula (I), Y is a group selected from the group Q shown above, an amido group, a poly(ethyleneoxy) group or a carboxylic acid group not belonging to the group Q or a salt thereof. Still more preferably, Y is a phosphoric acid ester group or a salt thereof, a phosphonic acid group or a salt thereof, an ammonium group, a sulfonic acid group or a salt thereof, an amido group, a poly(ethyleneoxy) group or a carboxylic acid group or a salt thereof.

Specific examples of the repeating unit represented by formula (I) are set forth below, but the invention should not be construed as being limited thereto. In the specific examples shown below, a number of repeating unit of ethyleneoxy groups is an average value.

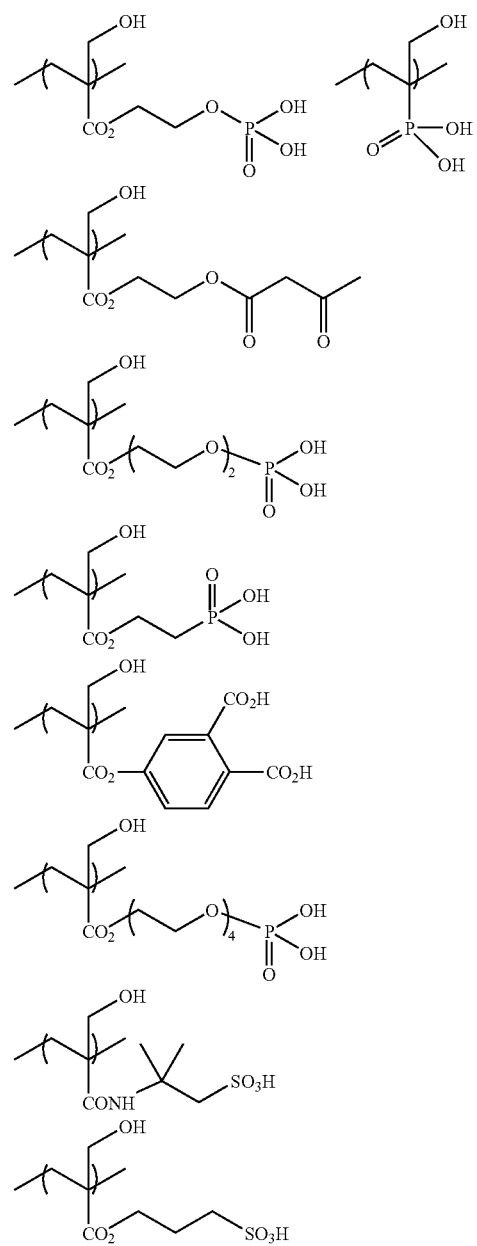

-continued
9
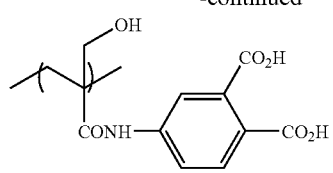
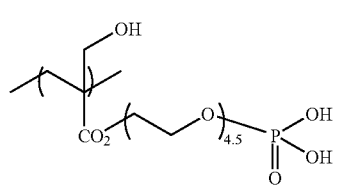
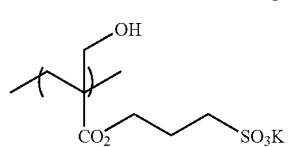
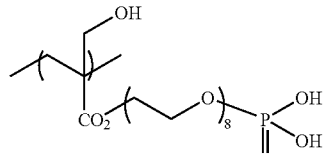
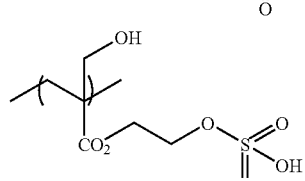
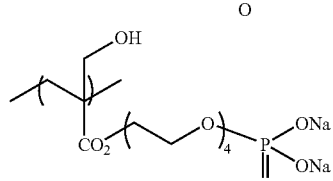
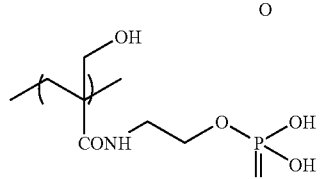
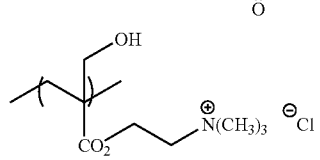
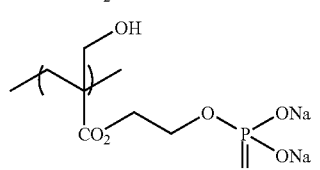
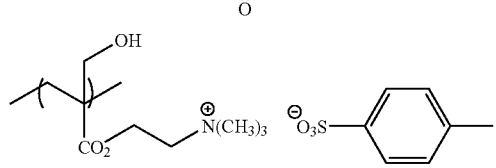
-continued
10
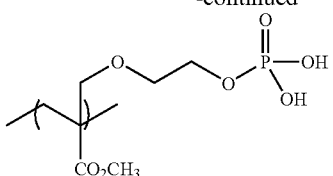
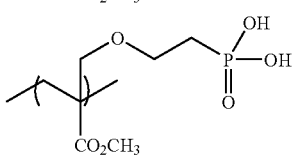
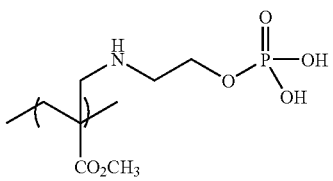
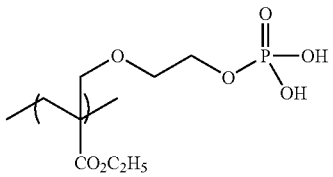
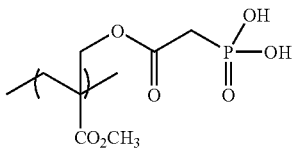
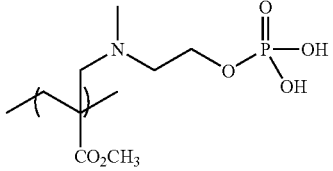
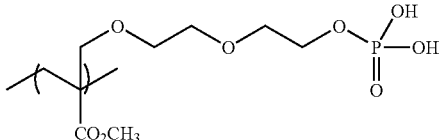
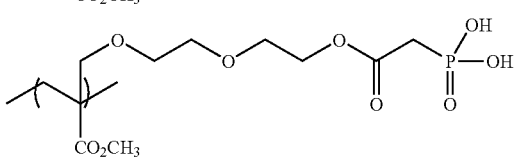
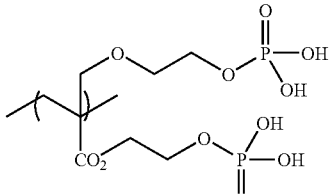
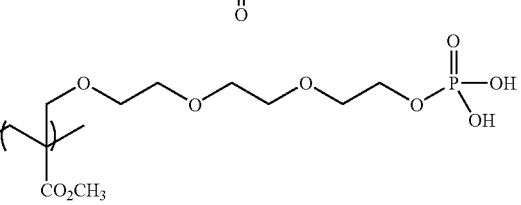

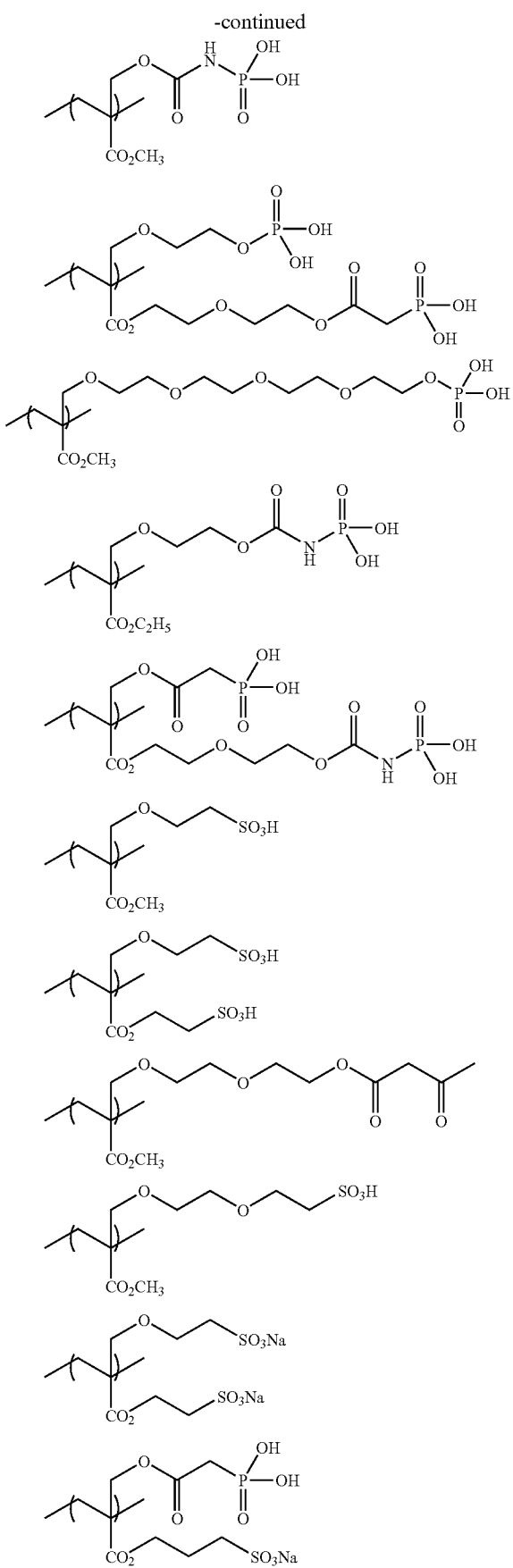
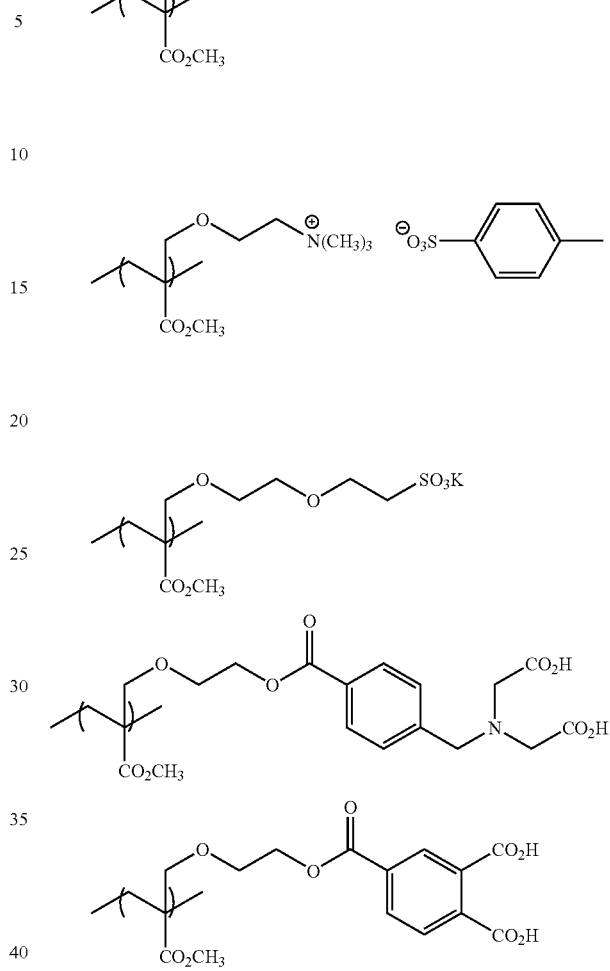
The polymer for use in the intermediate layer according to the invention preferably contains a repeating unit (a2) having at least one ethylenically unsaturated bond in addition to the repeating unit (a1) represented by formula (I).
As the repeating unit (a2), specifically, repeating units represented by formulae (A2a) to (A2c) are preferable.
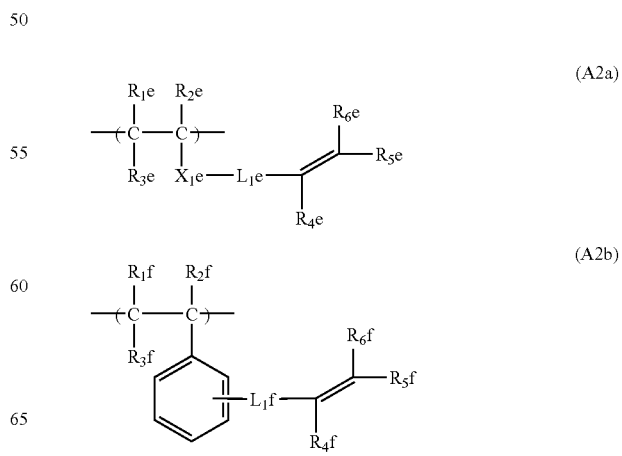

-continued (A2c)

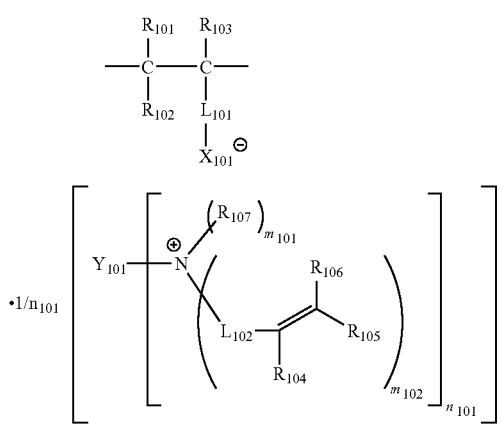

In formulae (A2a) to (A2c), $R_{1e}$ to $R_{3e}$ each independently represents a hydrogen atom, an alkyl group having from 1 to 6 carbon atoms, —$CH_2$—OH, —$CH_2$—$OR_{112}$, —$CH_2$—O—CO—$R_{112}$ or a halogen atom. $X_{1e}$ represents —O—, —CO—, —CO—O—, —O—CO—, —$NR_{500}$—, —$NR_{500}$—CO— or —CO—$NR_{500}$—. $R_{500}$ represents a hydrogen atom, an alkyl group, an aryl group or an aralkyl group. $L_{1e}$ represents —CO—, —O—, —$NR_{500}$—, —S—, a divalent aliphatic group, a divalent aromatic group or a divalent connecting group selected from groups formed by combination of these groups. $R_{4e}$ to $R_{6e}$ each independently represents a hydrogen atom, an alkyl group having from 1 to 6 carbon atoms, a halogen atom, —$CH_2$—OH, —$CH_2$—$OR_{108}$, —$CH_2$—O—CO—$R_{108}$, —CO—$R_{108}$, —O—CO—$R_{108}$, —CO—O—$R_{108}$ or —CO—N($R_{109}$)—$R_{108}$, or $R_{4e}$ and $R_{5e}$ or $R_{5e}$ and $R_{6e}$ may be combined with each other to from a ring. $R_{1f}$ to $R_{3f}$ each independently represents a hydrogen atom, an alkyl group having from 1 to 6 carbon atoms, —$CH_2$—OH, —$CH_2$—$OR_{112}$, —$CH_2$—O—CO—$R_{112}$ or a halogen atom. $L_{1f}$ represents —CO—, —O—, —$NR_{500}$—, —S—, a divalent aliphatic group, a divalent aromatic group or a divalent connecting group selected from groups formed by combination of these groups. $R_{4f}$ to $R_{6f}$ each independently represents a hydrogen atom, an alkyl group having from 1 to 6 carbon atoms, a halogen atom, —$CH_2$—OH, —$CH_2$—$OR_{108}$, —$CH_2$—O—CO—$R_{108}$, —CO—$R_{108}$, —O—CO—$R_{108}$, —CO—O—$R_{108}$ or —CO—N($R_{109}$)—$R_{108}$, or $R_{4f}$ and $R_{5f}$ or $R_{5f}$ and $R_{6f}$ may be combined with each other to from a ring. $R_{101}$ to $R_{103}$ each independently represents a hydrogen atom, an alkyl group having from 1 to 6 carbon atoms, —$CH_2$—OH, —$CH_2$—$OR_{112}$, —$CH_2$—O—CO—$R_{112}$ or a halogen atom $R_{104}$ to $R_{106}$ each independently represents a hydrogen atom, an alkyl group having from 1 to 6 carbon atoms, a halogen atom, —$CH_2$—OH, —$CH_2$—$OR_{108}$, —$CH_2$—O—CO—$R_{108}$, —CO—$R_{108}$, —O—CO—$R_{108}$, —CO—O—$R_{108}$ or —CO—N($R_{109}$)—$R_{108}$, or $R_{104}$ and $R_{105}$ or $R_{105}$ and $R_{106}$ may be combined with each other to from a ring. $R_{107}$ represents a hydrogen atom, an alkyl group having from 1 to 10 carbon atoms, an aryl group having from 6 to 10 carbon atoms or an aralkyl group having from 7 to 20 carbon atoms. $R_{108}$ represents an alkyl group having from 1 to 10 carbon atoms or an aryl group having from 6 to 10 carbon atoms. $R_{109}$ represents a hydrogen atom, an alkyl group having from 1 to 10 carbon atoms or an aryl group having from 6 to 10 carbon atoms. $R_{112}$ represents an alkyl group having from 1 to 10 carbon atoms, an aryl group having from 6 to 10 carbon atoms or an aralkyl group having from 7 to 20 carbon atoms. $L_{101}$ represents —CO—, —O—, —S—, —N($R_{109}$)—, —$SO_2$—, a divalent aliphatic group, a divalent aromatic group or a divalent connecting group selected from groups formed by combination of these groups. $L_{102}$ represents —CO—, —O—, —N($R_{109}$)—, a divalent aliphatic group, a divalent aromatic group or a divalent connecting group selected from groups formed by combination of these groups. $m_{101}$ represents an integer of 0 to 3. $m_{102}$ represents an integer of 1 to 3, provided that $m_{101}+m_{102}=3$. When $m_{101}$ is 2 or more, plural $R_{107}$ may be the same or different. When $m_{102}$ is 2 or more, plural $R_{104}$ to $R_{106}$ and $L_{102}$ may be the same or different, respectively. $X_{101}^-$ represents —$CO_2^-$, —$PO_3H^-$, —O—$PO_3H^-$, —$SO_3^-$ or —O—$SO_3^-$. $Y_{101}$ represents an $n_{101}$ valent connecting group. $n_{101}$ represents an integer of 1 to 10, provided that a value of $m_{102} \times n_{101}$ is not zero.

In formulae (A2a) to (A2c), $R_{1e}$, $R_{2e}$, $R_{1f}$, $R_{2f}$ each independently represents preferably a hydrogen atom, a methyl group or an ethyl group, and more preferably a hydrogen atom.

$R_{3e}$ and $R_{3f}$ each independently represents preferably a hydrogen atom, a methyl group, —$CH_2$—OH or —$CH_2$—O—CO—($C_1$- to $C_4$-alkyl), and more preferably a hydrogen atom, a methyl group, —$CH_2$—OH or —$CH_2$—O—CO—$CH_3$.

$X_{1e}$ represents preferably —CO—O— or —CO—$NR_{500}$—, and more —CO—O— or —CO—NH—.

$L_{1e}$ and $L_{1f}$ each independently represents preferably —O—, —S—, —CO—O—, —O—CO—, —CO—$NR_{500}$—, —$NR_{500}$—CO—, a divalent aliphatic group or a divalent connecting group selected from groups formed by combination of these groups, more preferably —CO—O—, —O—CO—, —CO—NH—, —NH—CO—, a divalent aliphatic group or a divalent connecting group selected from groups formed by combination of these groups.

$R_{4e}$ and $R_{4f}$ each independently represents preferably a hydrogen atom, a methyl group, —$CH_2$—OH, —$CH_2$—O—CO—($C_1$- to $C_4$-alkyl), —CO—O—($C_1$- to $C_4$-alkyl) or —CO—NH—($C_1$- to $C_4$-alkyl), and more preferably a hydrogen atom, a methyl group, —$CH_2$—OH, —$CH_2$—O—CO—$CH_3$, —CO—O—($C_1$- to $C_2$-alkyl) or —CO—NH—($C_1$- to $C_2$-alkyl).

$R_{5e}$, $R_{6e}$, $R_{5f}$ and $R_{6f}$ each independently represents preferably a hydrogen atom, a methyl group or an ethyl group, and more preferably a hydrogen atom.

$R_{101}$ and $R_{102}$ each independently represents preferably a hydrogen atom, a methyl group or an ethyl group, and more preferably a hydrogen atom.

$R_{103}$ represents preferably a hydrogen atom, a methyl group, —$CH_2$—OH or —$CH_2$—O—CO—($C_1$- to $C_4$-alkyl), and more preferably a hydrogen atom, a methyl group, —$CH_2$—OH or —$CH_2$—O—CO—$CH_3$.

$R_{104}$ represents preferably a hydrogen atom, a methyl group, —$CH_2$—OH, —$CH_2$—O—CO—($C_1$- to $C_4$-alkyl), —CO—O—($C_1$- to $C_4$-alkyl) or —CO—NH—($C_1$- to $C_4$-alkyl), and more preferably a hydrogen atom, a methyl group, —$CH_2$—OH, —$CH_2$—O—CO—$CH_3$, —CO—O—($C_1$- to $C_2$-alkyl) or —CO—NH—($C_1$- to $C_2$-alkyl).

$R_{105}$ and $R_{106}$ each independently represents preferably a hydrogen atom, a methyl group or an ethyl group, and more preferably a hydrogen atom.

$R_{107}$ represents preferably a hydrogen atom, a $C_1$- to $C_4$-alkyl group, a benzyl group, a ($C_1$- to $C_4$-alkyl substituted) phenylmethyl group, a ($C_1$- to $C_4$-alkoxy substituted) phenylmethyl group, a ($C_1$- to $C_4$-acyloxy substituted) phenylmethyl group or a ($C_1$- to $C_4$-alkoxycarbonyl substituted) phenylmethyl group, and more preferably a hydrogen atom, a methyl group, an ethyl group or a benzyl group.

$R_{108}$ represents preferably a methyl group, an ethyl group, a n-propyl group, an iso-propyl group, a n-butyl group or a phenyl group, and more preferably a methyl group, an ethyl group or a n-propyl group.

$R_{109}$ represents preferably a hydrogen atom, a methyl group, an ethyl group, a n-propyl group, an iso-propyl group, a n-butyl group or a phenyl group, and more preferably a hydrogen atom, a methyl group, an ethyl group or a n-propyl group.

$L_{101}$ represents preferably —CO—O-L0-, —CO—NH-L0-, a divalent aromatic group or -divalent aromatic group-L0-, and more preferably —CO—O-L0- or —CO—NH-L0-. L0 represents a divalent aliphatic group, a divalent aromatic group or a combination of these groups.

$L_{102}$ represents preferably any one of La to Lr shown below, and more preferably La, Lb, Lf, Lg, Lh, Li, Lo, Lp or Lr. In La to Lr, L0 has the same meaning as L0 defined above.
La: -L0-O—CO—
Lb: -L0-NH—CO—
Lc: -L0-O—
Ld: -L0-CO—O—
Le: -L0-O—CO—O—
Lf: -L0-O—CH$_2$—
Lg: -L0-CO—O—CH$_2$—
Lh: -L0-O—CO—O—CH$_2$—
Li: -L0-O—CO—NH-L0-O—CO—
Lj: -L0-O—CO-L0-O—CO—
Lk: -L0-O—CO-L0-NH—CO—
Ll: -L0-CO—O-L0-O—CO—
Lm: -L0-CO—O-L0-NH—CO—
Ln: -L0-divalent aromatic group-
Lo: —O—CO-divalent aromatic group-
Lp: —O—CO-L0-divalent aromatic group-
Lq: —CO—O-divalent aromatic group-
Lr: —CO—O-L0-divalent aromatic group- With respect to $m_{101}$, $m_{102}$ and $n_{101}$, a value of $m_{102} \times n_{101}$ is from 1 to 6, and more preferably from 1 to 4.

$X_{101}^-$ represents preferably —CO$_2^-$, —PO$_3$H$^-$, —O—PO$_3$H$^-$ or —SO$_3^-$, and more preferably —CO$_2^-$, —O—PO$_3$H$^-$ or —SO$_3^-$.

$Y_{101}$ ordinarily represents an $n_{101}$ valent hydrocarbon residue, may include any of aliphatic and aromatic structures and may include any of straight-chain, branched and cyclic structures. The cyclic structure may be any of monocyclic and polycyclic structures. The carbon-carbon bond constituting the hydrocarbon residue may be interrupted with —CO—, —O—, —S—, —N(R$_{109}$)—, —SO$_2$— or a structure formed by combination of these groups.

Specific examples of the repeating unit represented by any one of formulae (A2a) to (A2c) are set forth below, but the invention should not be construed as being limited thereto.

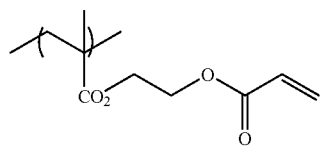

-continued

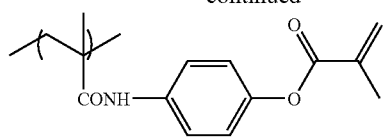

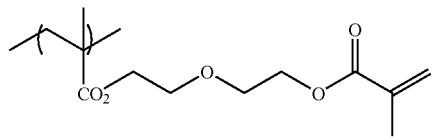

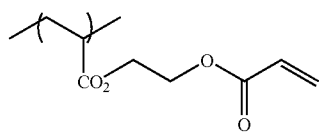

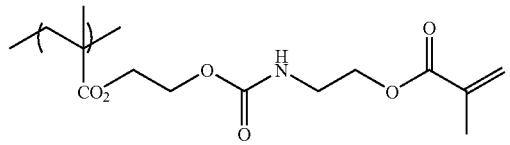

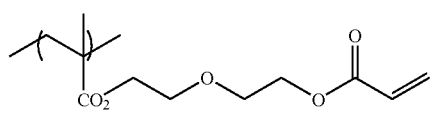

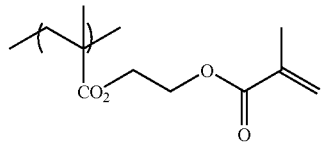

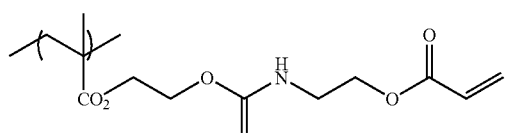

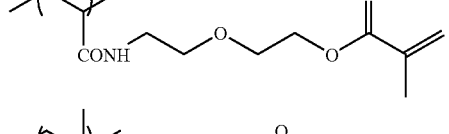

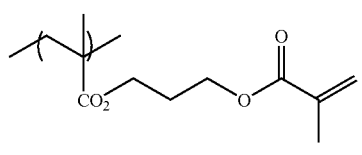

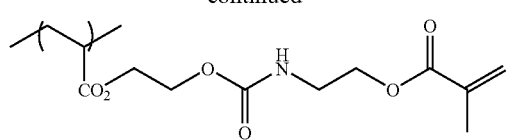
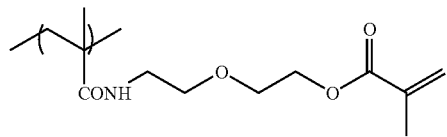
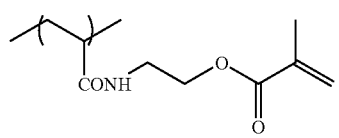
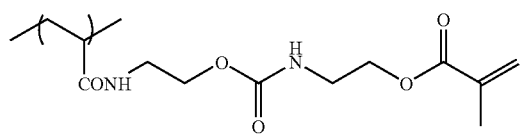
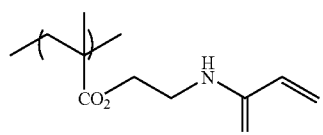
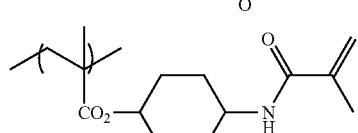
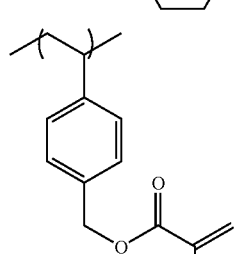
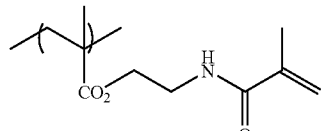
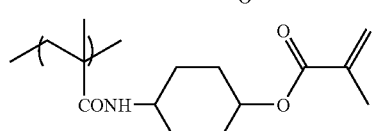
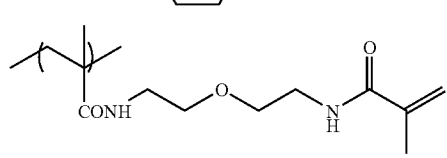
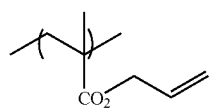
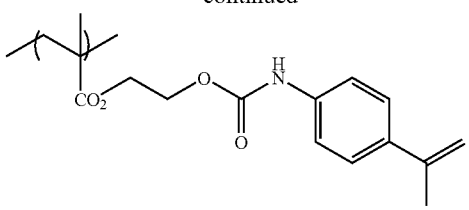
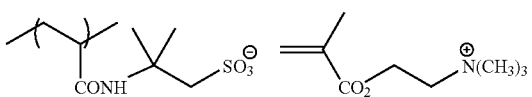
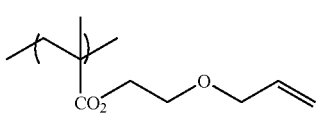
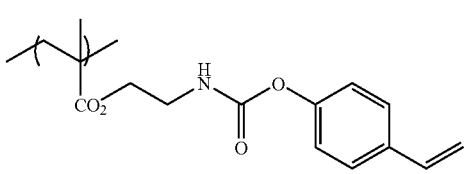
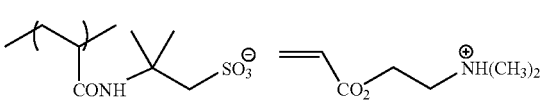
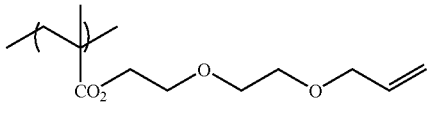
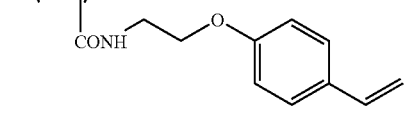
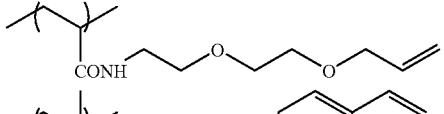
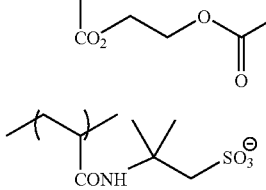

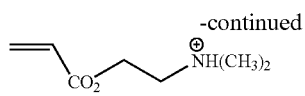
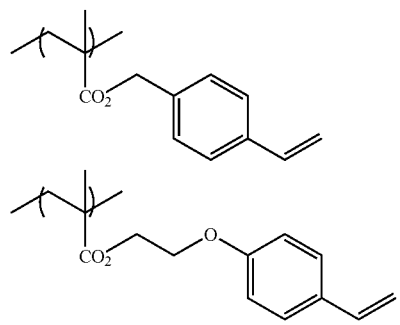
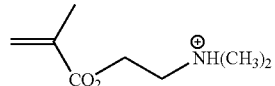
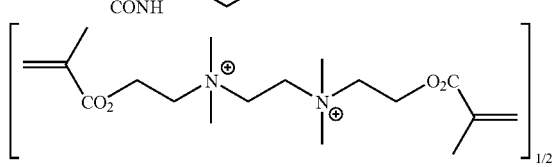
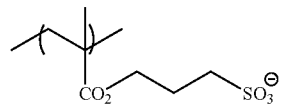
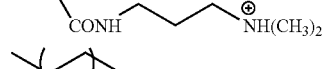
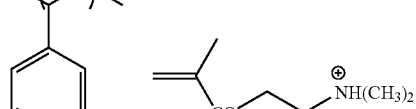
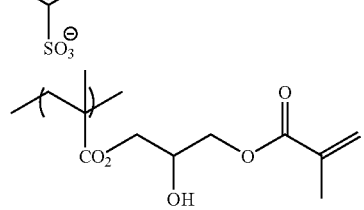
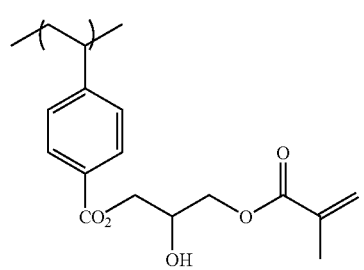

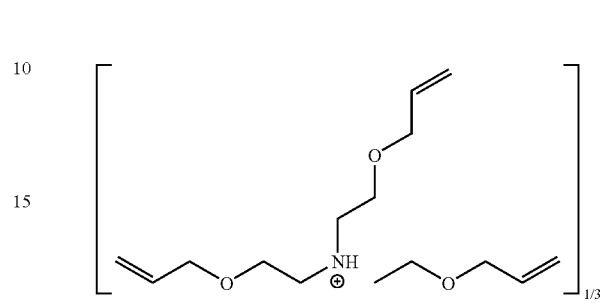

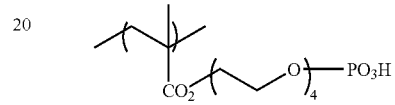

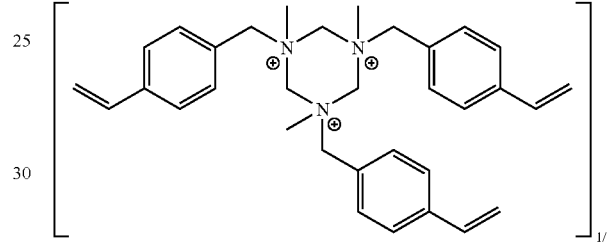

The polymer for use in the intermediate layer more preferably contains a repeating unit (a3) having at least one functional group capable of interacting with a surface of the support and/or a repeating unit (a4) having at least one hydrophilic group, in addition to the repeating unit (a1) represented by formula (I) and the repeating unit (a2) having at least one ethylenically unsaturated bond.

As the repeating unit (a3), specifically, repeating units represented by formula (A3a) or (A3b) are preferable.

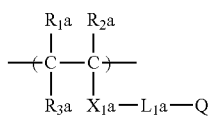

(A3a)

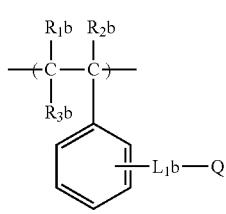

(A3b)

In formulae (A3a) and (A3b), $R_{1a}$ to $R_{3a}$ have the same meanings as $R_{1e}$ to $R_{3e}$ defined in formula (A2a) respectively. $X_{1a}$ has the same meaning as $X_{1e}$ defined in formula (A2a). $L_{1a}$ has the same meaning as $L_{1e}$ defined in formula (A2a). Q represents a functional group capable of interacting with a surface of support. $R_{1b}$ to $R_{3b}$ each independently represents a hydrogen atom, an alkyl group having from 1 to 6 carbon atoms, —CH$_2$—OH, —CH$_2$—OR$_{112}$, —CH$_2$—O—CO—R$_{112}$ or a halogen atom. L$_{1b}$ represents —CO—, —O—, —NR$_{500}$—, —S—, a divalent aliphatic group, a divalent aromatic group or a divalent connecting group selected from groups formed by combination of these groups.

In formulae (A3a) and (A3b), R$_{1a}$, R$_{2a}$, R$_{1b}$, R$_{2b}$ each independently represents preferably a hydrogen atom, a methyl group or an ethyl group, and more preferably a hydrogen atom.

R$_{3a}$ and R$_{3b}$ each independently represents preferably a hydrogen atom, a methyl group, —CH$_2$—OH or —CH$_2$—O—CO—(C$_1$- to C$_4$-alkyl), and more preferably a hydrogen atom, a methyl group, —CH$_2$—OH or —CH$_2$—O—CO—CH$_3$.

X$_{1a}$ represents preferably —CO—O— or —CO—NR$_{500}$—, and more —CO—O— or —CO—NH—.

L$_{1a}$ and L$_{1b}$ each independently represents preferably —O—, —S—, —CO—O—, —O—CO—, —CO—NR$_{500}$—, —NR$_{500}$—CO—, a divalent aliphatic group or a divalent connecting group selected from groups formed by combination of these groups, and more preferably —CO—O—, —O—CO—, —CO—NH—, —NH—CO—, a divalent aliphatic group or a divalent connecting group selected from groups formed by combination of these groups.

Q represents preferably a phosphoric acid ester group or a salt thereof, a phosphonic acid group or a salt thereof, a sulfonic acid group or a salt thereof, a dicarboxylic acid group (for example, imininodiacetic acid or phthalic acid) group or a salt thereof or an ammonium group, and more preferably a phosphoric acid ester group or a salt thereof, a phosphonic acid group or a salt thereof or an ammonium group.

Specific examples of the repeating unit represented by any one of formulae (A3a) and (A3b) are set forth below, but the invention should not be construed as being limited thereto. In the specific examples shown below, a number of repeating unit of ethyleneoxy groups is an average value.

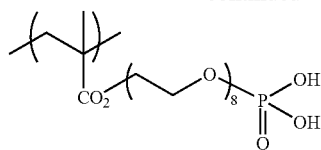

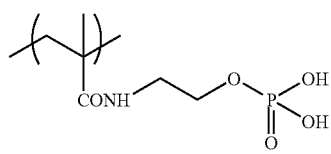

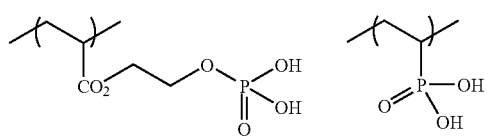

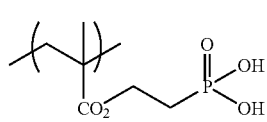

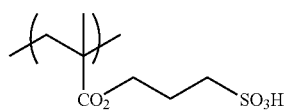

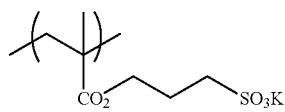

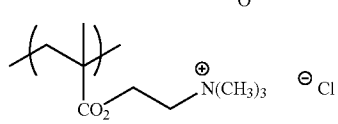

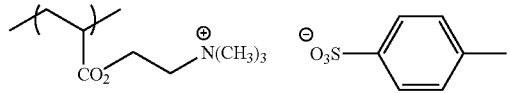

-continued

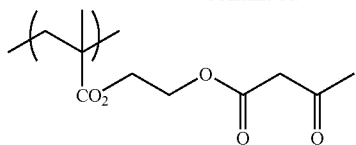
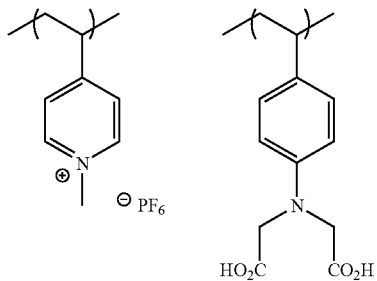
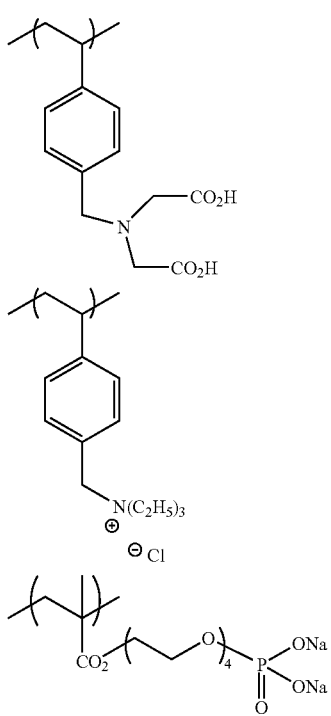

-continued

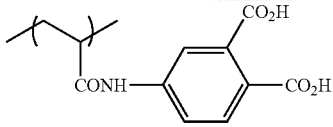

As the repeating unit (a4), specifically, repeating units represented by formula (A4a) or (A4b) are preferable.

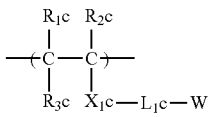

(A4a)

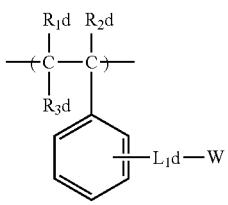

(A4b)

In formulae (A4a) and (A4b), $R_{1c}$ to $R_{3c}$ have the same meanings as $R_{1e}$ to $R_{3e}$ defined in formula (A2a) respectively. $X_{1c}$ has the same meaning as $X_{1e}$ defined in formula (A2a). $L_{1c}$ has the same meaning as $L_{1e}$ defined in formula (A2a). $R_{1d}$ to $R_{3d}$ have the same meanings as $R_{1f}$ to $R_{3f}$ defined in formula (A2b) respectively. $L_{1d}$ has the same meaning as $L_{1f}$ defined in formula (A2b). W represents a sulfonic acid group or a salt thereof, a carboxylic acid group or a salt thereof, an amido group, an ammonium group or a poly(ethyleneoxy) group.

In formulae (A4a) and (A4b), $R_{1c}$, $R_{2c}$, $R_{1d}$, $R_{2d}$ each independently represents preferably a hydrogen atom, a methyl group or an ethyl group, and more preferably a hydrogen atom.

$R_{3c}$ and $R_{3d}$ each independently represents preferably a hydrogen atom, a methyl group, —$CH_2$—OH or —$CH_2$—O—CO—($C_1$- to $C_4$-alkyl), and more preferably a hydrogen atom, a methyl group, —$CH_2$—OH or —$CH_2$—O—CO—$CH_3$.

$X_{1c}$ represents preferably —CO—O— or —CO—$NR_{500}$—, and more —CO—O— or —CO—NH—.

$L_{1c}$ and $L_{1d}$ each independently represents preferably —O—, —S—, —CO—O—, —O—CO—, —CO—$NR_{500}$—, —$NR_{500}$—CO—, a divalent aliphatic group or a divalent connecting group selected from groups formed by combination of these groups, and more preferably —CO—O—, —O—CO—, —CO—NH—, —NH—CO—, a divalent aliphatic group or a divalent connecting group selected from groups formed by combination of these groups.

W represents preferably a sulfonic acid group or a salt thereof, a carboxylic acid group or a salt thereof, an amido group or an ammonium group, and more preferably a sulfonic acid group or a salt thereof, a carboxylic acid salt group, an amido group or an ammonium group.

Specific examples of the repeating unit represented by any one of formulae (A4a) and (A4b) are set forth below, but the invention should not be construed as being limited thereto. In the specific examples shown below, a number of repeating unit of ethyleneoxy groups is an average value.
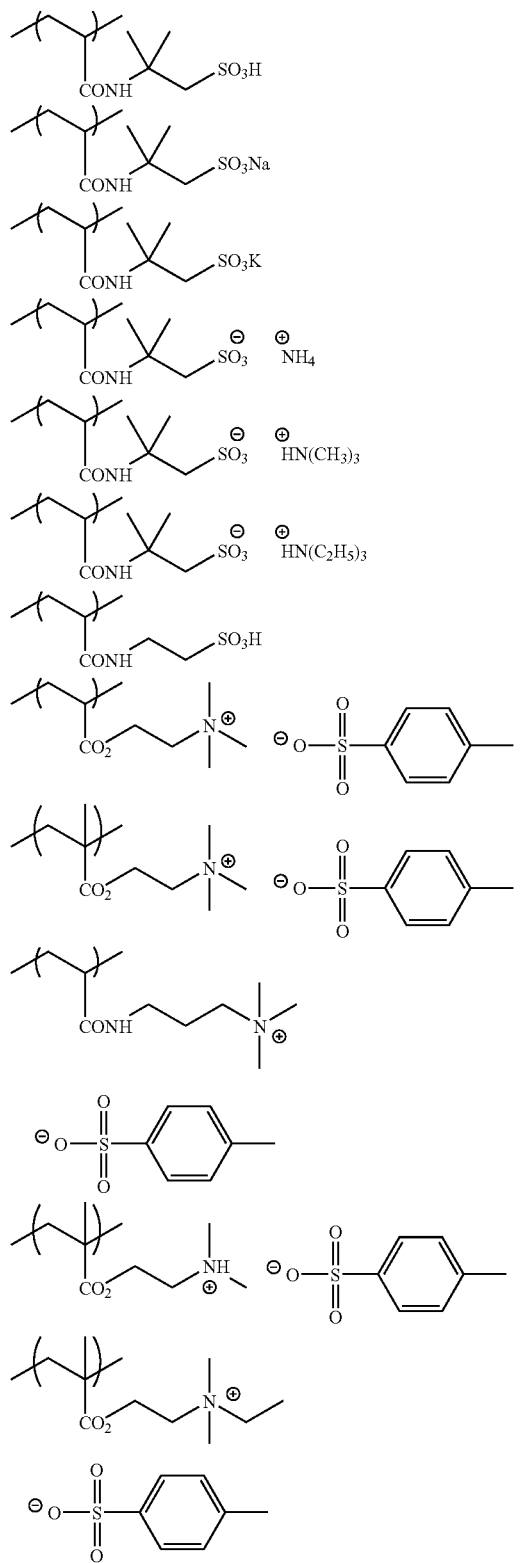
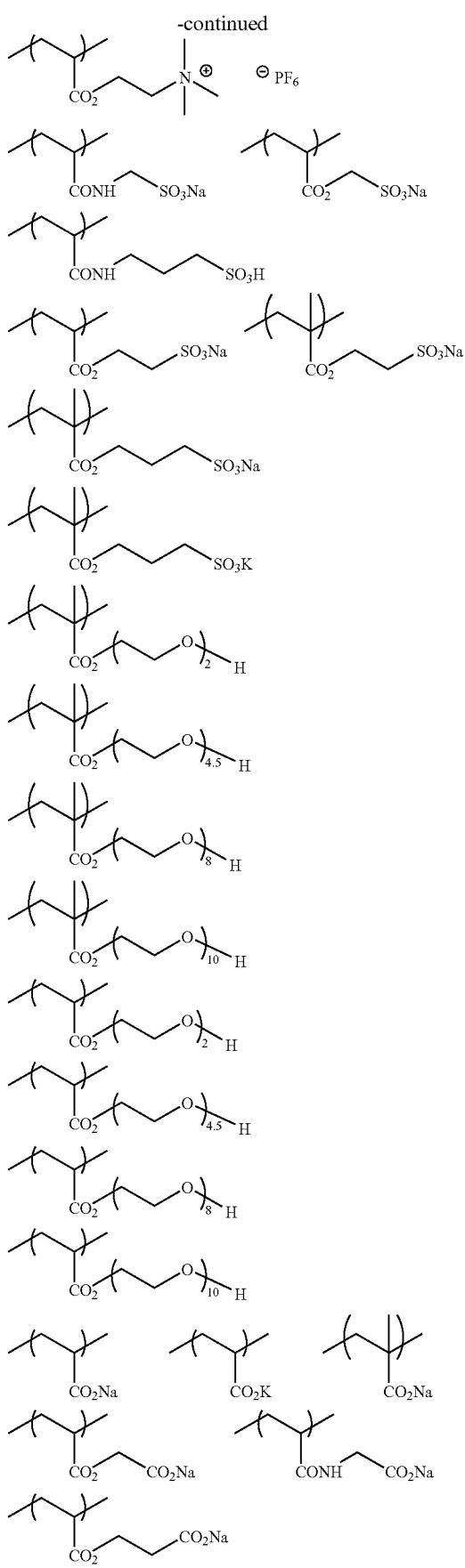

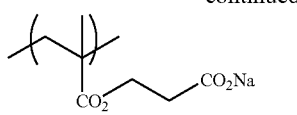
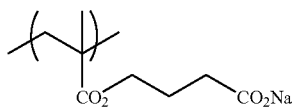
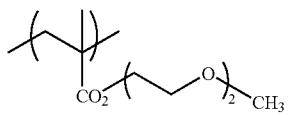
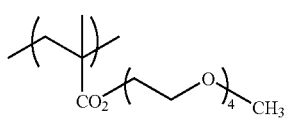
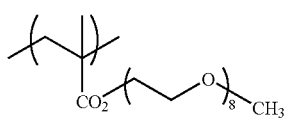
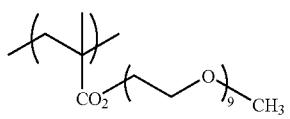
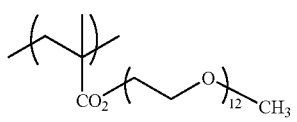
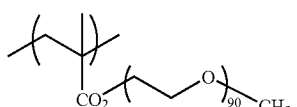
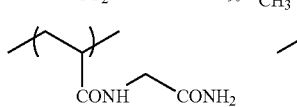

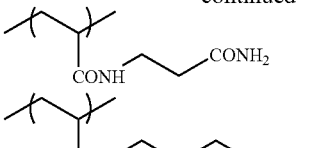
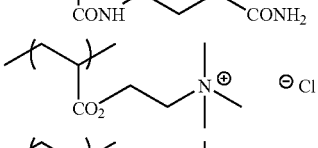
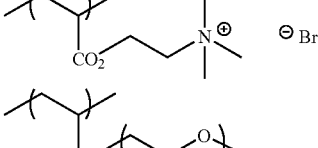
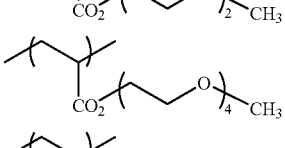
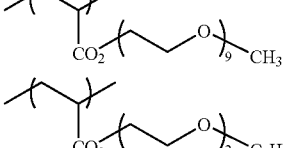
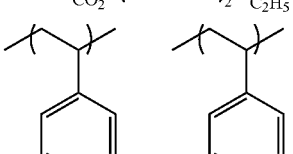
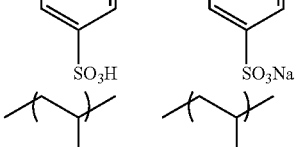
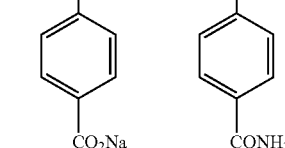
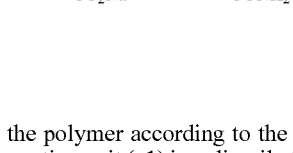
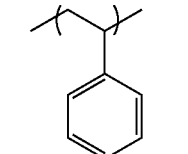
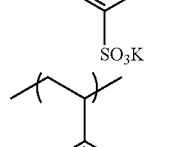
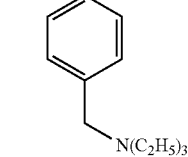

In the polymer according to the invention, the content of the repeating unit (a1) is ordinarily from 0.5 to 97% by mole, preferably from 1 to 95% by mole, more preferably from 3 to 90% by mole, based on the total molar amount of the repeating units. The content of the repeating unit (a2) is ordinarily from 0.5 to 90% by mole, preferably from 1 to 85% by mole, more preferably from 3 to 80% by mole, based on the total molar amount of the repeating units. The content of the repeating unit (a3) is ordinarily from 0.5 to 97% by mole, preferably from 1 to 95% by mole, more preferably from 3 to 90% by mole, based on the total molar amount of the repeating units. The content of the repeating unit (a4) is ordinarily from 0.5 to 97% by mole, preferably from 1 to 95% by mole, more preferably from 3 to 90% by mole, based on the total molar amount of the repeating units.

Specific examples of the polymer according to the invention are set forth below, but the invention should not be construed as being limited thereto.

| | | Composition Ratio (% by mole) (in a left-to-right order) | Molecular Weight (×10,000) |
|---|---|---|---|
| | | A-1 15/80/5 | 8 |
| | | A-2 20/70/10 | 13 |
| | | A-3 20/70/10 | 10 |
| | | A-4 20/70/10 | 9 |
| | | A-5 70/20/10 | 13 |
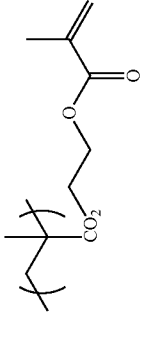

-continued

| Structures | Composition Ratio (% by mole) (in a left-to-right order) | Molecular Weight (×10,000) |
|---|---|---|
| | A-6  25/70/5 | 10 |
| | A-7  15/80/5 | 12 |
| | A-8  75/15/10 | 7 |
| | A-9  15/75/10 | 10 |
| | A-10  30/60/10 | 11 |

The polymer according to the invention can be synthesized in a conventional manner according to a method of producing an ordinary polymer. A synthesis example of the polymer according to the invention is set forth below, but the invention should not be construed as being limited thereto.

Synthesis Example (1)

Synthesis of Polymer (A-2)

To a reaction vessel equipped with a condenser and a stirrer was added 11.85 g of 1-methyl-2-pyrrolidone. Separately, a solution containing 7.62 g of 2-[2-(hydroxymethyl)acryloyloxy]dihydrogen phosphate, 16.58 g of acrylamido-2-methylpropanesulfonic acid and 0.081 g of an initiator (V-601, produced by Wako Pure Chemical Industries, Ltd.) dissolved in 107 g of 1-methyl-2-pyrrolidone was prepared. The internal temperature of the reaction vessel was adjusted at 80° C. and the solution prepared above was dropwise added to the vessel under nitrogen stream over a period of 2 hours. After the completion of the dropwise addition, the mixture was further heated with stirring for 5 hours. Thereafter, the reaction solution was cooled to room temperature and then to 0° C. To the solution was added a solution containing 1.57 g of 2-(dimethylaminoethyl) methacrylate dissolved in 10 g of 1-methyl-2-pyrrolidone and the mixture was stirred for one hour. The mixture was further stirred at room temperature for one hour to obtain Polymer (A-2). As a result of gel permeation chromatography (GPC) using pllulan as a standard substance, the molecular weight of Polymer (A-2) was $13 \times 10^4$.

The intermediate layer of the lithographic printing plate precursor according to the invention can be ordinarily formed by dissolving the polymer described above in an appropriate solvent to prepare a coating solution for intermediate layer and coating the coating solution on a support. As the solvent, water and an organic solvent, for example, methanol, ethanol, propanol, isopropanol, ethylene glycol, hexylene glycol, tetrahydro furan, dimethylformamide, 1-methyoxy-2-propanol, dimethylacetamide or dimethylsulfoxide are exemplified and water and an alcohol are particularly preferred. The solvents may be used as a mixture.

The concentration of the coating solution for intermediate layer was preferably from 0.001 to 10% by weight, more preferably from 0.01 to 5% by weight, and still more preferably from 0.05 to 1% by weight. To the coating solution for intermediate layer was added a surfactant as described hereinafter, if desired. In order to coat the coating solution for intermediate layer on a support, known various methods can be used. For example, bar coater coating, spin coating, spray coating, curtain coating, dip coating, air knife coating, blade coating and roll coating are exemplified. The coating amount (solid content) of the intermediate layer is preferably from 0.1 to 200 mg/m², and more preferably from 1 to 50 mg/m².

[Image-Forming Layer]

The lithographic printing plate precursor according to the invention comprises an image-forming layer on the intermediate layer. The image-forming layer (hereinafter, also referred to as a photosensitive layer or an image-recording layer) contains a polymerization initiator, a polymerizable compound and a binder polymer. Preferably, it further contains a sensitizing dye.

The components constituting the image-forming layer are described in detail below.

(Polymerization Initiator)

The polymerization initiator for use in the invention includes, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound, an onium salt compound and a iron arene complex. Among them, at least one compound selected from the hexaarylbiimidazole compound, onium salt compound, trihalomethyl compound and metallocene compound is preferable, and the hexaarylbiimidazole compound is particularly preferable.

The hexaarylbiimidazole polymerization initiator includes, for example, lophine dimers described in JP-B-45-37377 (the term "JP-B" as used herein means an "examined Japanese patent publication") and JP-B-44-86516, specifically, 2,2'-bis(o-chlorophenyl)-4,4',5'-tetraphenylbiimidazole,
2,2'-bis(o-bromophenyl)-4,4',5,5'-tetraphenylbiimidazole,
2,2'-bis(o,p-dichlorophenyl)-4,4',5,5'-tetraphenylbiimidazole,
2,2'-bis(o-chlorophenyl)-4,4',5,5'-tetra(m-methoxyphenyl)biimidazole,
2,2'-bis(o,o'-dichlorophenyl)-4,4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole and
2,2'-bis(o-trifluoromethylphenyl)-4,4',5,5'-tetraphenylbiimidazole.

The trihalomethyl compound preferably includes trihalomethyl-s-triazines, and specifically s-triazine derivatives having a tri-halogen-substituted methyl group described in JP-A-58-29803, for example, 2,4,6-tris(trichloromethyl)-s-triazine, 2-methoxy-4,6-bis(trichloromethyl)-s-triazine, 2-amino-4,6-bis(trichloromethyl)-s-triazine and 2-(p-methoxystyryl)-4,6-bis(trichloromethyl)-s-triazine.

The onium salt includes, for example, a sulfonium salt, an iodonium salt, an ammonium salt and a phosphonium salt. More preferably, a triarylsulfonium salt which may have a substituent and a diaryliodonium salt which may have a substituent are exemplified. Particularly, an onium salt represented by formula (III) shown below is preferably used.

Formula (III):

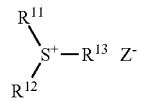

In formula (III), $R^{11}$, $R^{12}$ and $R^{13}$, which may be the same or different, each represents a hydrocarbon group having 20 or less carbon atoms which may have a substituent. Preferable examples of the substituent include a halogen atom, a nitro group, an alkyl group having 12 or less carbon atoms, an alkoxy group having 12 or less carbon atoms and an aryloxy group having 12 or less carbon atoms.

$Z^-$ represents a counter ion selected from a halogen ion, a perchlorate ion, a tetrafluoroborate ion, a hexafluorophosphate ion, a carboxylate ion and a sulfonate ion, and is preferably a perchlorate ion, a hexafluorophosphate ion, a carboxylate ion or an arylsulfonate ion.

The metallocene compound can be used by appropriately selecting, for example, from known compounds described in JP-A-59-152396 and JP-A-61-151197. Specific examples thereof include dicyclopentadienyl-Ti-dichloride, dicyclopentadienyl-Ti-bisphenyl,
dicyclopentadienyl-Ti-bis-2,3,4,5,6-pentafluorophen-1-yl,
dicyclopentadienyl-Ti-bis-2,3,5,6-tetrafluorophen-1-yl, dicyclopentadienyl-Ti-bis-2,4,6-trifluorophen-1-yl,
dicyclopentadienyl-Ti-bis-2,6-difluorophen-1-yl,
dicyclopentadienyl-Ti-bis-2,4-difluorophen-1-yl,
dimethylcyclopentadienyl-Ti-bis-2,3,4,5,6-pentafluorophen-1-yl,
dimethylcyclopentadienyl-Ti-bis-2,3,5,6-tetrafluorophen-1-yl,
dimethylcyclopentadienyl-Ti-bis-2,4-difluorophen-1-yl and
bis(cyclopentadienyl)-bis[2,6-difluoro-3-(pyr-1-yl)phenyl] titanium.

Examples of the carbonyl compound include, benzophenone derivatives, for example, benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, for example, 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1-trichloromethyl-(p-butylphenyl)ketone, thioxantone derivatives, for example, thioxantone, 2-ethylthioxantone, 2-isopropylthioxantone, 2-chlorothioxantone, 2,4-dimethylthioxantone, 2,4-dietylthioxantone or 2,4-diisopropylthioxantone, and benzoic acid ester derivatives, for example, ethyl p-dimethylaminobenzoate or ethyl p-diethylaminobenzoate.

Examples of the oxime ester compounds include compounds described in *J. C. S. Perkin II*, 1653-1660 (1979), *J. C. S. Perkin II*, 156-162 (1979), *Journal of Photopolymer Science and Technology*, 202-232 (1995), JP-A-2000-66385, JP-A-2000-80068 and JP-T-2004-534797 (the term "JP-T" as used herein means a published Japanese translation of a PCT patent application).

The polymerization initiators are preferably used individually or in combination of two or more thereof.

The amount of the polymerization initiator used in the photosensitive layer is preferably from 0.01 to 20% by weight, more preferably from 0.1 to 15% by weight, still more preferably from 1.0 to 10% by weight, based on the total solid content of the photosensitive layer.

(Polymerizable Compound)

The polymerizable compound for use in the photosensitive layer according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The polymerizable compound has a chemical form, for example, a monomer, a prepolymer, specifically, a dimer, a trimer or an oligomer, or a copolymer thereof, or a mixture thereof. Examples of the polymerizable compound include compounds represented by formulae (1) to (5) shown below.

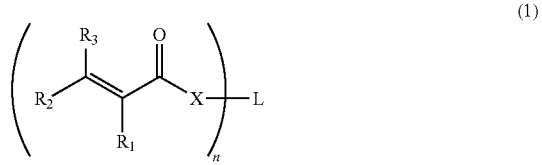

(1)

In formula (1), $R_1$ to $R_3$ each independently represents a monovalent organic group. $R_1$ preferably includes, for example, a hydrogen atom or an alkyl group. Among them, a hydrogen atom, a methyl group or a group formed by substituting one hydrogen atom of methyl group with a hydroxy group, an alkoxy group, an acyloxy group, an amino group, an acylamino group, a thiol group, an alkylthio group, an acylthio group, a sulfo group or a carboxyl group is more preferable because of high radical reactivity. $R_2$ and $R_3$ each independently preferably includes, for example, a hydrogen atom, a halogen atom, an amino group, a carboxyl group, an alkoxycarbonyl group, a sulfo group, a nitro group, a cyano group, an alkyl group, an aryl group, an alkoxy group, an aryloxy group, an alkylamino group, an arylamino group, an alkylsulfonyl group and an arylsulfonyl group. Among them, a hydrogen atom, a carboxyl group, an alkoxycarbonyl group, an alkyl group or an aryl group is preferable because of high radical reactivity.

X represents an oxygen atom, a sulfur atom, —N($R_{12}$)— or —C($R_{12}R_{13}$)—, and $R_{12}$ and $R_{13}$ each represents a monovalent organic group. The monovalent organic group represented by $R_{12}$ or $R_{13}$ includes, for example, an alkyl group. $R_{12}$ or $R_{13}$ is preferably a hydrogen atom, a methyl group, an ethyl group or an isopropyl group because of high radical reactivity. $R_{12}$ or $R_{13}$ may be combined with an atom constituting L to from a ring.

Examples of the substituent capable of being introduced into the organic group include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

L represents an n-valent organic residue constituted from any of hydrogen, fluorine, chlorine, bromine, iodine, carbon, nitrogen, oxygen, boron, sulfur, phosphorus, silicon, lithium, sodium, potassium, magnesium, calcium, aluminum, scandium, titanium, vanadium, chromium, manganese, iron, cobalt, nickel, zinc, gallium, germanium, silver, palladium, lead, zirconium, rhodium, tin, platinum and tungsten. L is preferably an n-valent organic residue constituted from any of hydrogen, fluorine, chlorine, bromine, iodine, carbon, nitrogen, oxygen, boron, sulfur, phosphorus, silicon, lithium, sodium, potassium, magnesium and calcium, more preferably an n-valent organic residue constituted from any of hydrogen, fluorine, chlorine, bromine, iodine, carbon, nitrogen, oxygen, boron, sulfur, phosphorus and silicon.

n represents a natural number and is preferably from 1 to 100, more preferably from 2 to 80, still more preferably from 3 to 60.

Specific examples of the polymerizable compound represented by formula (1) include (a) an unsaturated carboxylic acid (for example, acrylic acid, methacrylic acid, itaconic acid, crotonic acid, isocrotonic acid, 2-hydroxymethylacrylic acid, α-bromoacrylic acid, fumaric acid, mesaconic acid or maleic acid), (b) an ester thereof and (c) an amide thereof, and (d) an ester of an unsaturated carboxylic acid with an aliphatic polyhydric alcohol compound and (e) an amide of an unsaturated carboxylic acid with an aliphatic polyvalent amine compound are preferably used. Further, (f) an addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Moreover, (g) an addition reaction product of an unsaturated carboxylic acid ester or amide having an electrophilic substituent, for example, an isocyanate group or an epoxy group with a monofunctional or polyfunctional alcohol, amine or thiol, or (h) a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated ketone (for example, vinyl methyl ketone or vinyl ethyl ketone) can also be used.

Specific examples of the monomer, which is an ester of an aliphatic polyhydric alcohol compound with an unsaturated carboxylic acid, include, as an acrylic acid ester, for example, ethylene glycol diacrylate, triethylene glycol diacrylate, propylene glycol diacrylate, trimethylolpropane triacrylate, hexanediol diacrylate, 1,4-cyclohexanediol diacrylate, pentaerythritol triacrylate, pentaerythritol tetraacrylate, dipentaerythritol hexaacrylate, sorbitol tetraacrylate, sorbitol hexaacrylate, tri(acryloyloxyethyl) isocyanurate, isocyanuric acid ethylene oxide (EO) modified triacrylate and polyester acrylate oligomer.

As an methacrylic acid ester, for example, tetramethylene glycol dimethacrylate, triethylene glycol dimethacrylate, trimethylolpropane trimethacrylate, pentaerythritol trimethacrylate, pentaerythritol tetramethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane is exemplified.

As an itaconic acid ester, for example, ethylene glycol diitaconate, tetramethylene glycol diitaconate, pentaerythritol diitaconate or sorbitol tetraitaconate is exemplified. As a crotonic acid ester, for example, ethylene glycol dicrotonate, tetramethylene glycol dicrotonate, pentaerythritol dicrotonate or sorbitol tetracrotonate is exemplified. As an isocrotonic acid ester, for example, ethylene glycol diisocrotonate, pentaerythritol diisocrotonate or sorbitol tetraisocrotonate is exemplified. As a maleic acid ester, for example, ethylene glycol dimaleate, pentaerythritol dimaleate or sorbitol tetramaleate is exemplified.

Other examples of the ester, which can be preferably used, include aliphatic alcohol esters described in JP-B-51-47334 (the term "JP-B" as used herein means an "examined Japanese patent publication") and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferable examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (VM) shown below to a polyisocyanate compound having two or more isocyanate groups per molecule, described in JP-B-48-41708.

$$CH_2=C(R_4)COOCH_2CH(R_5)OH \quad (VM)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photosensitive layer having remarkably excellent photo-speed can be obtained by using an addition polymerizable compound having an amino structure or a sulfide structure in its molecule described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth) acrylic acid, described in JP-A-48-64183, JP-B-49-43191 and JP-B-52-30490. Specific unsaturated compounds described in JP-B-4643946, JP-B-140337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

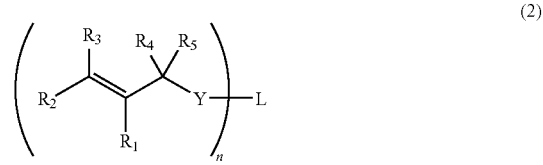

(2)

In formula (2), $R_1$ to $R_5$ each independently represents a monovalent organic group. $R_1$ to $R_5$ each independently preferably includes, for example, a hydrogen atom, a halogen atom, an amino group, a carboxyl group, an alkoxycarbonyl group, a sulfo group, a nitro group, a cyano group, an alkyl group, an aryl group, an alkoxy group, an aryloxy group, an alkylamino group, an arylamino group, an alkylsulfonyl group and an arylsulfonyl group. Among them, a hydrogen atom, a carboxyl group, an alkoxycarbonyl group, an alkyl group or an aryl group is preferable. Alternatively, appropriate two of $R_1$ to $R_5$ may be combined with each other to form a ring, or any one of $R_1$ to $R_5$ may be combined with an atom constituting L to from a ring.

Examples of the substituent capable of being introduced into the organic group include those described in formula (1). Y represents an oxygen atom, a sulfur atom, $-N(R_{12})-$ or $-C(R_{12}R_{13})-$. $R_{12}$ and $R_{13}$ have the same meanings as $R_{12}$ and $R_{13}$ defined in formula (1), respectively. Preferable examples of $R_{12}$ and $R_{13}$ are also same as those described in formula (1), respectively.

L and n have the same meanings as L and n defined in formula (1), respectively. Preferable examples of L and n are also same as those described in formula (1), respectively.

Specific examples of the polymerizable compound represented by formula (2) include an ester compound of an alcohol having an unsaturated double bond (for example, ally alcohol, ethylene glycol monoallyl ether, 3-butene-1-ol, 2-cyclohexene-1-ol or retinol) with a monofunctional or polyfunctional carboxylic acid (for example, acetic acid, benzoic acid, maleic acid, tricarbaric acid, 1,3,5-cyclohexanetricarboxylic acid or 1,2,4-benzenetricarboxylic acid), a urethane compound of the alcohol having an unsaturated double bond with a monofunctional or polyfunctional iso(thio)cyanate (for example, butyl isocyanate, 1,3-bis(isocyanatomethyl)cyclohexane, 4,4'-methylenebis(cyclohexylisocyanate), isohoron diisocyanate, allyl isothiocyanate, phenyl isothiocyanate, phenyl isocyanate or 4,4'-methylenebis(phenyl isocyanate), an ether compound of the alcohol having an unsaturated double bond with a monofunctional or polyfunctional alcohol (for example, ethanol, ethylene glycol, polyethylene glycol, propylene glycol, cyclohexane diol, inositol, glycerol, trimethylol propane, pentaerythritol, xylitol, dextrin, phenol or bisphenol A), an addition reaction product of the alcohol having an unsaturated double bond with a monofunctional or polyfunctional epoxy compound (for example, ethylene glycol diglycidyl ether, cyclohexene oxide, neopentyl glycol diglycidyl ether or tris(2,3-epoxypropyl)isocyanurate), a substitution reaction product of the alcohol having an unsaturated double bond with a monofunctional or polyfunctional halogenated alkyl (for example, 1,4-dibromobutane or bis(2-bromoethyl)maleate) or a sulfonic acid (for example, methanesulfonic acid, camphorsulfonic acid or toluenesulfonic acid) ester of a monofunctional or polyfunctional alcohol, a substitution reaction product of a halogenated alkyl having an unsaturated double bond (for example, allyl bromide, 4-bromo-1-butene or 3-chloro-2-methylpropene) or a sulfonic acid ester of an alcohol having an unsaturated double bond with a nucleophilic compound, for example, a monofunctional or polyfunctional alcohol, a monofunctional or polyfunctional amine (for example, butylamine, ethylenediamine, triethylamine, pentaethylenehexamine, 2,2'-oxybis(ethylamine), morpholine, piperazine, pyridine, proline or 4,4'-methylenedianiline), a monofunctional or polyfunctional phosphine, a monofunctional or polyfunctional thiol, a monofunctional or polyfunctional carbonyl compound or a monofunctional or polyfunctional carboxylate, an amide of an amine having an unsaturated double bond (for example, allylamine, triallylamine, geranylamine or N-ethyl-2-methylallylamine) with a monofunctional or polyfunctional carboxylic acid, a urea of the amine having an unsaturated double bond with a monofunctional or polyfunctional isocyanate, a substitution reaction product of the amine having an unsaturated double bond with a mono functional or polyfunctional halogenated alkyl or a sulfonic acid ester of a monofunctional or polyfunctional alcohol, an imine of the amine having an unsaturated double bond with a monofunctional or polyfunctional carbonyl compound, a sulfonamide of the amine having an unsaturated double bond with a monofunctional or polyfunctional sulfonic acid, a urethane of an iso(thio)cyanate having an unsaturated double bond (for example, allyl isocyanate or allyl isothiocyanate) with a mono functional or polyfunctional alcohol, a urea of the iso(thio)cyanate having an unsaturated double bond with a monofunctional or polyfunctional amine, an amide of the iso(thio)cyanate having an unsaturated double bond with a monofunctional or polyfunctional carboxylic acid, an addition reaction product of the iso(thio)cyanate having an unsaturated double bond with a monofunctional or polyfunctional thiol, and an addition reaction product of the iso(thio)cyanate having an unsaturated double bond with a monofunctional or polyfunctional iso(thio)cyanate.

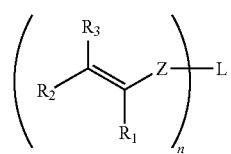

(3)

In formula (3), $R_1$ to $R_3$ each independently represents a monovalent organic group. $R_1$ to $R_3$ each independently preferably includes, for example, a hydrogen atom, a halogen atom, an amino group, a carboxyl group, an alkoxycarbonyl group, a sulfo group, a nitro group, a cyano group, an alkyl group, an aryl group, an alkoxy group, an aryloxy group, an alkylamino group, an arylamino group, an alkylsulfonyl group and an arylsulfonyl group. Among them, a hydrogen atom, a carboxyl group, an alkoxycarbonyl group, an alkyl group or an aryl group is preferable. Alternatively, appropriate two of $R_1$ to $R_3$ may be combined with each other to form a ring, or any one of $R_1$ to $R_3$ may be combined with an atom constituting L to from a ring.

Examples of the substituent capable of being introduced into the organic group include those described in formula (1). Z represents an oxygen atom, a sulfur atom, —N($R_{12}$)— or —C($R_{12}R_{13}$)—. $R_{12}$ and $R_{13}$ have the same meanings as $R_{12}$ and $R_{13}$ defined in formula (1), respectively. Preferable examples of $R_{12}$ and $R_{13}$ are also same as those described in formula (1), respectively.

L and n have the same meanings as L and n defined in formula (1), respectively. Preferable examples of L and n are also same as those described in formula (1), respectively.

Specific examples of the polymerizable compound represented by formula (3) include a monofunctional or polyfunctional carboxylic acid vinyl ester (for example, vinyl acetate, isopropenyl acetate or trivinyl 1,3,5-cyclohexanetricarboxylate), a vinyl ether (for example, 1,4-cyclohexanedimethanol divinyl ether or trimethylolpropane trivinyl ether), an ester of a vinyl ether alcohol (for example, ethylene glycol monovinyl ether or diethylene glycol monovinyl ether) with a mono functional or polyfunctional carboxylic acid, a urethane of the vinyl ether alcohol with a monofunctional or polyfunctional iso(thio)cyanate, a substitution product of the vinyl ether alcohol with a monofunctional or polyfunctional halogenated alkyl or a sulfonic acid ester of a monofunctional or polyfunctional alcohol, an addition product of the vinyl ether alcohol with a monofunctional or polyfunctional epoxy, a substitution reaction product of a vinyl ether of halogenated alkyl (for example, 2-chloromethyl vinyl ether) or a vinyl ether sulfonic acid ester (for example, vinyloxyethyl p-toluenesulfonate) with a nucleophilic compound, for example, a monofunctional or polyfunctional alcohol, a mono functional or polyfunctional amine, a mono functional or polyfunctional phosphine, a monofunctional or polyfunctional thiol, a monofunctional or polyfunctional carbonyl compound or a mono functional or polyfunctional carboxylate, an amide of a vinyl ether amine (for example, 3-amino-1-propanol vinyl ether or 2-(diethylamino)ethanol vinyl ether) with a monofunctional or polyfunctional carboxylic acid, a urea of the vinyl ether amine with a monofunctional or polyfunctional iso(thio)cyanate, a substitution product of the vinyl ether amine with a monofunctional or polyfunctional halogenated alkyl, a sulfonamide of the vinyl ether amine with a monofunctional or polyfunctional sulfonic acid, and a monofunctional or polyfunctional vinyl amide (for example, N-vinyl carbazole, N-vinyl pyrrolidinone or N-vinyl phthalimide).

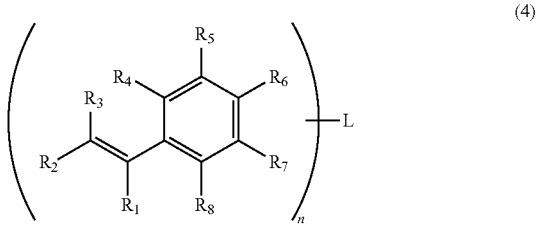

(4)

In formula (4), $R_1$ to $R_3$ each independently represents a monovalent organic group. $R_1$ to $R_3$ each independently preferably includes, for example, a hydrogen atom, a halogen atom, an amino group, a carboxyl group, an alkoxycarbonyl group, a sulfo group, a nitro group, a cyano group, an alkyl group, an aryl group, an alkoxy group, an aryloxy group, an alkylamino group, an arylamino group, an alkylsulfonyl group and an arylsulfonyl group. Among them, a hydrogen atom, a carboxyl group, an alkoxycarbonyl group, an alkyl group or an aryl group is preferable. $R_4$ to $R_8$ each independently represents a monovalent organic group or a divalent organic group connecting to L. The monovalent organic group for any one of $R_4$ to $R_8$ preferably includes those described for the monovalent organic group for any one of $R_1$ to $R_3$ above. The divalent organic group for any one of $R_4$ to $R_8$ preferably includes divalent organic groups constituted from any of hydrogen, carbon, oxygen, nitrogen, sulfur, halogen, silicon and phosphorus. Alternatively, appropriate two of $R_4$ to $R_8$ may be combined with each other to form a ring, or any one of $R_4$ to $R_8$ may be combined with an atom constituting L to from a ring.

Examples of the substituent capable of being introduced into the organic group include those described in formula (1).

L and n have the same meanings as L and n defined in formula (1), respectively. Preferable examples of L and n are also same as those described in formula (1), respectively.

Specific examples of the polymerizable compound represented by formula (4) include an ester of a styrene containing a carboxylic acid (for example, p-styrenecarboxylic acid) or a styrene containing a sulfonic acid (for example, p-styrenesulfonic acid) with a monofunctional or polyfunctional alcohol, an amide of the styrene containing a carboxylic acid or sulfonic acid with a monofunctional or polyfunctional amine, an ester of a styrene containing a hydroxy group (for example, p-hydroxymethylstyrene, 2-hydroxyethyl p-styrenecarboxylate or 2-hydroxyethyl p-styrenesulfonate) with a mono functional or polyfunctional carboxylic acid, a urethane of the styrene containing a hydroxy group with a monofunctional or polyfunctional iso(thio)cyanate, a substitution product of the styrene containing a hydroxy group with a mono functional or polyfunctional halogenated alkyl or a sulfonic acid ester of a monofunctional or polyfunctional alcohol, an addition product of the styrene containing a hydroxy group with a mono-functional or polyfunctional epoxy, a substitution reaction product of a styrene containing a halogenated alkyl group (for example, p-chloromethylstyrene or 2-chloroethyl p-styrenecarboxylate) or a styrene containing a sulfonic acid ester group (for example, p-tosyloxymethylstyrene) with a nucleophilic compound, for example, a monofunctional or polyfunctional alcohol, a monofunctional or polyfunctional amine, a mono functional or polyfunctional phosphine, a mono functional or polyfunctional thiol, a mono functional or polyfunctional carbonyl compound or a monofunctional or polyfunctional carboxylate, an amide of a styrene containing an amino group (for example, p-aminomethylstyrene) with a monofunctional or polyfunctional carboxylic acid, a urea of the styrene containing an amino group with a monofunctional or polyfunctional iso(thio)cyanate, a substitution product of the styrene containing an amino group with a monofunctional or polyfunctional halogenated alkyl, and a sulfonamide of the styrene containing an amino group with a monofunctional or polyfunctional sulfonic acid.

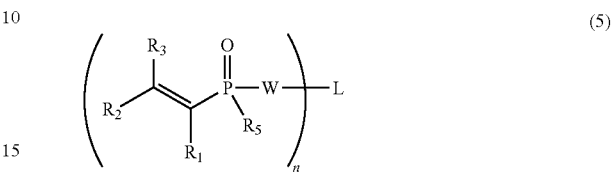

(5)

In formula (5), $R_1$ to $R_3$ each independently represents a monovalent organic group. $R_1$ to $R_3$ each independently preferably includes, for example, a hydrogen atom, a halogen atom, an amino group, a carboxyl group, an alkoxycarbonyl group, a sulfo group, a nitro group, a cyano group, an alkyl group, an aryl group, an alkoxy group, an aryloxy group, an alkylamino group, an arylamino group, an alkylsulfonyl group and an arylsulfonyl group. Among them, a hydrogen atom, a carboxyl group, an alkoxycarbonyl group, an alkyl group or an aryl group is preferable. $R_5$ each independently represents a monovalent organic group. The monovalent organic group for $R_5$ preferably includes those described for the monovalent organic group for any one of $R_1$ to $R_3$ above. Alternatively, $R_5$ may from a ring together with L.

Examples of the substituent capable of being introduced into the organic group include those described in formula (1). W represents an oxygen atom, a sulfur atom, —$N(R_{12})$— or —$C(R_{12}R_{13})$—. $R_{12}$ and $R_{13}$ have the same meanings as $R_{12}$ and $R_{13}$ defined in formula (1), respectively. Preferable examples of $R_{12}$ and $R_{13}$ are also same as those described in formula (1), respectively.

L and n have the same meanings as L and n defined in formula (1), respectively. Preferable examples of L and n are also same as those described in formula (1), respectively.

Specific examples of the polymerizable compound represented by formula (5) include an ester of a vinylphosphonic acid (for example, vinylphosphonic acid or methyl 2-phosphonoacrylate) with a monofunctional or polyfunctional alcohol, an amide of the vinylphosphonic acid with a monofunctional or polyfunctional amine, an ester of a vinylphosphonic acid containing a hydroxy group (for example, bis(2-hydroxyethyl) vinylphosphonic acid) with a monofunctional or polyfunctional carboxylic acid, a urethane of the vinylphosphonic acid containing a hydroxy group with a monofunctional or polyfunctional iso(thio)cyanate, a substitution product of the vinylphosphonic acid containing a hydroxy group with a mono functional or polyfunctional halogenated alkyl or a sulfonic acid ester of a monofunctional or polyfunctional alcohol, an addition product of the vinylphosphonic acid containing a hydroxy group with a mono functional or polyfunctional epoxy, a substitution reaction product of a vinylphosphonic acid containing a halogenated alkyl group (for example, bis(2-bromoethyl)vinylphosphonic acid) or a vinylphosphonic acid containing a sulfonic acid ester group (for example, p-tosyloxyethyl vinylphosphonic acid) with a nucleophilic compound, for example, a monofunctional or polyfunctional alcohol, a monofunctional or polyfunctional amine, a monofunctional or polyfunctional phosphine, a monofunctional or polyfunctional thiol, a monofunctional or polyfunctional carbonyl compound or a monofunctional or polyfunctional carboxylate.

Details of the method of using the polymerizable compound, for example, selection of the structure, individual or combination use or an amount added, can be appropriately determined in accordance with the characteristic design of the lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and strength.

The selection and use method of the polymerizable compound are also important factors for the compatibility and dispersibility with other components (for example, a binder polymer, a polymerization initiator or a coloring agent) in the photosensitive layer. For instance, the compatibility may be improved in some cases by using the compound of low purity or using two or more kinds of the compounds in combination. A specific structure may be selected for the purpose of improving an adhesion property to a support, a protective layer or the like described hereinafter.

The polymerizable compound is used preferably in a range of 5 to 80% by weight, more preferably in a range of 25 to 75% by weight, based on the total solid content of the photosensitive layer. The polymerizable compounds may be used individually or in combination of two or more thereof. The method of using the polymerizable compound can be adequately selected by taking account of the degree of polymerization inhibition due to oxygen, resolution, anti-fogging property, change in refractive index, surface tackiness and the like.

(Binder Polymer)

The binder polymer for use in the photosensitive layer is not particularly restricted. A polymer selected from an acrylic resin, a polyvinyl alcohol resin, a polyvinyl acetal resin, a polyurethane resin, a polyamide resin, an epoxy resin, a methacrylic resin, a styrene-based resin and a polyester resin are preferably exemplified as examples of the binder polymer. Among them, an acrylic resin, a methacrylic resin, a polyvinyl alcohol resin, a polyvinyl acetal resin and a polyurethane resin are preferable.

The binder polymer can be imparted with a crosslinking property in order to increase the film strength of the image area. In order to impart the crosslinking property to the binder polymer, a crosslinkable functional group, for example, an ethylenically unsaturated bond is introduced into a main chain or side chain of the polymer. The crosslinkable functional group may be introduced by copolymerization or a polymer reaction.

The term "crosslinkable group" as used herein means a group capable of crosslinking the polymer binder in the process of a radical polymerization reaction which is caused in the photosensitive layer when the lithographic printing plate precursor is exposed to light. The crosslinkable group is not particularly restricted as long as it has such a function and includes, for example, an ethylenically unsaturated bond group, an amino group or an epoxy group as a functional group capable of conducting an addition polymerization reaction. Also, a functional group capable of forming a radical upon irradiation with light may be used and such a crosslinkable group includes, for example, a thiol group, a halogen atom and an onium salt structure. Among them, the ethylenically unsaturated bond group described hereinafter is preferable.

As the binder polymer, an alkali-soluble binder polymer having an acid group, for example, a carboxyl group, a sulfonic acid group, a phosphoric acid group or a hydroxy group which has been used in a lithographic printing plate precursor of alkali development type may be used or a binder polymer which has an acid value of 0.3 meq/g or less and is insoluble in alkali may be used. Such a binder polymer insoluble in alkali is preferably used in the system in which development is performed with a developer having pH of 2 to 10 in order to balance developing property with printing durability of the exposed area.

<Binder Polymer Having Acid Value of 0.3 meq/g or Less>

It is preferred that the binder polymer for use in the photosensitive layer which is developed with a developer having pH of 2 to 10 has an acid value (acid content per g of polymer, indicated by the chemical equivalent number) of 0.3 meq/g or less. The binder polymer preferably does not substantially contain an acid group, for example, a carboxyl group, a sulfone group or a phosphoric acid group. The acid value of the binder polymer is more preferably 0.1 meq/g or less. When the acid value exceeds 0.3 meq/g, problems, for example, deterioration of developing property (occurrence of residual layer) or decrease in printing durability due to increase in hydrophilicity may occur in some cases.

It is preferred that the binder polymer is substantially insoluble in water and an aqueous solution having pH of more than 10. The solubility (polymer concentration at the saturation dissolution) of the binder polymer in water or an aqueous solution having pH of more than 10 is preferably 1.0% by weight or less. The temperature for measurement of the above-described solubility is 25° C. which is ordinary temperature at the development.

By using such a binder polymer, film strength, water resistance and ink receptivity of the photosensitive layer are improved and increase in printing durability can be achieved while maintaining good developing property in a developer.

As for the binder polymer, conventionally known binder polymers having the characteristics (for example, acid value or solubility) can be used without limitation as long as the performance of the lithographic printing plate precursor according to the invention is not impaired, and a linear organic polymer having film-forming property is preferred.

Preferable examples of such a binder polymer include a polymer selected from an acrylic resin, a methacrylic resin, a styrene-based resin, a polyvinyl acetal resin, a polyurethane resin, a polyamide resin, an epoxy resin and a polyester resin. Among them, a vinyl copolymer, for example, an acrylic resin, a (meth)acrylic resin or a styrene-based resin and a polyurethane resin are more preferable.

Such a vinyl copolymer can be obtained using known vinyl monomers by adjusting the kind and ratio of the monomers so as to fulfill the above-described characteristics (for example, acid value or solubility). As the vinyl monomer, for example, a (meth)acrylic acid ester, a crotonic acid ester, a vinyl ester, a maleic acid diester, a fumaric acid diester, an itaconic acid diester, a (meth)acrylamide, a vinyl ether, a styrene and (meth)acrylonitrile are preferably exemplified. Specific examples of the vinyl monomer include the following compounds.

Examples of the (meth)acrylic acid ester include methyl (meth)acrylate, ethyl (meth)acrylate, n-propyl (meth)acrylate, isopropyl (meth)acrylate, n-butyl (meth)acrylate, isobutyl (meth)acrylate, tert-butyl (meth)acrylate, n-hexyl (meth)acrylate, 2-ethylhexyl (meth)acrylate, acetoxyethyl (meth)acrylate, phenyl (meth)acrylate, 2-hydroxyethyl (meth)acrylate, 2-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy)ethyl (meth)acrylate, cyclohexyl (meth)acrylate, benzyl (meth)acrylate, diethylene glycol mono methyl ether (meth)acrylate, diethylene glycol mono ethyl ether (meth)acrylate, diethylene glycol mono phenyl ether (meth)acrylate, triethylene glycol mono methyl ether (meth)acrylate, triethylene glycol mono ethyl ether (meth)acrylate, dipropylene glycol mono methyl ether (meth)acrylate, polyethylene glycol mono methyl ether (meth)acrylate, polypropylene glycol mono methyl ether (meth)acrylate, mono methyl ether (meth)acrylate of a copolymer of ethylene glycol and propylene glycol, N,N-dimethylaminoethyl (meth)acrylate, N,N-diethylaminoethyl (meth)acrylate and N,N-dimethylaminopropyl (meth)acrylate.

Specific examples of the crotonic acid ester include butyl crotonate and hexyl crotonate. Specific examples of the vinyl ester include vinyl acetate, vinyl propionate, vinyl butyrate, vinyl methoxyacetate and vinyl benzoate.

Specific examples of the maleic acid diester include dimethyl maleate, diethyl maleate and dibutyl maleate. Specific examples of the fumaric acid diester include dimethyl fumarate, diethyl fumarate and dibutyl fumarate. Specific examples of the itaconic acid diester include dimethyl itaconate, diethyl itaconate and dibutyl itaconate.

Specific examples of the (meth)acrylamide include (meth)acrylamide, N-methyl(meth)acrylamide, N-ethyl(meth)acrylamide, N-propyl(meth)acrylamide, N-n-butyl(meth)acrylamide, N-tert-butyl(meth)acrylamide, N-cyclohexyl(meth)acrylamide, N-(2-methoxyethyl)(meth)acrylamide, N,N-dimethyl(meth)acrylamide, N,N-diethyl(meth)acrylamide, N-phenyl(meth)acrylamide, N-benzyl(meth)acrylamide and (meth)acryloyl morpholine.

Specific examples of the vinyl ether include methyl vinyl ether, butyl vinyl ether, hexyl vinyl ether and methoxyethyl vinyl ether.

Specific examples of the styrene include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, methyl vinylbenzoate and α-methylstyrene.

In addition, vinyl pyridine, vinyl pyrrolidone, vinyl carbazole and (meth)acrylonitrile can also be used.

Further, a vinyl monomer having a urethane group or a urea group can also be used. As such a vinyl monomer, for example, the compounds set forth below are exemplified.

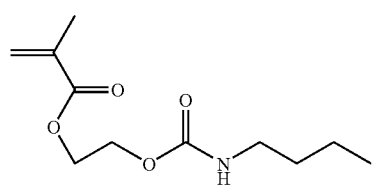

M-1

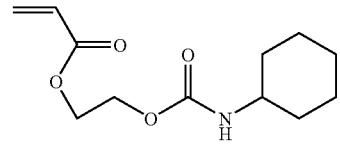

M-2

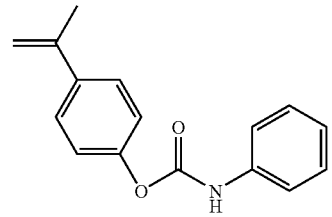

M-3

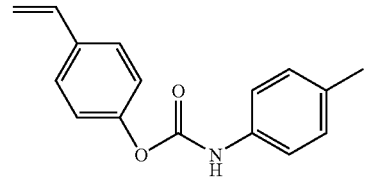

M-4

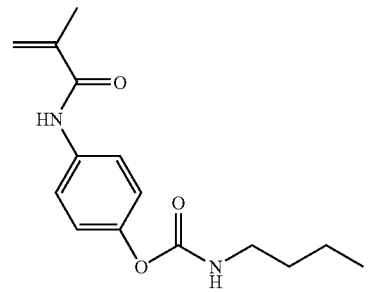

M-5

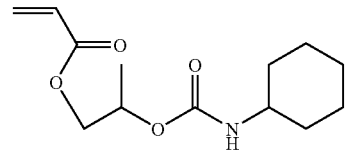

M-6

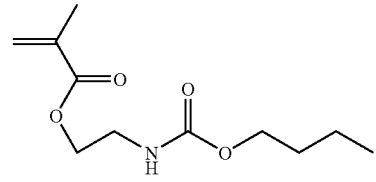

M-7

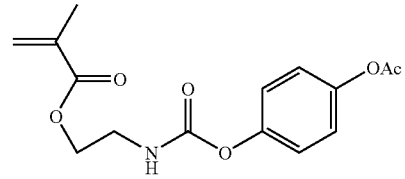

M-8

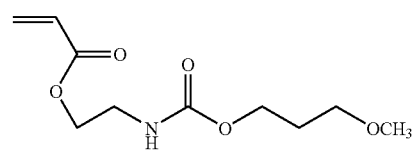

M-9

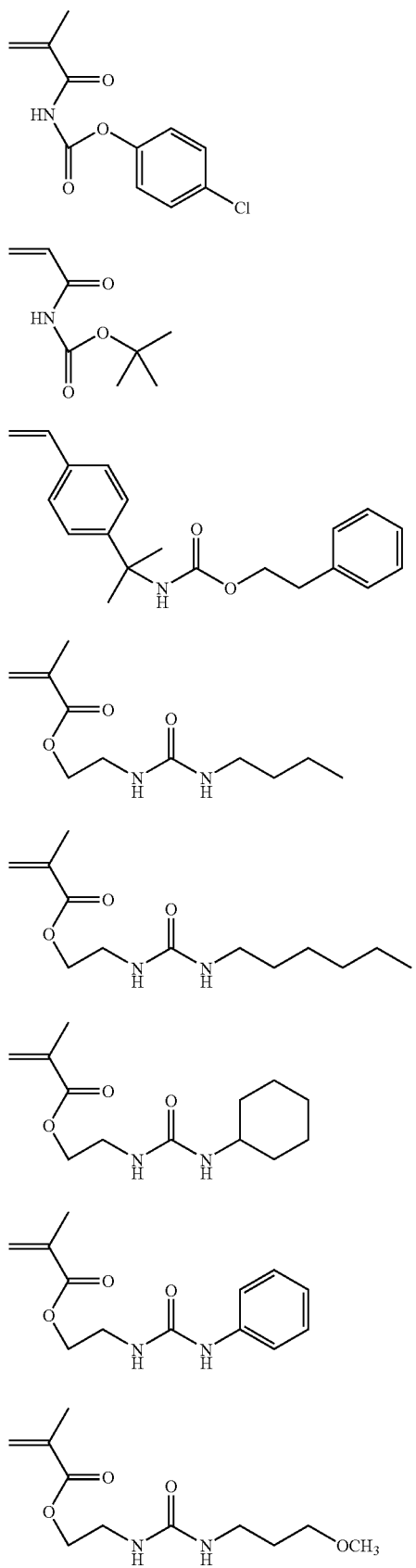
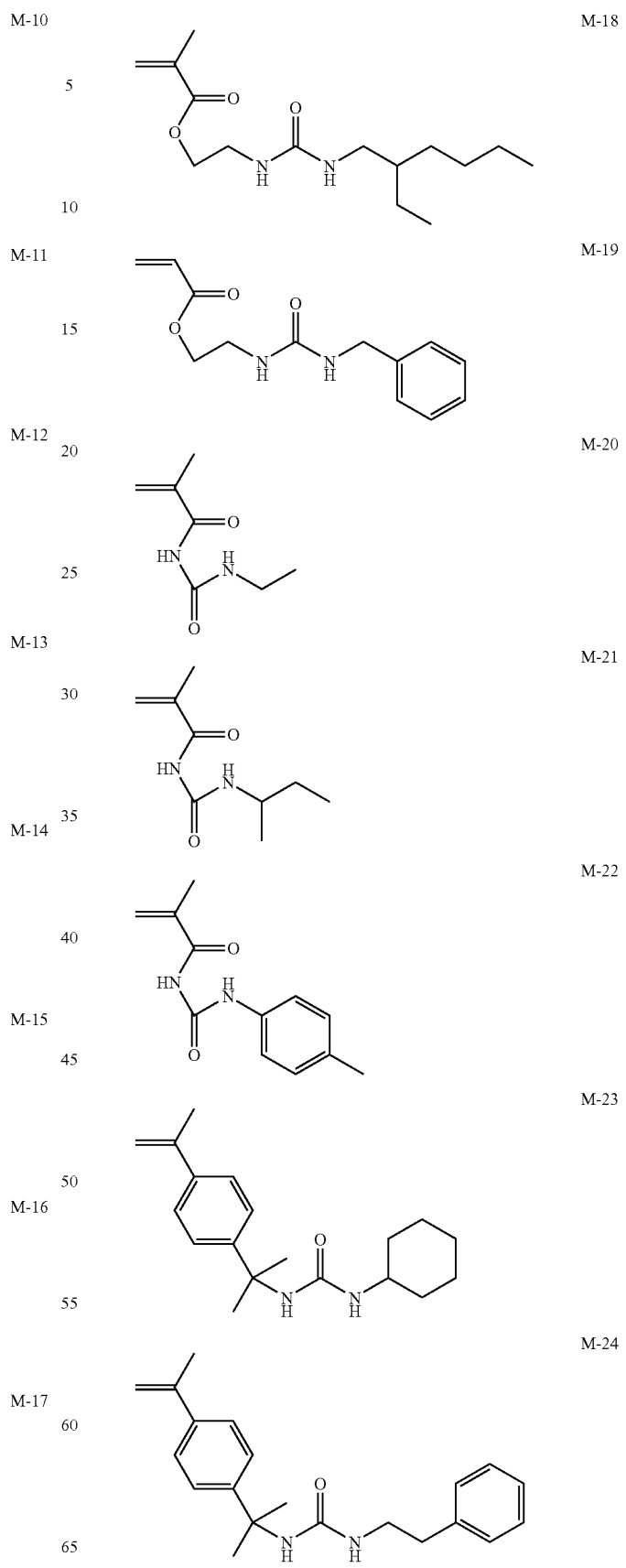

-continued

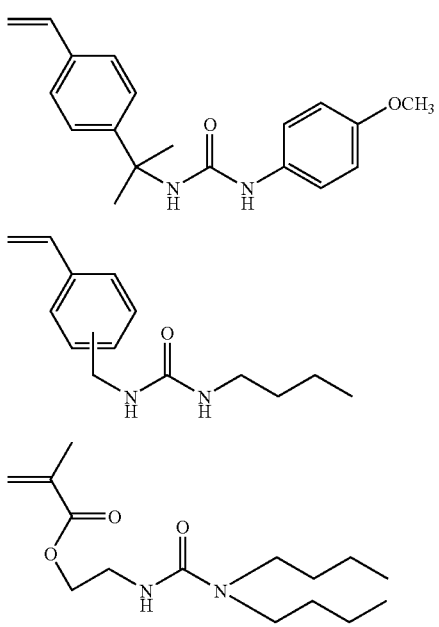

M-25

M-26

M-27

In order to perform image formation using the binder polymer having an acid value of 0.3 meq/g or less with a developer having pH of 2 to 10, it is preferred to use a vinyl monomer having a nonacidic hydrophilic group as a part of the binder polymer component.

The hydrophilic group includes, for example, a hydroxy group, a carboxylate group, a hydroxyethyl group, an ethyleneoxy group, a hydroxypropyl group, an amino group, an aminoethyl group, an aminopropyl group, an ammonium group, an amido group, a carboxymethyl group and a polyether group (for example, diethylene oxide, triethylene oxide, polyethylene oxide, dipropylene oxide, tripropylene oxide, polypropylene oxide, ditetramethylene oxide, tritetramethylene oxide, polytetramethylene oxide or a combination thereof). The vinyl monomer having such a hydrophilic group is preferably used.

More specifically, a copolymer containing at least one kind of a (meth)acrylic acid ester including a —$CH_2CH_2O$— unit, a —$CH_2CH(CH_3)O$— unit or a —$CH_2CH_2NH$— unit in R of the ester residue (—COOR) thereof, a (meth)acrylic acid ester having a hydroxy group and a meth(acrylamide) is particularly preferable. The ratio of the vinyl monomer having a hydrophilic group in the binder polymer according to the invention is preferably from 5 to 70% by mole, more preferably from 10 to 60% by mole, and particularly preferably from 15 to 50% by mole. When the ratio of the vinyl monomer having a hydrophilic group is less than 5% by mole, the developing property may deteriorate in some cases. On the other hand, when it exceeds 70% by mole, the printing durability may decrease in some cases.

Further, as the binder polymer for the photosensitive layer, a polyurethane resin is also preferably used. The polyurethane resin can be obtained by a polyaddition reaction of a known diisocyanate compound and a known diol compound, while appropriately adjusting the kind and ratio of the diisocyanate compound and diol compound so as to fulfill the above-described characteristics (for example, acid value or solubility).

1) Diisocyanate Compound

Diisocyanate compound includes the following compounds.

Preferable examples of the diisocyanate compound include diisocyanate compounds represented by the following formula (6):

$$OCN-L^1-NCO \qquad (6)$$

In formula (6), $L^1$ represents a divalent aliphatic or aromatic hydrocarbon group which may have a substituent. If desired, $L^1$ may contain other functional group which does not react with the isocyanate group, for example, an ester group, a urethane group, an amido group or a ureido group.

Specific examples of the diisocyanate compound represented by formula (6) include the following compounds.

Specifically, an aromatic diisocyanate compound, for example, 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate or 3,3'-dimethylbiphenyl-4,4'-diisocyanate; an aliphatic diisocyanate compound, for example, hexamethylene diisocyanate, trimethylhexamethylene diisocyanate, lysine diisocyanate or dimeric acid diisocyanate; an alicyclic diisocyanate compound, for example, isophorone diisocyanate, 4,4'-methylenebis(cyclohexyl isocyanate), methylcyclohexane-2,4(or 2,6)-diisocyanate or 1,3-(isocyanatomethyl)cyclohexane; and a diisocyanate compound which is a reaction product of a diol with a diisocyanate, for example, an adduct of 1 mole of 1,3-butylene glycol and 2 moles of tolylene diisocyanate.

2) Diol Compound

The diol compound includes, for example, a polyether diol compound, a polyester diol compound and polycarbonate diol compound.

Examples of the polyether diol compound include compounds represented by formulae (7), (8), (9), (10) and (11) shown below and a random copolymer of ethylene oxide and propylene oxide having a hydroxy group at the terminal thereof.

(7)

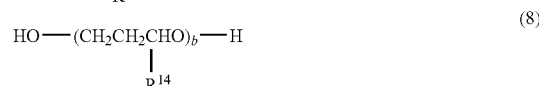

(8)

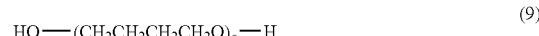

(9)

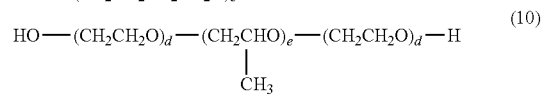

(10)

(11)

In the formulae (7) to (11), $R^{14}$ represents a hydrogen atom or a methyl group. $X^1$ represents a group shown below. a, b, c, d, e, f and g each represents an integer of 2 or more, and preferably an integer of 2 to 100.

Specific examples of the polyether diol compound represented by formula (7) or (8) include the following compounds.

Specifically, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight average molecular weight of 1,000, polyethylene glycol having a weight average molecular weight of 1,500, polyethylene glycol having a weight average molecular weight of 2,000, polyethylene glycol having a weight average molecular weight of 3,000, polyethylene glycol having a weight average molecular weight of 7,500, polypropylene glycol having a weight average molecular weight of 400, polypropylene glycol having a weight average molecular weight of 700, polypropylene glycol having a weight average molecular weight of 1,000, polypropylene glycol having a weight average molecular weight of 2,000, polypropylene glycol having a weight average molecular weight of 3,000 and polypropylene glycol having a weight average molecular weight of 4,000 are exemplified.

Specific examples of the polyether diol compound represented by formula (9) include the following compounds.

Specifically, PTMG650, PTMG1000, PTMG2000 and PTMG3000 (trade name, produced by Sanyo Chemical Industries, Ltd.) are exemplified.

Specific examples of the polyetherdiol compound represented by formula (10) include the following compounds.

Specifically, Newpol PE-61, Newpol PE-62, Newpol PE-64, Newpol PE-68, Newpol PE-71, Newpol PE-74, Newpol PE-75, Newpol PE-78, Newpol PE-108 and Newpol PE-128 (trade name, produced by Sanyo Chemical Industries, Ltd.) are exemplified.

Specific examples of the polyetherdiol compound represented by formula (11) include the following compounds.

Specifically, Newpol BPE-20, Newpol BPE-20F, Newpol BPE-2ONK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P and Newpol BPE-5P (trade name, produced by Sanyo Chemical Industries, Ltd.) are exemplified.

Specific examples of the random copolymer of ethylene oxide and propylene oxide having a hydroxy group at the terminal thereof include the following compounds.

Specifically, Newpol 50HB-100, Newpol 50HB-260, Newpol 50HB-400, Newpol 50HB-660, Newpol 50HB-2000 and Newpol 50HB-5100 (trade name, produced by Sanyo Chemical Industries, Ltd.) are exemplified.

Examples of the polyester diol compound include compounds represented by formulae (12) and (13) shown below.

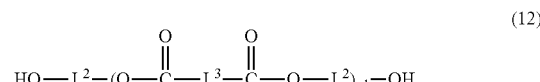

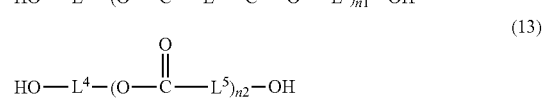

In formulae (12) and (13), $L^2$, $L^3$ and $L^4$, which may be the same or different, each represents a divalent aliphatic or aromatic hydrocarbon group, and $L^5$ represents a divalent aliphatic hydrocarbon group. Preferably, $L^2$, $L^3$ and $L^4$ each represents an alkylene group, an alkenylene group, an alkynylene group or an arylene group, and $L^5$ represents an alkylene group. Also, $L^2$, $L^3$, $L^4$ and $L^5$ each may have other functional group which does not react with the isocyanate group, for example, an ether group, a carbonyl group, an ester group, a cyano group, an olefin group, a urethane group, an amido group, a ureido group or a halogen atom. n1 and n2 each represents an integer of 2 or more, and preferably an integer of 2 to 100.

Examples of the polycarbonate diol compound include compounds represented by formula (14) shown below.

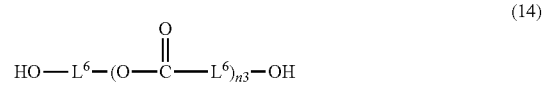

In formula (14), $L^6$, which may be the same or different, each represents a divalent aliphatic or aromatic hydrocarbon group. Preferably, $L^6$ represents an alkylene group, an alkenylene group, an alkynylene group or an arylene group. Also, $L^6$ may have other functional group which does not react with the isocyanate group, for example, an ether group, a carbonyl group, an ester group, a cyano group, an olefin group, a urethane group, an amido group, a ureido group or a halogen atom. n3 represents an integer of 2 or more, and preferably an integer of 2 to 100.

Specific examples of the diol compound represented by formula (12), (13) or (14) include Compound No. 1 to Compound No. 18 set forth below. In the specific examples, n represents an integer of 2 or more.

(No. 1)

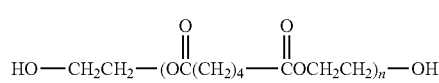

(No. 2)

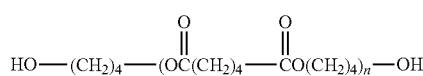

(No. 3)

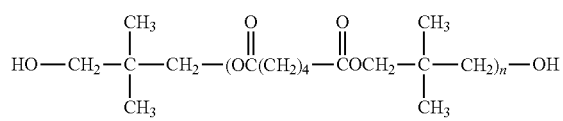

(No. 4)

-continued

(No. 5)

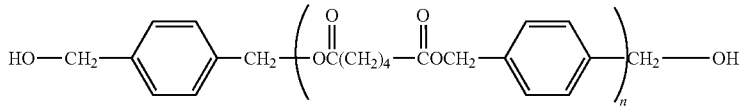
(No. 6)

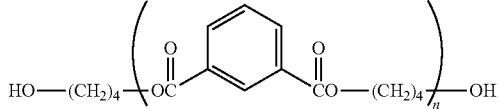
(No. 7)

(No. 8)

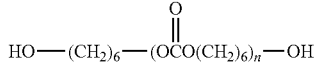
(No. 9)

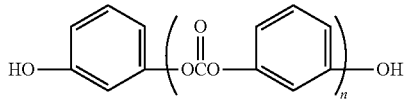
(No. 10)

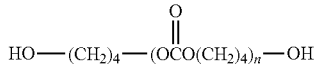
(No. 11)

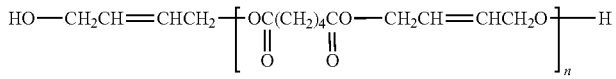
(No. 12)

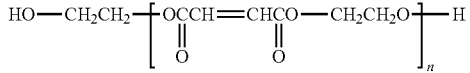
(No. 13)

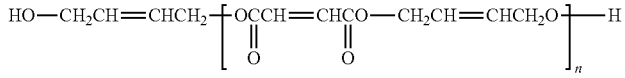
(No. 14)

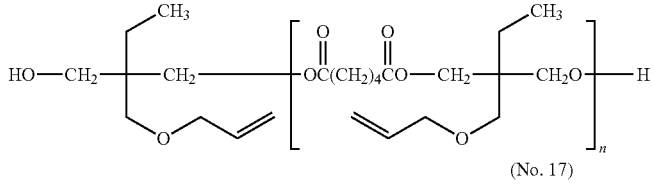
(No. 15)

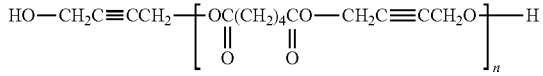
(No. 16)

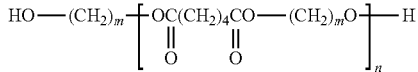
(No. 17)

(No. 18)

m = 2, 4

Also, in the synthesis of the polyurethane resin, a diol compound having a substituent which does not react with the isocyanate group in addition to the above-described diol compound can be used. Such a diol compound includes compounds represented by formulae (15) and (16) shown below.

$$HO\text{-}L^7\text{-}O\text{—}CO\text{-}L^8\text{-}CO\text{—}O\text{-}L^7\text{-}OH \quad (15)$$

$$HO\text{-}L^8\text{-}CO\text{—}O\text{-}L^7\text{-}OH \quad (16)$$

In formulae (15) and (16), $L^7$ and $L^8$, which may be the same or different, each represents a divalent aliphatic hydrocarbon group, aromatic hydrocarbon group or heterocyclic group, each of which may have a substituent (for example, an alkyl group, an aralkyl group, an aryl group, an alkoxy group, an aryloxy group or a halogen atom (e.g., —F, —Cl, —Br or —I)). $L^7$ and $L^8$ each may have other functional group which does not react with the isocyanate group, for example, a carbonyl group, an ester group, a urethane group, an amido group or a ureido group, if desired. Alternatively, $L^7$ and $L^8$ may be combined with each other to form a ring.

The binder polymer may be imparted with a crosslinking property in order to increase the film strength of the image area.

In order to impart the crosslinking property to the binder polymer, a crosslinkable functional group, for example, an ethylenically unsaturated bond is introduced into the main chain or side chain of the binder polymer. The crosslinkable functional group may be introduced by copolymerization or may be introduced by a polymer reaction.

The term "crosslinkable group" as used herein means a group capable of crosslinking the binder polymer in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bond group, an amino group or an epoxy group as a functional group capable of conducting an addition polymerization reaction. Also, a functional group capable of forming a radical upon irradiation with light may be used and such a crosslinkable group includes, for example, a thiol group, a halogen atom and an onium salt structure. Among them, the ethylenically unsaturated bond group is preferable, and functional groups represented by formulae (1) to (3) shown below are particularly preferable.

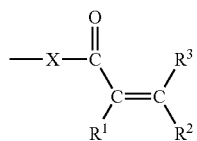
(1)

In formula (1), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferable because of high radical reactivity. $R^2$ and $R^3$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

X represents an oxygen atom, a sulfur atom or $-N(R^{12})-$, and $R^{12}$ represents a hydrogen atom or a monovalent organic group. The monovalent organic group represented by $R^{12}$ includes, for example, an alkyl group which may have a substituent. $R^{12}$ is preferably a hydrogen atom, a methyl group, an ethyl group or an isopropyl group because of high radical reactivity.

Examples of the substituent introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

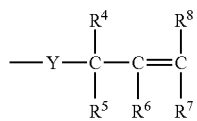
(2)

In formula (2), $R^4$ to $R^8$ each independently represents a hydrogen atom or a monovalent organic group. $R^4$ to $R^8$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable.

Examples of the substituent introduced include those described in Formula (1). Y represents an oxygen atom, a sulfur atom or $-N(R^{12})-$, and $R^{12}$ has the same meaning as $R^{12}$ defined in Formula (1). Preferable examples for $R^{12}$ are also same as those described in Formula (1).

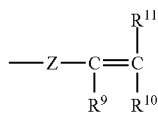
(3)

In formula (3), $R^9$ represents a hydrogen atom or a monovalent organic group. $R^9$ preferably represents a hydrogen atom or an alkyl group which may have a substituent. Among them, a hydrogen atom or a methyl group is preferable because of high radical reactivity. $R^{10}$ and $R^{11}$ each independently represents, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

Examples of the substituent introduced include those described in Formula (1). Z represents an oxygen atom, a sulfur atom, $-N(R^{13})-$ or a phenylene group which may have a substituent. $R^{13}$ includes, for example, an alkyl group which may have a substituent. Among them, a methyl group, an ethyl group or an isopropyl group is preferable because of high radical reactivity.

Of the binder polymers described above, the vinyl copolymer having a crosslinkable group in its side chain and the polyurethane resin having a crosslinkable group in its side chain are more preferable.

In the binder polymer having the crosslinking property, for example, a free radical (a polymerization initiating radical or a propagating radical in the process of polymerization of the polymerizable compound) is added to the crosslinkable functional group to cause an addition-polymerization between the binder polymers directly or through a polymerization chain of the polymerizable compound, as a result, crosslinkage is formed between the binder polymer molecules to effect curing. Alternatively, an atom (for example, a hydrogen atom on the carbon atom adjacent to the functional crosslinkable group) in the binder polymer is withdrawn by a free radical to produce a polymer radical and the polymer radicals combine with each other to form crosslinkage between the binder polymer molecules to effect curing.

The content of the crosslinkable group (content of radical-polymerizable unsaturated double bond determined by iodine titration) in the binder polymer is preferably from 0.1 to 10.0 mmol, more preferably from 1.0 to 7.0 mmol, still more preferably from 2.0 to 5.5 mmol, per g of the binder polymer.

The glass transition temperature (Tg) of the binder polymer for use in the photosensitive layer is preferably from 0 to 150° C., more preferably from 20 to 120° C., and still more preferably from 30 to 100° C. When the glass transition temperature is lower than 0° C., the printing durability may decrease in some cases. On the other hand, when the glass transition temperature exceeds 150° C., the developing property may deteriorate in some cases.

The binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymer may be any of a random polymer, a block polymer, a graft polymer and the like.

The binder polymers may be used individually or in combination of two or more thereof.

From the standpoint of preferable strength of the image area and good image-forming property, the content of the binder polymer is preferably from 5 to 75% by weight, more preferably from 10 to 60% by weight, still more preferably from 20 to 50% by weight, based on the total solid content of the photosensitive layer.

(Sensitizing Dye)

In the photosensitive layer, a sensitizing dye can be used. A sensitizing dye having an absorption peak in a wavelength range of 300 to 850 nm is preferable and a sensitizing dye having an absorption peak in a wavelength range of 300 to 600 nm is more preferable. As such a sensitizing dye, a spectral sensitizing dye and a dye or pigment which absorbs light of a light source to cause an interaction with the photopolymerization initiator shown below are exemplified.

The spectral sensitizing dye or dye preferably used includes, for example, a multi-nuclear aromatic compound (for example, pyrene, peryrene or triphenylene), a xanthene (for example, Fluorescein, Eosin, Erythrosine, Rhodamine B or Rose Bengal), a cyanine (for example, thiacarbocyanine or oxacarbocyanine), a merocyanine (for example, merocyanine or carbomerocyanine), a thiazine (for example, Thionine, Methylene Blue or Toluidine Blue), an acridine (for example, Acridine Orange, chloroflavine or acriflavine), a phthalocyanine (for example, phthalocyanine or metallo-phthalocyanine), a porphyrin (for example, tetraphenyl porphyrin or center metal-substituted porphyrin), a chlorophyll (for example, chlorophyll, chlorophyllin or center metal-substituted chlorophyll), a metal complex, an anthraquinone (for example, anthraquinone) and a squalium (for example, squalium).

More preferable examples of the spectral sensitizing dye or dye include styryl dyes described in JP-B-37-13034, cationic dyes described in JP-A-62-143044, quinoxalinium salts described in JP-B-59-24147, new Methylene Blue compounds described in JP-A-64-33104, anthraquinones described in JP-A-64-56767, benzoxanthene dyes described in JP-A-2-1714, acridines described in JP-A-2-226148 and JP-A-2-226149, pyrylium salts described in JP-B-40-28499, cyanines described in JP-B-46-42363, benzofuran dyes described in JP-A-2-63053, conjugated ketone dyes described in JP-A-2-85858 and JP-A-2-216154, dyes described in JP-A-57-10605, azocinnamylidene derivatives described in JP-B-2-30321, cyanine dyes described in JP-A-1-287105, xanthene dyes described in JP-A-62-31844, JP-A-62-31848 and JP-A-62-143043, aminostyryl ketones described in JP-B-59-28325, merocyanine dyes described in JP-B-61-9621, dyes described in JP-A-2-179643, merocyanine dyes described in JP-A-2-244050, merocyanine dyes described in JP-B-59-28326, merocyanine dyes described in JP-A-59-89803, merocyanine dyes described in JP-A-8-129257, and benzopyran dyes described in JP-A-8-334897.

The sensitizing dye for use in the invention is more preferably a compound represented by formula (12) shown below.

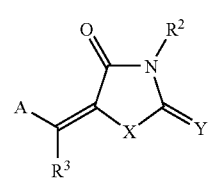

(12)

In formula (12), A represents an aromatic cyclic group or a heterocyclic group, X represents an oxygen atom, a sulfur atom or —N(R$^1$)—, Y represents an oxygen atom or =N(R$^1$), R$^1$, R$^2$ and R$^3$ each independently represents a monovalent non-metallic atomic group, or A and R$^1$, A and R$^2$ or A and R$^3$ may be combined with each other to form an aliphatic or aromatic ring.

The monovalent non-metallic atomic group represented by any one of R$_1$, R$_2$ and R$_3$ preferably includes an alkyl group or an aryl group.

Now, preferable examples for any one of R$_1$, R$_2$ and R$_3$ are specifically described below. Preferable examples of the alkyl group include a straight-chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acyloxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N- alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugate base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugate base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugate base group (hereinafter referred to as an "alkylphosphonato group"), a monoarylphosphono group (—PO$_3$H(aryl)) and its conjugate base group (hereinafter referred to as an "arylphosphonato group"), a phosphonooxy group (—OPO$_3$H$_2$) and its conjugate base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugate base group (hereinafter referred to as an "alkylphosphonatooxy group"), a monoarylphosphonooxy group (—OPO$_3$H(aryl)) and its conjugate base group (hereinafter referred to as an "arylphosphonatooxy group"), a cyano group, a nitro group, an aryl group, a heteroaryl group, an alkenyl group, an alkynyl group and a silyl group.

In the substituents, specific examples of the alkyl group include those described for the alkyl group above. The alkyl group may further have a substituent.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

As the heteroaryl group, a group derived from a monocyclic or polycyclic aromatic ring containing at least one of a nitrogen atom, an oxygen atom and a sulfur atom is used. Examples of heteroaryl ring in the especially preferable heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phenarsazine and furazane. These groups may be benzo-fused or may have a substituent.

Also, examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of G$_1$ in the acyl group (G$_1$CO—) include a hydrogen atom and the above-described alkyl group and aryl group. Of the substituents for the alkyl group, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group, an alkenyl group and an alkylidene group (for example, a methylene group) are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of the preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of R$^1$, R$^2$, and R$^3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatopropyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl) sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Preferable examples of the substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamo-yloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

More preferable examples of any one of $R^2$ and $R^3$ include a substituted or unsubstituted alkyl group, and more preferable examples of $R^1$ include a substituted or unsubstituted aryl group. The reason why these substituents are preferable is not quite clear. However, it is believed that interaction of the sensitizing dye in the electron excited state caused by light absorption with the polymerization initiator becomes especially large by means of having such a substituent to increase efficiency of the polymerization initiator for generating a radical, an acid or a base.

Now, A in formula (12) will be described below. A represents an aromatic cyclic group or heterocyclic group. Specific examples of the aromatic cyclic group and heterocyclic group include those described for the aryl group and the heteroaryl group with respect to any one of $R_1$, $R_2$ and $R_3$ in formula (12), respectively.

Among them, A is preferably an aryl group having an alkoxy group, a thioalkyl group or an amino group, and more preferably an aryl group having an amino group.

Of the compounds represented by formula (12), compounds represented by formula (14) are more preferable.

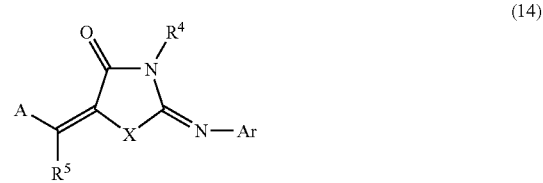

(14)

In formula (14), A represents an aromatic cyclic group or a heterocyclic group, X represents an oxygen atom, a sulfur atom or —N($R^1$)—, $R^1$, $R^4$ and $R^5$ each independently represents a monovalent non-metallic atomic group, or A and $R^1$, A and $R^4$ or A and $R^5$ may be combined with each other to form an aliphatic or aromatic ring. Ar represents an aromatic cyclic group which have a substituent or a heterocyclic group which have a substituent, provided that the substituent(s) present on the aromatic cyclic group or heterocyclic group represented by Ar must have the sum of Hammett values of 0 or larger. The terminology "the sum of Hammett values of 0 or larger" as used herein means that one substituent is present on the Ar skeleton and the Hammett value of the substituent is larger than 0 or plural substituents are present on the Ar skeleton and the sum of the Hammett values of the substituents is larger than 0.

In formula (14), A and $R^1$ have the same meanings as A and $R^1$ in formula (12) respectively, and $R^4$ and $R^5$ have the same meanings as $R^2$ and $R^3$ in formula (12) respectively. Ar represents an aromatic cyclic group which have a substituent or a heterocyclic group which have a substituent. Specific examples thereof include the specific examples of the aromatic cyclic group which have a substituent or heterocyclic group which have a substituent among those described with respect to A in formula (12). However, it is essential for the substituent introduced into the aromatic cyclic group or heterocyclic group in formula (14) that the sum of Hammett values thereof is 0 or larger. Examples of the substituent include a trifluoromethyl group, a carbonyl group, an ester group, a halogen atom, a nitro group, a cyano group, a sulfoxido group, an amido group and a carboxyl group. The Hammett values of the substituents are shown below. Trifluoromethyl group (—$CF_3$ m: 0.43, p: 0.54), Carbonyl group (for example, —COH m: 0.36, p: 0.43), Ester group (for example, —$COOCH_3$ m: 0.37, p: 0.45), Halogen atom (for example, —Cl m: 0.37, p: 0.23), Cyano group (—CN m: 0.56, p: 0.66), Sulfoxido group (for example, —$SOCH_3$ m: 0.52, p: 0.45), Amido group (for example, —$HNCOCH_3$ m: 0.21, p: 0.00), and Carboxyl group (—COOH 0.37, p: 0.45). In each paren thesis, an introduction position of the substituent on the aryl skeleton and the Hammett value thereof are described. For instance, (m: 0.50) means that when the substituent is introduced into a metha position, the Hammett value thereof is 0.50. In the above, a preferable example of Ar is a phenyl group having a substituent. Preferable examples of the substituent on the Ar skeleton include an ester group and a cyano group. With respect to the position of the substituent, an ortho position of the Ar skeleton is particularly preferable.

Preferable specific examples (Compound D1 to Compound D57) of the sensitizing dye represented by formula (12) are set for the below, but the invention should not be construed as being limited thereto.

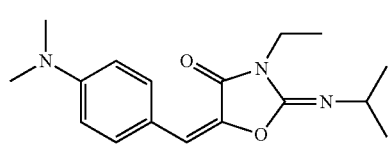
(D1)

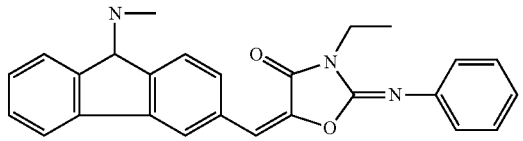
(D2)

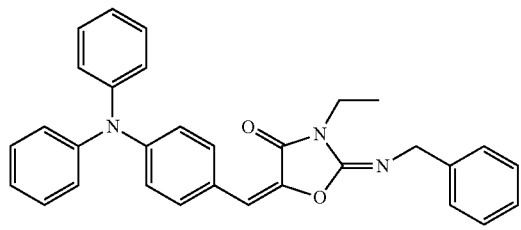
(D3)

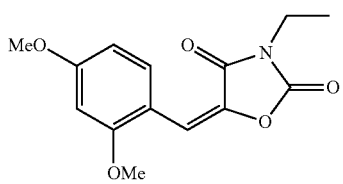
(D4)

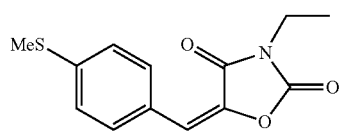
(D5)

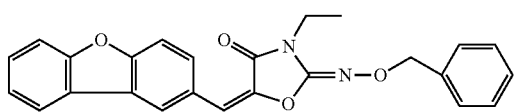
(D6)

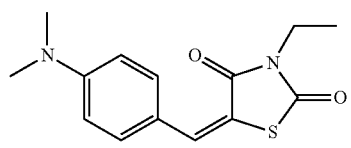
(D7)

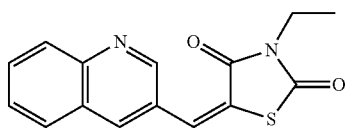
(D8)

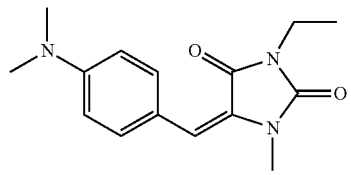
(D9)

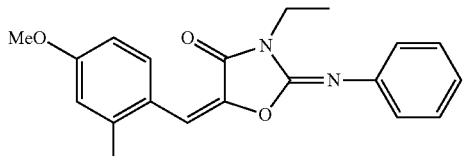
(D10)

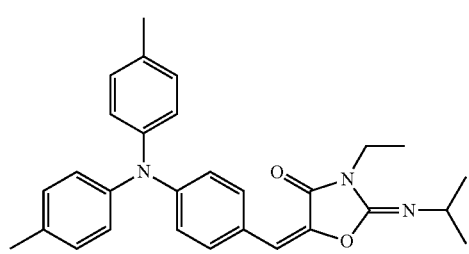
(D11)

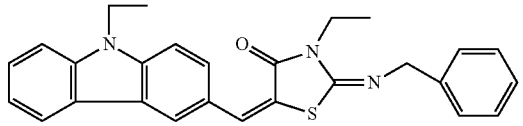
(D12)

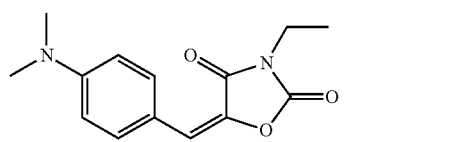
(D13)

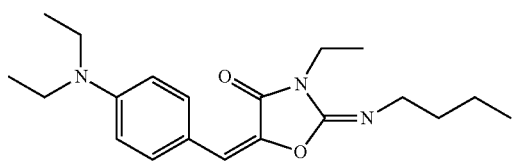
(4)

-continued
(D15)
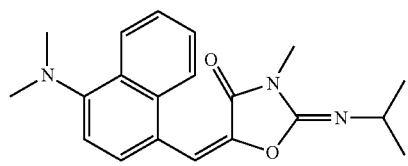
(D16)
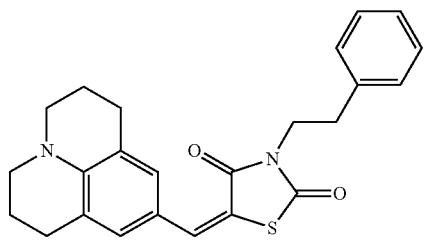
(D17)
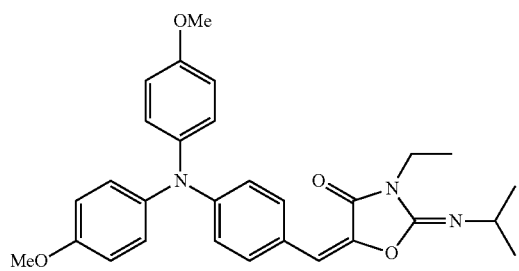
(D18)
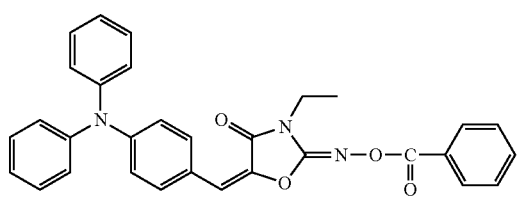
(D19)
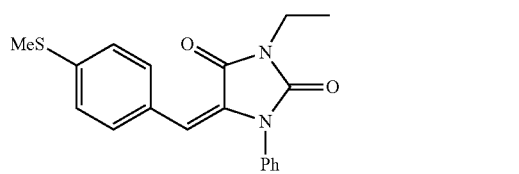
(D20)
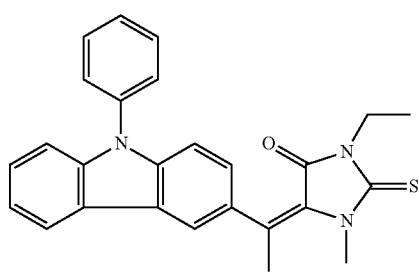
(D21)
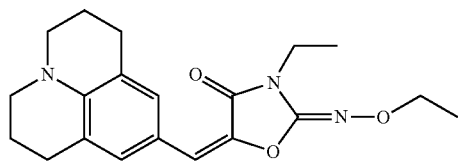
(D22)
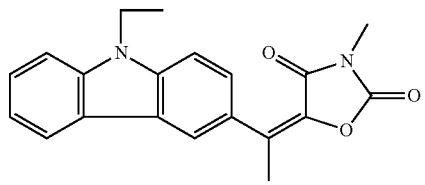
(D23)
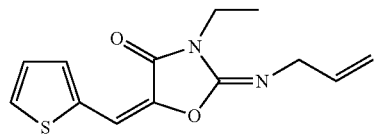
(D24)
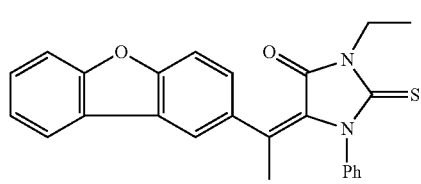
(D25)
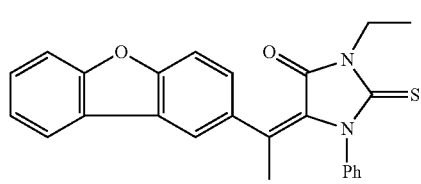
(D26)
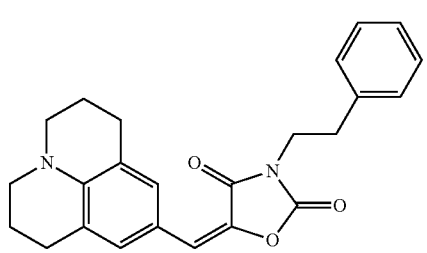

-continued
(D27)
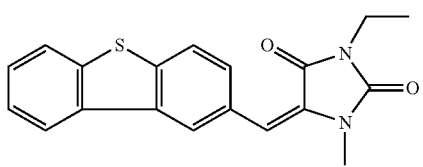
(D28)
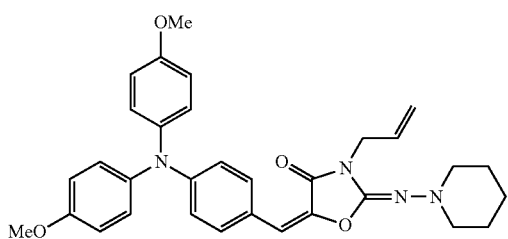
(D29)
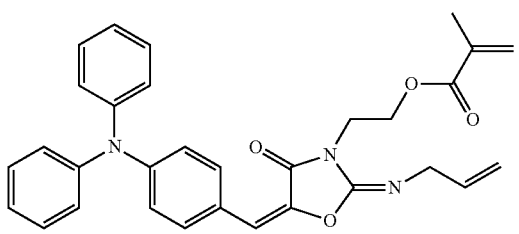
(D30)
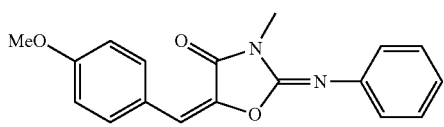
(D31)
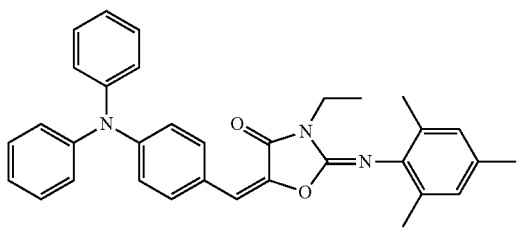
(D32)
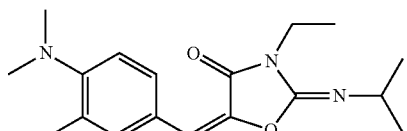
(D33)
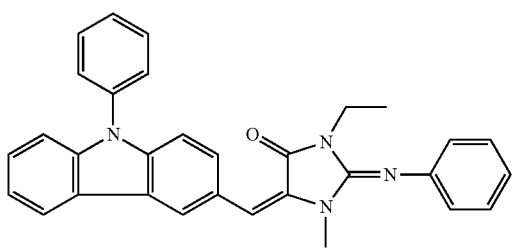
(D34)
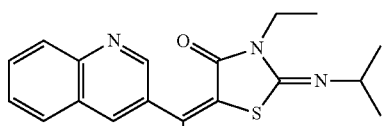
(D35)
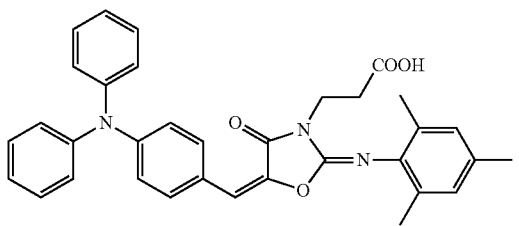
(D36)
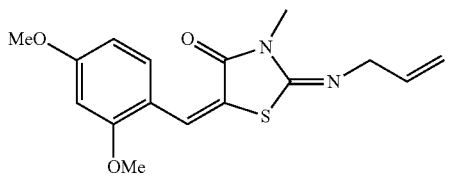
(D37)
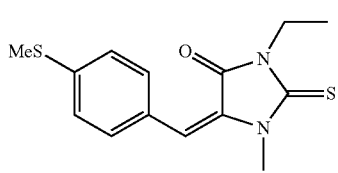

-continued
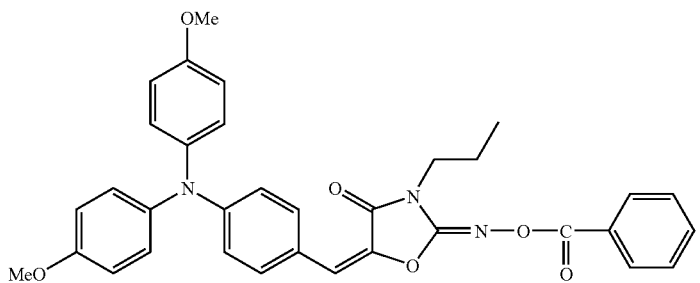
(D38)
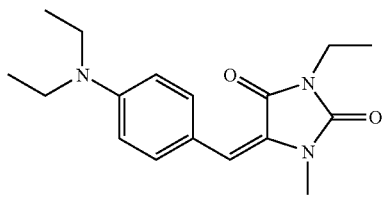
(D39)
(D40)
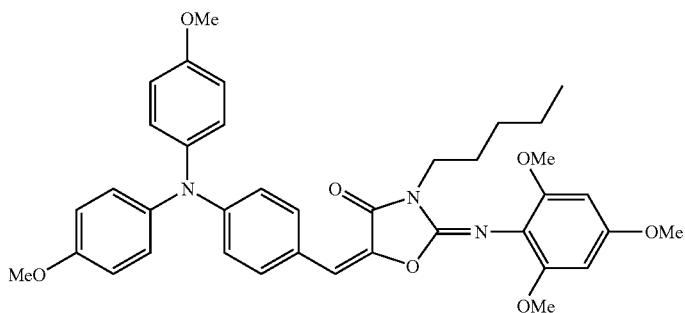
(D41)
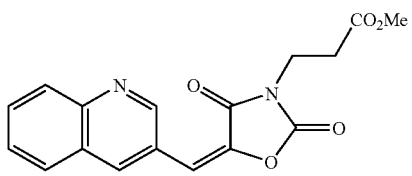
(D42)
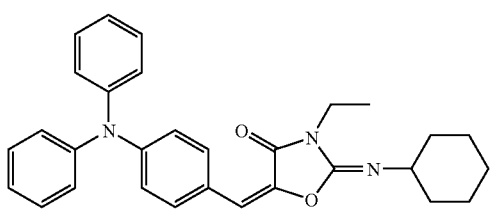
(D43)
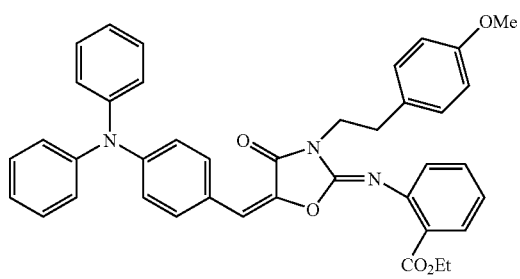
(D44) (D45)

-continued
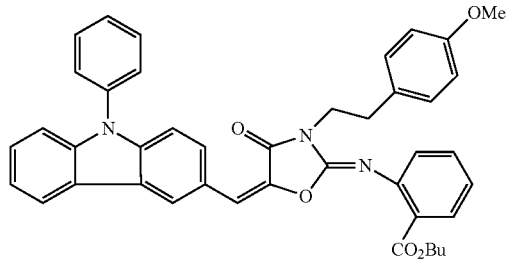
(D46)
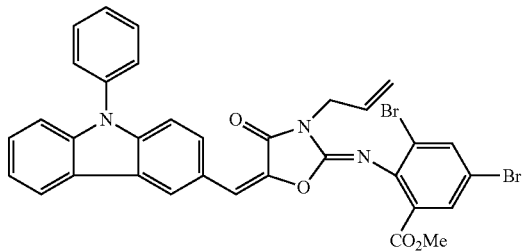
(D47)
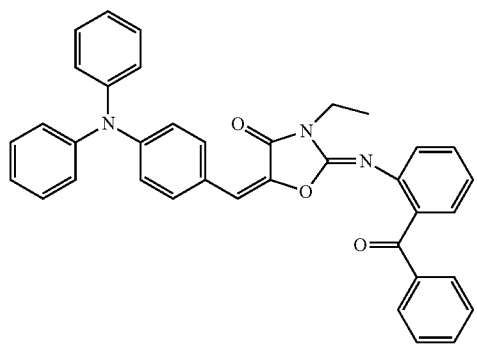
(D48)
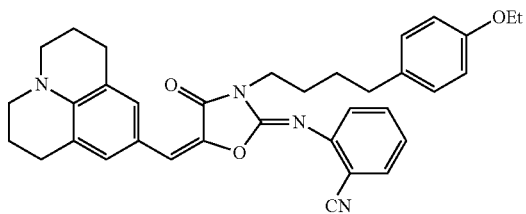
(D49)
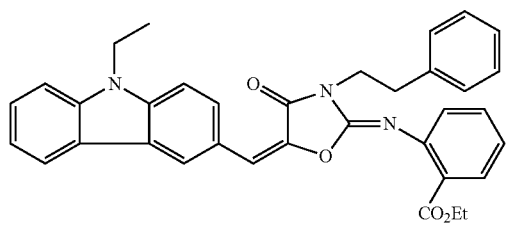
(D50)
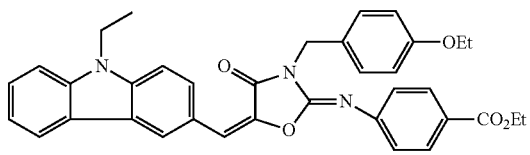
(D51)
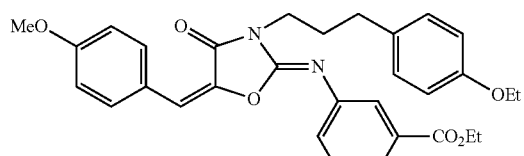
(D52)
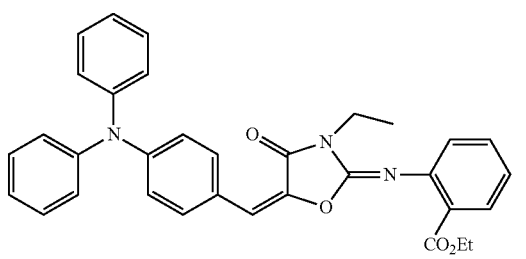
(D53)
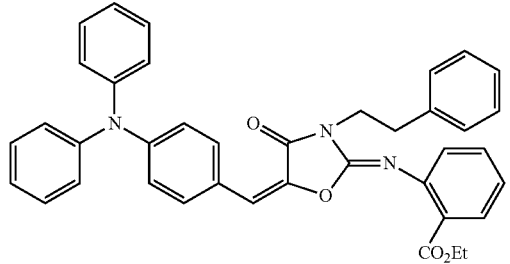
(D54)
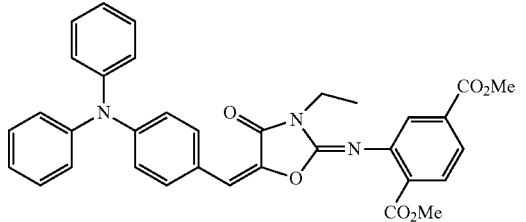
(D55)

-continued (D56)

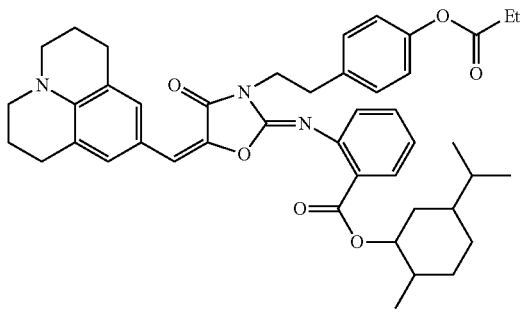

(D57)

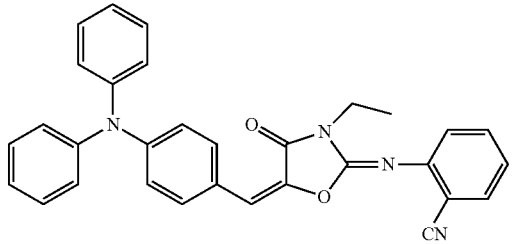

Synthesis method of the compound represented by formula (12) is described below.

The compound represented by formula (12) is ordinarily obtained by a condensation reaction of an acidic nucleus having an active methyl group with a substituted or unsubstituted, aromatic ring or hetero ring. Specifically, it can be synthesized with reference to the description of JP-B-59-28329.

The sensitizing dye may be subjected to various chemical modifications in order to improve characteristics of the photosensitive layer. For instance, the sensitizing dye may be connected to an addition-polymerizable compound structure (for example, an acryloyl group or a methacryloyl group) by a covalent bond, ionic bond, hydrogen bond or the like, whereby strength of the exposed area of the layer can be increased and undesirable deposition of the dye in the layer after exposure can be inhibited.

Also, the sensitizing dye may be connected to a partial structure having a radical generation ability (for example, a reductively decomposable site, e.g., a halogenated alkyl, onium, peroxide or biimidazole, or an oxidatively cleavable site, e.g., a borate, amine, trimethylsilylmethyl, carboxymethyl, carbonyl or imine) in the polymerization initiator described above, whereby photosensitivity, particularly photosensitivity under a low concentration condition of the initiation system can be remarkably increased.

Further, introduction of a hydrophilic site (an acid group or a polar group, for example, a carboxyl group or an ester thereof, a sulfonic acid group or an ester thereof or an ethylene oxide group) into the dye is effective for the purpose of enhancing the processing aptitude with an alkali or aqueous developer. Particularly, the ester-type hydrophilic group has a feature in that it exhibits excellent compatibility in the photosensitive layer due to its relatively hydrophobic structure and in the developer, on the other hand, it is hydrolyzed to generate an acid group, thereby increasing hydrophilicity.

In addition, a substituent can be appropriately introduced, for example, for improving the compatibility or inhibiting the deposition of crystal in the photosensitive layer. For instance, in a certain kind of photosensitive system, an unsaturated bond, for example, an aryl group or an allyl group is sometimes very effective for improving the compatibility. Moreover, the formation of a steric hindrance between π planes of the dyes by a method, for example, introduction of a branched alkyl structure can significantly inhibit the deposition of crystal. Furthermore, adhesion to metal or an inorganic material, for example, metal oxide can be improved by the introduction of a phosphonic acid group, an epoxy group, a trialkoxysilyl group or the like. Depending on the purpose, a method of polymerization of the sensitizing dye may also be used.

As the sensitizing dye for use in the invention, it is preferred to use at least one of the sensitizing dyes represented by formula (12). Specifically, the details of the method of using the sensitizing dye, for example, selection of the structure including the chemical modification described above, individual or combination use or an amount added, can be appropriately arranged depending on the characteristic design of the lithographic printing plate precursor. For instance, when two or more sensitizing dyes are used in combination, the compatibility with the photosensitive layer can be enhanced.

For the selection of sensitizing dye, the molar absorption coefficient thereof at an emission wavelength of light source used is an important factor in addition to the photosensitivity. Use of the dye having a large molar absorption coefficient is profitable, because the amount of dye added can be made relatively small, and is also advantageous in view of the physical properties of the photosensitive layer.

In the invention, not only the sensitizing dye represented by formula (12), but also other conventionally used sensitizing dyes can be used as far as the effects of the invention do not adversely affected.

Since the photosensitivity and resolution of the photosensitive layer and the physical properties of the exposed area of the photosensitive layer are greatly influenced by the absorbance of a sensitizing dye at the wavelength of light source, the amount of the sensitizing dye added is appropriately selected in consideration of these factors. For instance, in a low absorbance region of the photosensitive layer of 0.1 or less, the sensitivity decreases. Also, the resolution decreases due to the influence of halation. However, for the purpose of curing a layer having a large thickness, for example, of 5 μm or more, such low absorbance is sometimes rather effective for increasing the curing degree. On the other hand, in a high absorbance region of 3 or more, the light is mostly absorbed on the surface of the photosensitive layer to inhibit curing of the inner part of the photosensitive layer and as a result, when a printing plate is produced, the layer strength and the adhesion to a support become insufficient.

The amount of the sensitizing dye added is preferably selected such that the photosensitive layer has absorbance of 0.1 to 1.5, preferably from 0.25 to 1. Since the absorbance is determined by the amount of the sensitizing dye added and the thickness of the photosensitive layer, the desired absorbance can be obtained by controlling both conditions. The absorbance of the photosensitive layer can be measured in a conventional manner. For the measurement of the absorbance, there are illustrated, for example, a method wherein a photosensitive layer is provided on a transparent or white support in a coating amount after drying to have a thickness appropriately determined in a range necessary for a lithographic printing plate precursor and the photosensitive layer is measured by a transmission optical densitometer, and a method wherein a photosensitive layer is provided on a reflective support, for example, an aluminum support in a similar manner to the above and a reflection density of the photosensitive layer is measured.

The amount of the sensitizing dye added is ordinarily from 0.05 to 30 parts by weight, preferably from 0.1 to 20 parts by weight, more preferably from 0.2 to 10 parts by weight, per 100 parts by weight of the total solid component constituting the photosensitive layer.

(Infrared Absorbing Agent)

In the case wherein the image exposure is conducted using as a light source, laser emitting an infrared ray of 760 to 1,200 nm according to the invention, an infrared absorbing agent is ordinarily used. The infrared absorbing agent has a function of converting the infrared ray absorbed to heat. By the heat thus-generated, the radical generator (polymerization initiator) is thermally decomposed to generate a radical. The infrared absorbing agent for use in the invention includes a dye and pigment each having an absorption maximum in a wavelength range of 760 to 1,200 nm.

As the dye, commercially available dyes and known dyes described in literatures, for example, *Senryo Binran* (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356, JP-A-59-202829 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used. Other preferable examples of the dye include near infrared absorbing dyes represented by formulae (I) and (II) in U.S. Pat. No. 4,756,993.

Other preferable examples of the infrared absorbing dye according to the invention include specific indolenine cyanine dyes described in JP-A-2002-278057 as illustrated below.

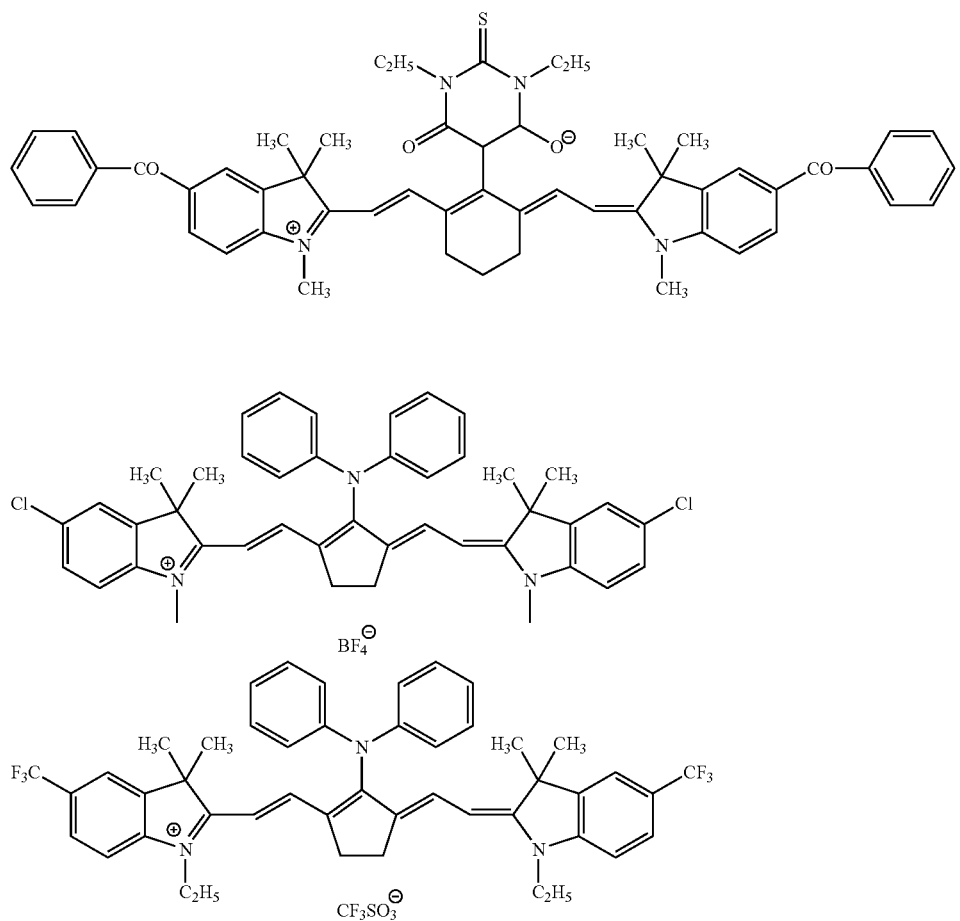

Of the dyes, particularly, cyanine dyes, squarylium dyes, pyrylium dyes, nickel thiolate complexes and indolenine cyanine dyes are preferred. Further, cyanine dyes and indolenine cyanine dyes are more preferred. As particularly preferable examples of the dye, cyanine dyes represented by formulae (a) to (e) shown below are exemplified.

Formula (a):

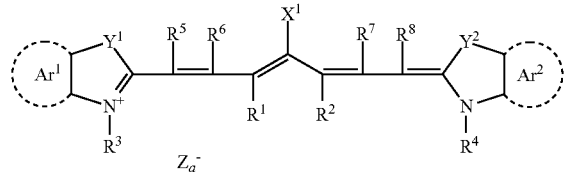

In formula (a), $X^1$ represents a hydrogen atom, a halogen atom, —$NPh_2$, —$X^2$-$L^1$ or a group represented by the structural formula shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom used herein indicates a nitrogen atom, a sulfur atom, an oxygen atom, a halogen atom and a selenium atom. $Xa^-$ has the same meaning as $Za^-$ defined hereinafter and $R^\alpha$ represents a hydrogen atom, an alkyl group, an aryl group, an amino group or a halogen atom.

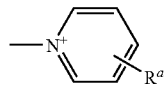

$R^1$ and $R^2$ each independently represents a hydrocarbon group having from 1 to 12 carbon atoms. In view of the preservation stability of a coating solution for photosensitive layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group. Preferable examples of the aromatic hydrocarbon group include a benzene ring and a naphthalene ring. Also, preferable examples of the substituent for the aromatic hydrocarbon group include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms. Preferable examples of the substituent for the hydrocarbon group include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. In view of the preservation stability of a coating solution for photosensitive layer, preferable examples of the counter ion for $Za^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion.

Specific examples of the cyanine dye represented by formula (a) which can be preferably used in the invention include those described in Paragraph Nos. [0017] to [0019] of JP-A-2001-133969, Paragraph Nos. [0012] to [0038] of JP-A-2002-40638 and Paragraph Nos. [0012] to [0023] of JP-A-2002-23360, as well as those illustrated below

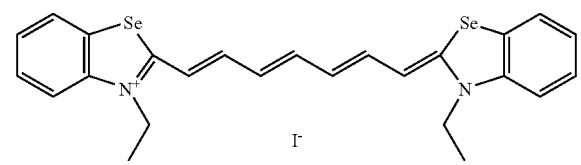

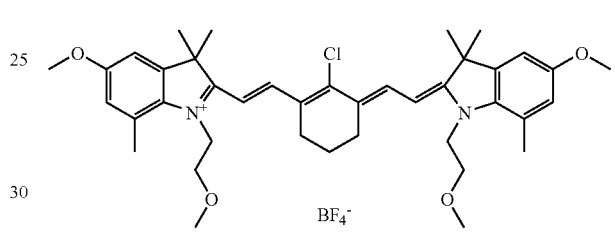

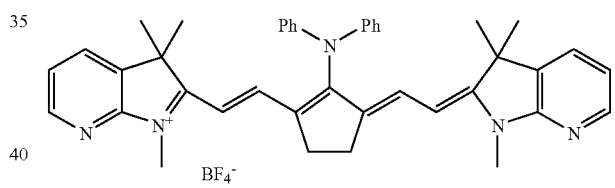

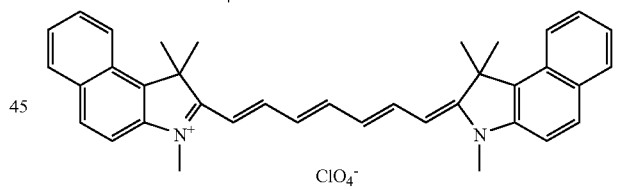

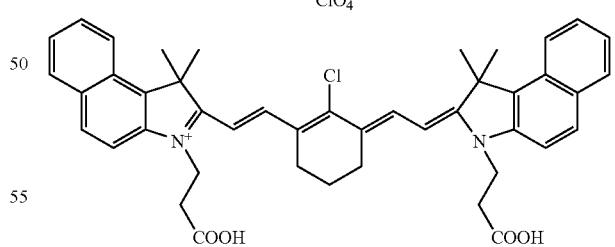

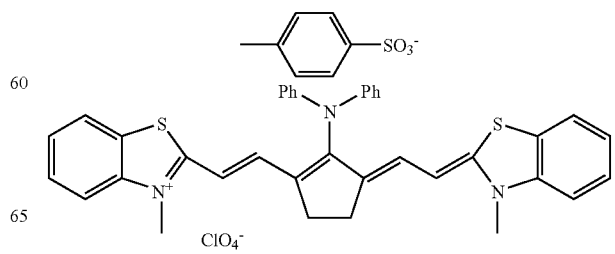

-continued

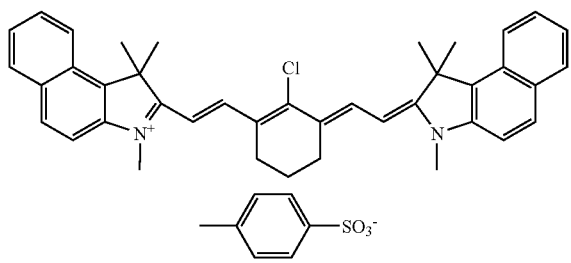

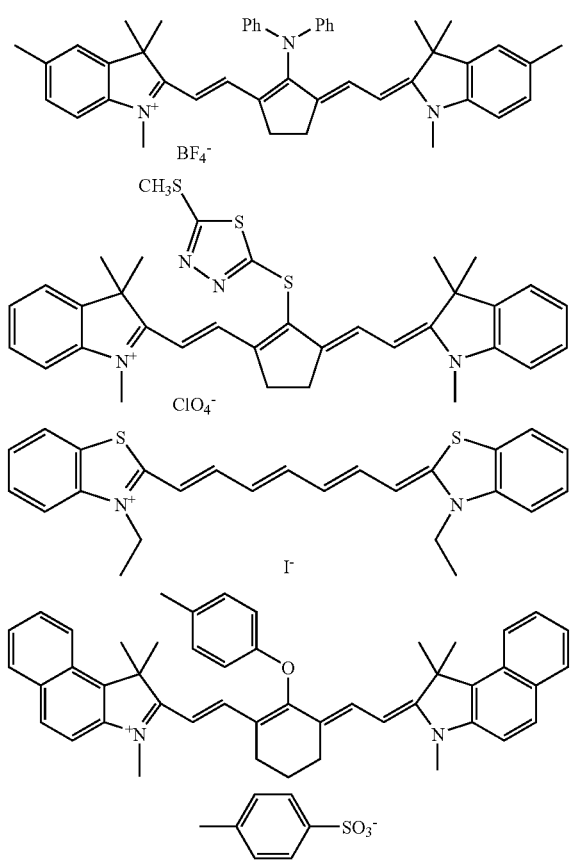

-continued

Formula (b):

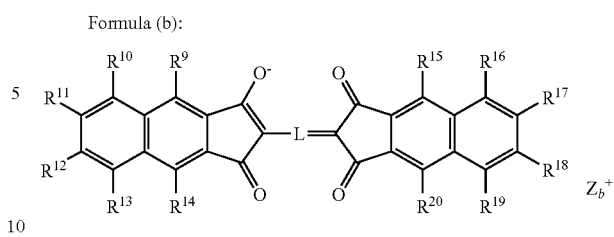

In Formula (b), L represents a methine chain having a conjugated carbon atom number of 7 or more, the machine chain may have a substituent and the substituents may be combined with each other to form a ring structure. $Z_b^+$ represents a counter cation. Preferable examples of the counter cation include an ammonium, iodonium, sulfonium, phosphonium, pyridinium and alkali metal cation (for example, $Na^+$, $K^+$ or $Li^+$). $R^9$ to $R^{14}$ and $R^{15}$ to $R^{20}$ each independently represents a hydrogen atom or a substituent selected from a halogen atom, a cyano group, an alkyl group, an aryl group, an alkenyl group, an alkynyl group, a carbonyl group, a thio group, a sulfonyl group, a sulfinyl group, an oxy group, an amino group and a substituent formed by combination of two or three of these groups, or may be combined with each other to form a ring structure. The compound represented by formula (b) wherein L represents a methine chain having a conjugated carbon atom number of 7 and $R^9$ to $R^{14}$ and $R^{15}$ to $R^{20}$ all represent hydrogen atoms is preferable in view of easy availability and effect.

Specific examples the dye represented by formula (b) which can be preferably used in the invention include those described below.

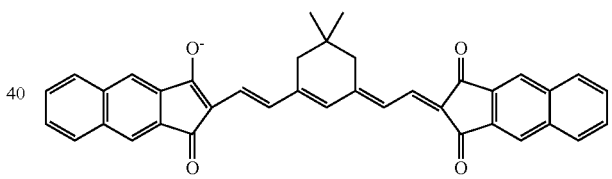

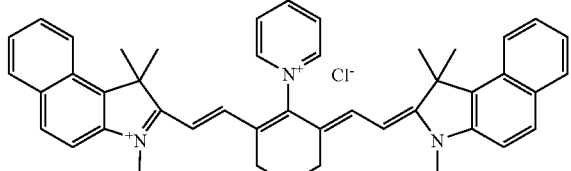
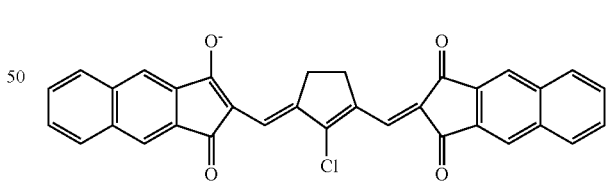

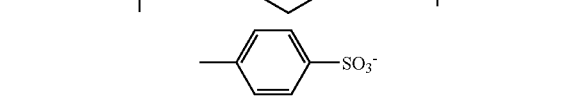
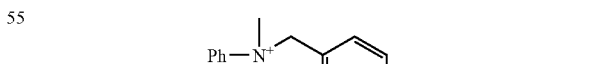

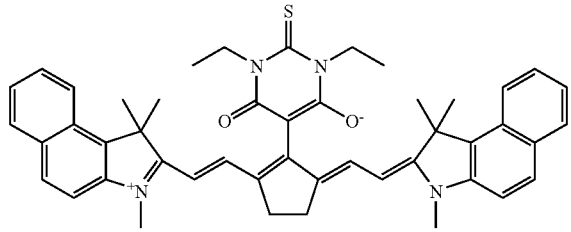
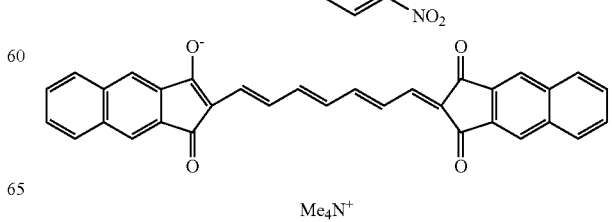

Formula (c)

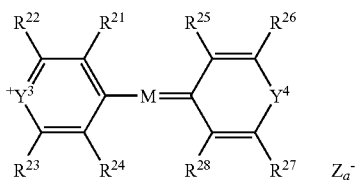

In formula (c), $Y^3$ and $Y^4$ each represents an oxygen atom, a sulfur atom, a selenium atom or a tellurium atom. M represents a methine chain having a conjugated carbon atom number of 5 or more. $R^{21}$ to $R^{24}$ and $R^{25}$ to $R^{28}$, which may be the same or different, each represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group. $Za^-$ represents a counter anion and has the same meaning as $Za^-$ in formula (a).

Specific examples the dye represented by formula (c) which can be preferably used in the invention include those described below.

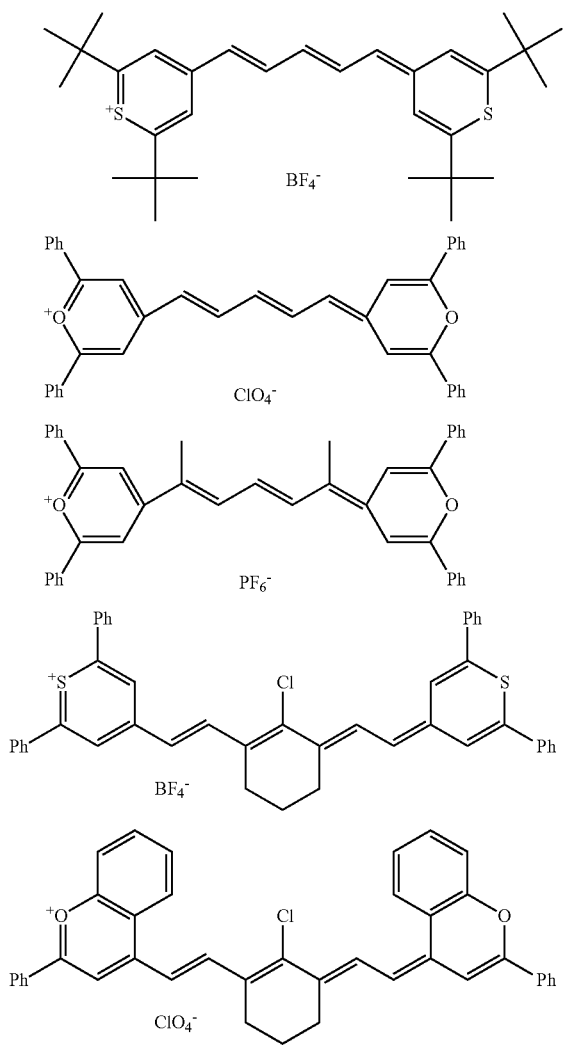

Formula (d):

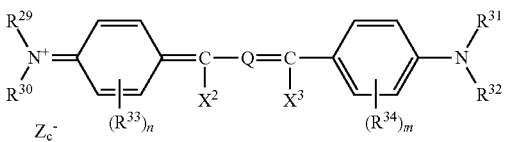

In formula (d), $R^{29}$ to $R^{32}$ each independently represents a hydrogen atom, an alkyl group or an aryl group. $R^{33}$ and $R^{34}$ each independently represents an alkyl group, a substituted oxy group or a halogen atom. n and m each independently represents an integer of 0 to 4. $R^{29}$ and $R^{30}$ or $R^{31}$ and $R^{32}$ may be combined with each other to form a ring. Also, $R^{29}$ and/or $R^{30}$ and $R^{33}$ or $R^{31}$ and/or $R^{32}$ and $R^{34}$ may be combined with each other to form a ring. Further, when plural $R^{33}$ or $R^{34}$ are present, the $R^{33}$ or $R^{34}$ may be combined with each other to form a ring. $X^2$ and $X^3$ each independently represents a hydrogen atom, an alkyl group or an aryl group, provided that at least one of $X^2$ and $X^3$ represents a hydrogen atom or an alkyl group. Q represents a trimethine group which may have a substituent or a pentamethine group which may have a substituent, or may form a ring structure together with a divalent organic group. $Zc^-$ represents a counter anion and has the same meaning as $Za^-$ in formula (a).

Specific examples the dye represented by formula (d) which can be preferably used in the invention include those described below.

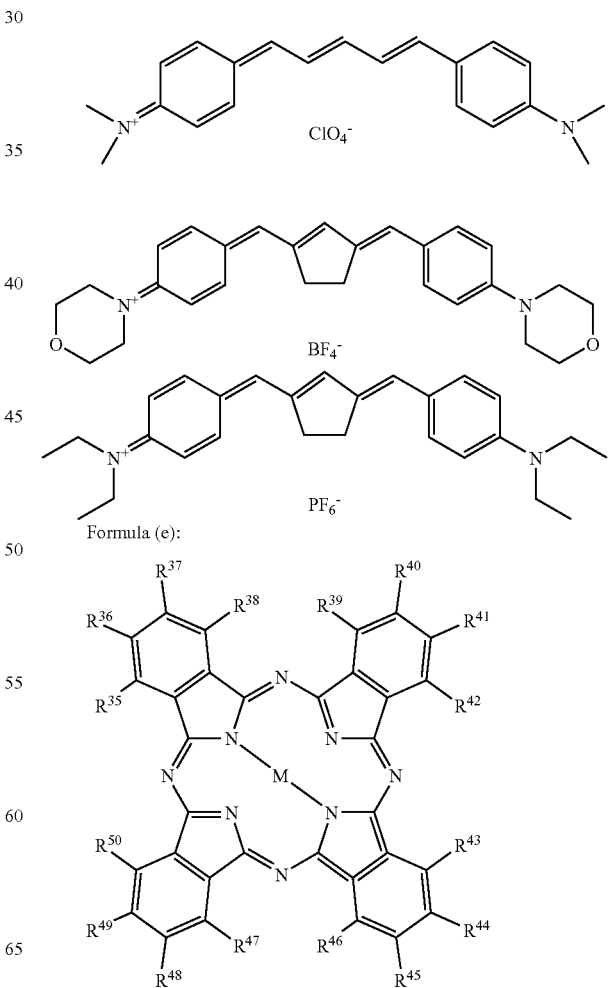

In formula (e), $R^{35}$ to $R^{50}$ each independently represents a hydrogen atom, a halogen atom, a cyano group, an alkyl group, an aryl group, an alkenyl group, an alkynyl group, a hydroxy group, a carbonyl group, a thio group, a sulfonyl group, a sulfinyl group, an oxy group, an amino group or an onium salt structure. When a substituent can be introduced into these groups, they may have the substituent. M represents two hydrogen atoms, a metal atom, a halometal group or an oxymetal group. Examples of the metal atom included therein include atoms of Groups IA, IIA, IIIB and IVB of the Periodic Table, transition metals of the first, second and third periods, and lanthanoid elements. Among them, copper, magnesium, iron, zinc, cobalt, aluminum, titanium and vanadium are preferred.

Specific examples the dye represented by formula (e) which can be preferably used in the invention include those described below.

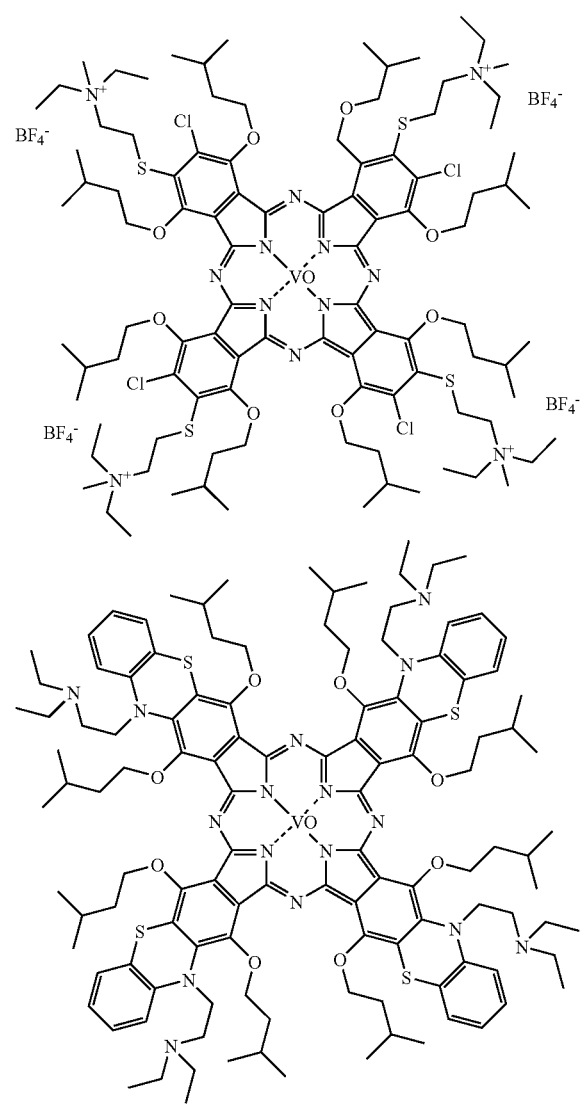

Examples of the pigment for use in the invention include commercially available pigments and pigments described in Colour Index (C.I.), Saishin Ganryo Binran (Handbook of the Newest Pigments) compiled by Pigment Technology Society of Japan (1977), Saishin Ganryo Oyou Gijutsu (Newest Application on Technologies for Pigments), CMC Publishing Co., Ltd. (1986) and Insatsu Ink Gijutsu (Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or a polyisocyanate) to the pigment surface. The surface treatment methods are described in Kinzoku Sekken no Seishitsu to Oyo (Properties and Applications of Metal Soap), Saiwai Shobo, Insatsu Ink Gijutsu (Printing Ink Technology), CMC Publishing Co., Ltd. (1984), and Saishin Ganryo Oyo Gijutsu (Newest Application on Technologies for Pigments), CMC Publishing Co., Ltd. (1986).

The pigment has a particle size of preferably from 0.01 to 10 µm, more preferably from 0.05 to 1 µm, and particularly preferably from 0.1 to 1 µm. When the particle size of pigment is 0.01 or more, stability of the pigment dispersion in the coating solution for photosensitive layer increases and when it is 10 µm or less, uniformity of the photosensitive layer is improved.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machine is described in detail in Saishin Ganryo Oyo Gijutsu (Newest Application on Technologies for Pigments), CMC Publishing Co., Ltd. (1986).

The sensitizing dye, for example, an infrared absorbing agent may be added to a layer, for example, an uppercoat layer or undercoat layer, separately provided. The infrared absorbing agent is preferably added to the photosensitive layer so as to have optical density of the photosensitive layer at the absorption maximum in a wavelength range of 760 to 1,200 nm of 0.1 to 3.0 from the standpoint of sensitivity. Since the optical density is determined by the amount of the infrared absorbing agent added and the thickness of the photosensitive layer, the desired optical density can be obtained by controlling both conditions.

The optical density of the photosensitive layer can be measured in a conventional manner. For the measurement of the optical density, there are illustrated, for example, a method wherein a photosensitive layer is provided on a transparent or white support in a coating amount after drying to have a thickness appropriately determined in a range necessary for a lithographic printing plate precursor and the photosensitive layer is measured by a transmission optical densitometer, and a method wherein a photosensitive layer is provided on a reflective support, for example, an aluminum support in a similar manner to the above and a reflection density of the photosensitive layer is measured.

Into the photosensitive layer, various constituting components (additives) of the photosensitive layer may further be incorporated, if desired.

(Co-Sensitizer)

A co-sensitizer can be used in the photosensitive layer. The co-sensitizer is an additive which can further increase the sensitivity of the photosensitive layer when it is added to the photosensitive layer. The operation mechanism of the co-sensitizer is not quite clear but may be considered to be mostly based on the following chemical process. Specifically, the co-sensitizer reacts with various intermediate active species (for example, a radical, a peroxide, an oxidizing agent or a reducing agent) generated during the process of photo-reaction initiated by light absorption of the polymerization initiator and subsequent addition-polymerization reaction to produce new active radicals. The co-sensitizers are roughly classified into (a) a compound which is reduced to produce an active radical, (b) a compound which is oxidized to produce an active radical and (c) a compound which reacts with a radical having low activity to convert it into a more highly active radical or acts as a chain transfer agent. However, in many cases, a common view about that an individual compound belongs to which type is not present.

(a) Compound which is Reduced to Produce an Active Radical

Compound Having Carbon-Halogen Bond:

An active radical is considered to be generated by the reductive cleavage of the carbon-halogen bond. Specific examples of the compound preferably used include a trihalomethyl-s-triazine and a trihalomethyloxadiazole.

Compound Having Nitrogen-Nitrogen Bond:

An active radical is considered to be generated by the reductive cleavage of the nitrogen-nitrogen bond. Specific examples of the compound preferably used include a hexaarylbiimidazole.

Compound Having Oxygen-Oxygen Bond:

An active radical is considered to be generated by the reductive cleavage of the oxygen-oxygen bond. Specific examples of the compound preferably used include an organic peroxide.

Onium Compound:

An active radical is considered to be generated by the reductive cleavage of a carbon-hetero bond or oxygen-nitrogen bond. Specific examples of the compound preferably used include a diaryliodonium salt, a triarylsulfonium salt and an N-alkoxypyridinium (azinium) salt.

(b) Compound which is Oxidized to Produce an Active Radical

Alkylate Complex:

An active radical is considered to be generated by the oxidative cleavage of a carbon-hetero bond. Specific examples of the compound preferably used include a triaryl alkyl borate.

Alkylamine Compound:

An active radical is considered to be generated by the oxidative cleavage of a C—X bond on the carbon adjacent to nitrogen, wherein X is preferably, for example, a hydrogen atom, a carboxyl group, a trimethylsilyl group or a benzyl group. Specific examples of the compound include an ethanolamine, an N-phenylglycine and an N-trimethylsilylmethylaniline.

Sulfur-Containing or Tin-Containing Compound:

A compound in which the nitrogen atom of the above-described amine is replaced by a sulfur atom or a tin atom is considered to generate an active radical in the same manner.

Also, a compound having an S—S bond is known to effect sensitization by the cleavage of the S—S bond.

α-Substituted Methylcarbonyl Compound:

An active radical can be generated by the oxidative cleavage of carbonyl-α-carbon bond. The compound in which the carbonyl is converted into an oxime ether also shows the similar function. Specific examples of the compound include an 2-alkyl-1-[4-(alkylthio)phenyl]-2-morpholinopropanone-1 and an oxime ether obtained by a reaction of the 2-alkyl-1-[4-(alkylthio)phenyl]-2-morpholinopropanone-1 with a hydroxyamine and subsequent etherification of the N—OH and an oxime ester obtained by subsequent esterification of the N—OH.

Sulfinic Acid Salt:

An active radical can be reductively generated. Specific examples of the compound include sodium arylsulfinate.

(c) Compound which Reacts with a Radical to Convert it into a more Highly Active Radical or Acts as a Chain Transfer Agent:

For example, a compound having SH, PH, SiH or GeH in its molecule is used as the compound which reacts with a radical to convert it into a more highly active radical or acts as a chain transfer agent. The compound donates hydrogen to a low active radical species to generate a radical or is oxidized and deprotonized to generate a radical.

In the photosensitive layer according to the invention, particularly, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used as the chain transfer agent.

Among them, a thiol compound represented by formula (I) shown below is preferably used. By using the thiol compound represented by formula (I) as the chain transfer agent, a problem of the odor and decrease in sensitivity due to evaporation of the compound from the photosensitive layer or diffusion thereof into other layers are avoided and a lithographic printing plate precursor which is excellent in preservation stability and exhibits high sensitivity and good printing durability is obtained.

Formula (I):

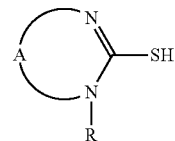

In formula (I), R represents a hydrogen atom, an alkyl group or an aryl group, A represents an atomic group necessary for forming a 5-membered or 6-membered hetero ring containing a carbon atom together with the N=C—N linkage, and A may have a substituent.

Compounds represented by any one of formulae (IA) and (IB) shown below are more preferably used.

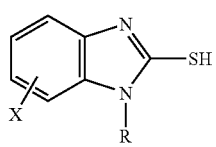

Formula (IA)

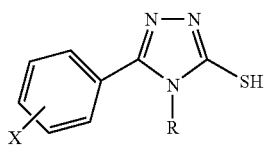
Formula (IB)
In formulae (IA) and (IB), R represents a hydrogen atom, an alkyl group or an aryl group, and X represents a hydrogen atom, a halogen atom, an alkoxy group, an alkyl group or an aryl group.
Specific examples of the compound represented by formula (I) are set forth below, but the invention should not be construed as being limited thereto.
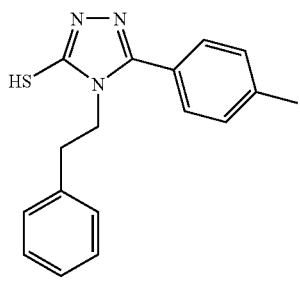
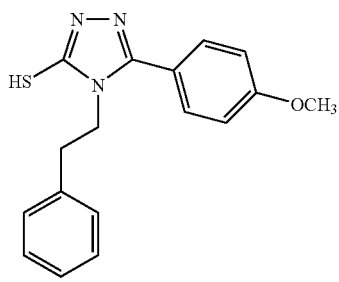
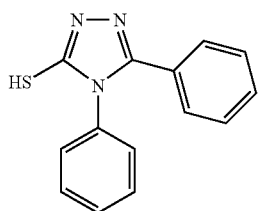
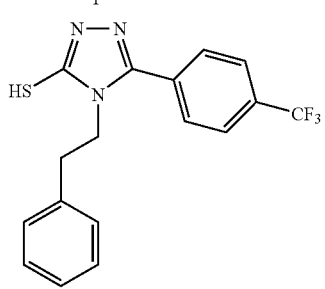
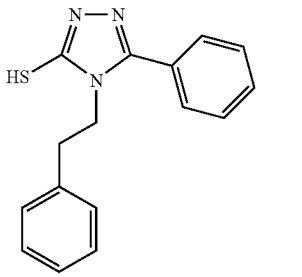
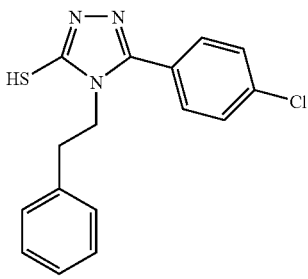
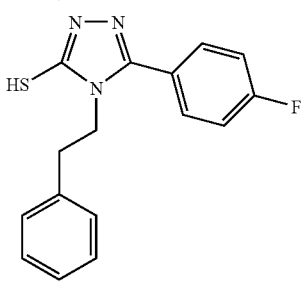
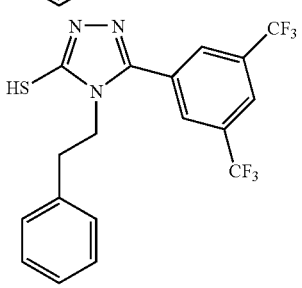
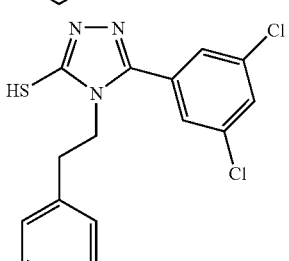
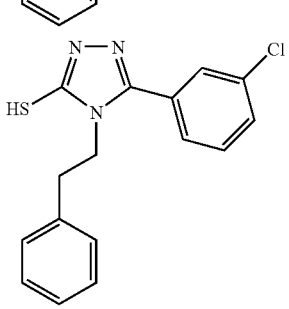

89
-continued
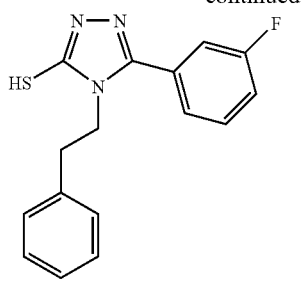
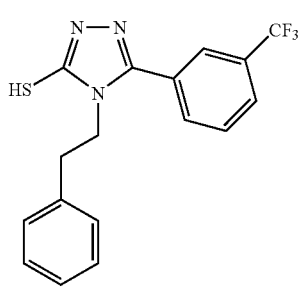
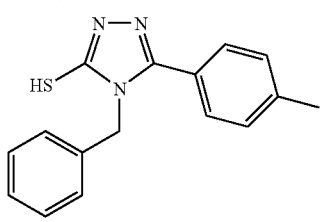
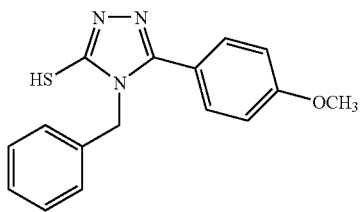
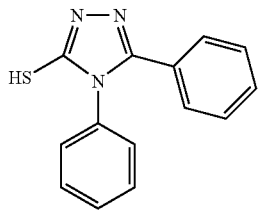
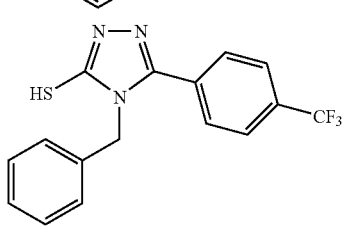
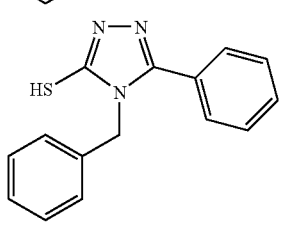
90
-continued
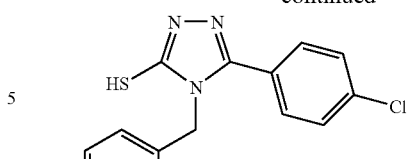
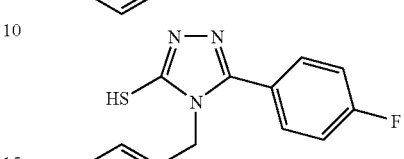
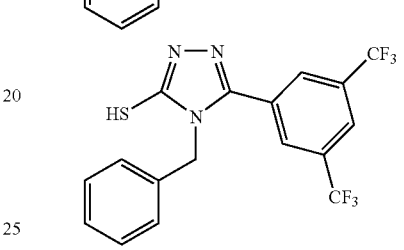
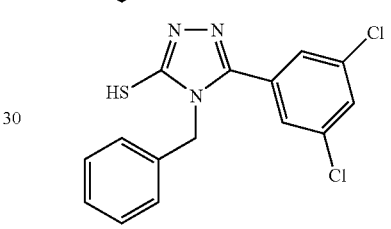
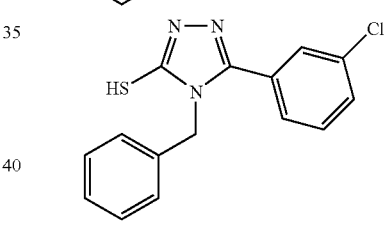
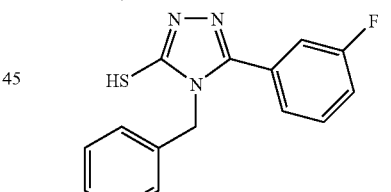
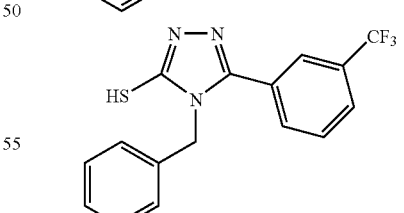
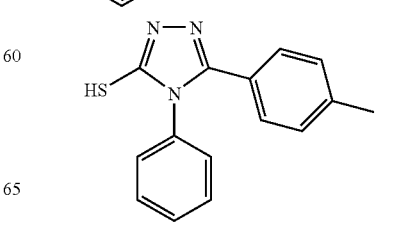

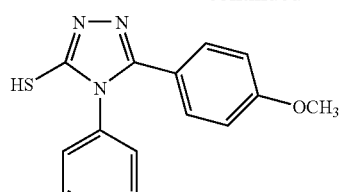
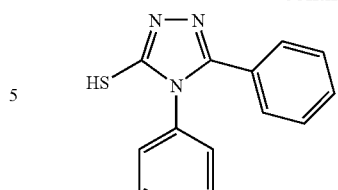
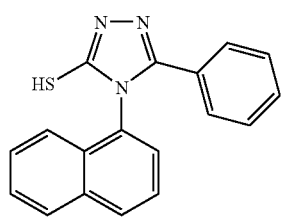
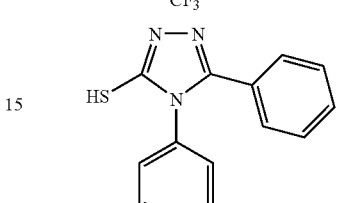
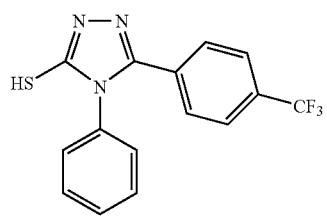
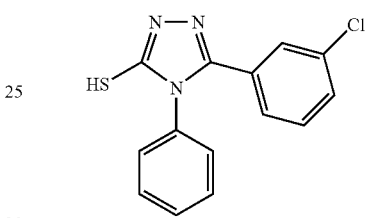
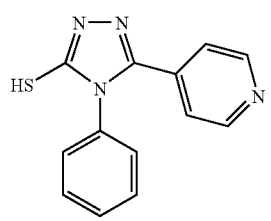
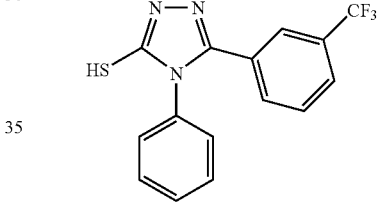
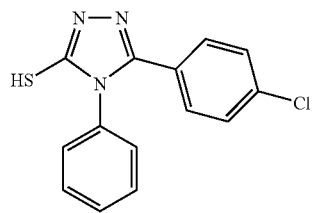
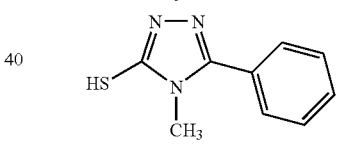
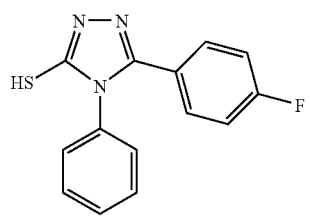
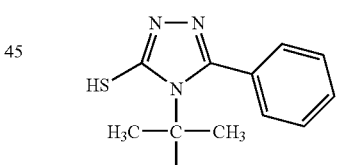
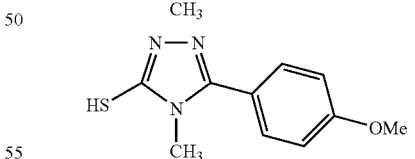
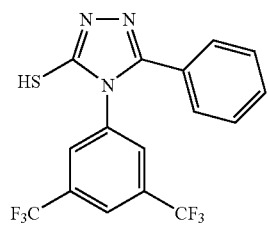
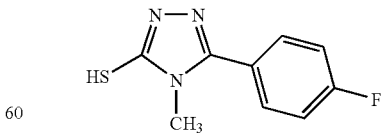
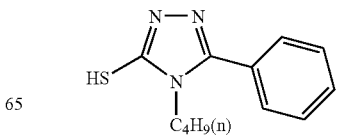

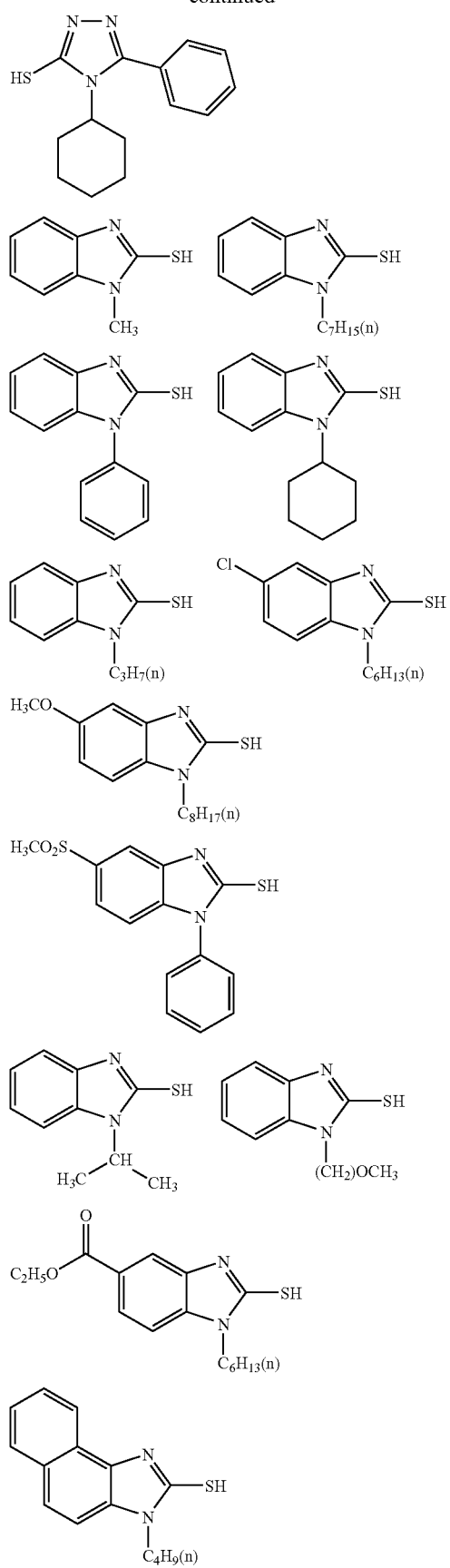
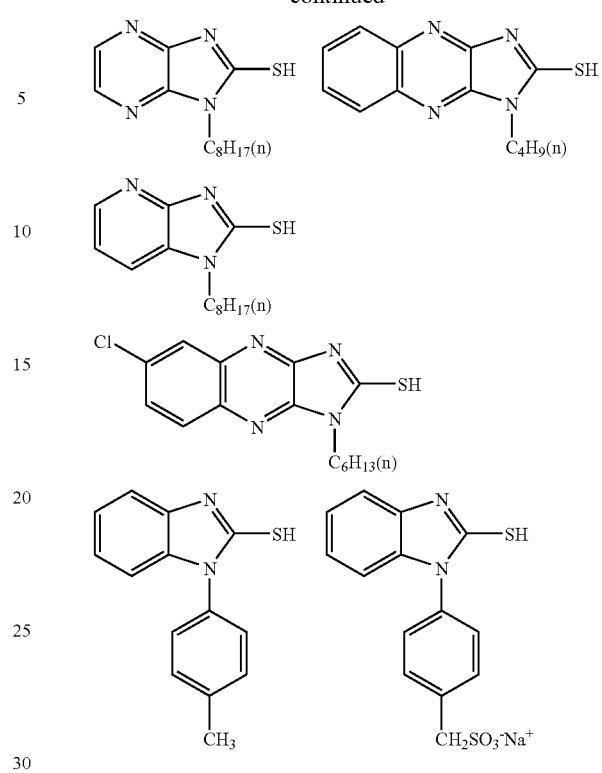

The amount of the chain transfer agent used is preferably from 0.01 to 20% by weight, more preferably from 0.1 to 15% by weight, still more preferably from 1.0 to 10% by weight, based on the total solid content of the photosensitive layer.

Other specific examples of the co-sensitizer include compounds described, for example, in JP-A-9-236913 as additives for the purpose of increasing sensitivity. Some of them are set forth below, but the invention should not be construed as being limited thereto.

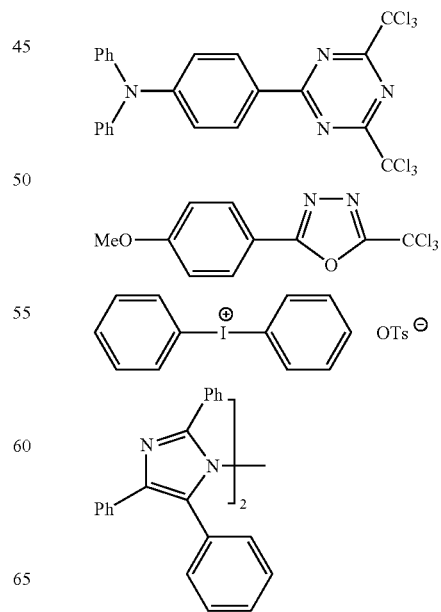

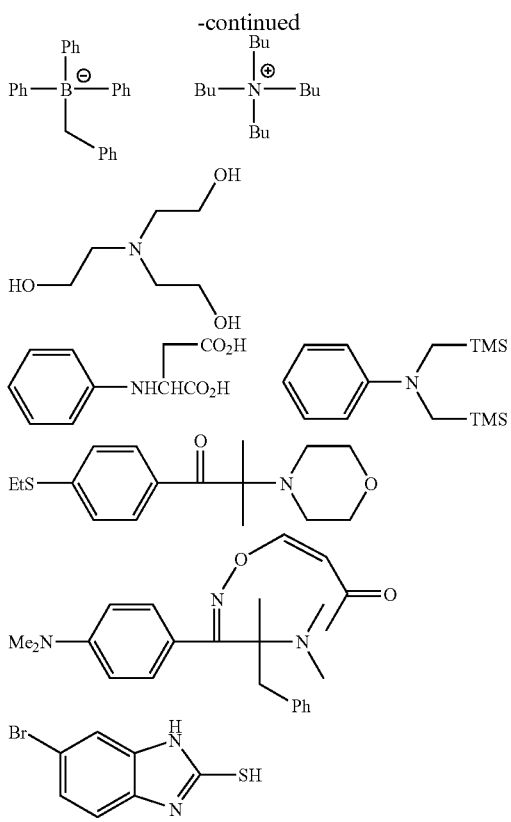

Similarly to the above-described sensitizing dye, the co-sensitizer can be subjected to various chemical modifications so as to improve the characteristics of the photosensitive layer of the lithographic printing plate precursor. For instance, methods, for example, binding to the sensitizing dye, polymerization initiator, addition-polymerizable unsaturated compound or other radical-generating part, introduction of a hydrophilic site, introduction of a substituent for improving compatibility or inhibiting deposition of crystal, introduction of a substituent for improving adhesion property, and formation of a multifunctional compound or a polymer, may be used. The co-sensitizers may be used individually or in combination of two or more thereof. The amount of the co-sensitizer used is ordinarily from 0.05 to 100 parts by weight, preferably from 1 to 80 parts by weight, more preferably from 3 to 50 parts by weight, per 100 parts by weight of the polymerizable compound.

(Surfactant)

In the photosensitive layer, it is preferable that a surfactant is incorporated in order to progress the developing property and to improve the state of surface coated. The surfactant includes, for example, a nonionic surfactant, an anionic surfactant, a cationic surfactant, an amphoteric surfactant and a fluorine-based surfactant.

The nonionic surfactant for use in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols and copolymer of polyethylene glycol and polypropylene glycol.

The anionic surfactant for use in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxy polyoxyethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant for use in the invention is not particularly restricted and cationic surfactants hitherto known can be used. Examples of the cationic surfactant include alkylamine salts, quaternary ammonium salts, polyoxyethylene alkylamine salts and polyethylene polyamine derivatives.

The amphoteric surfactant for use in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

With respect to the surfactants described above, the term "polyoxyethylene" can be replaced with "polyoxyalkylene", for example, polyoxymethylene, polyoxypropylene or polyoxybutylene, and such surfactants can also be used in the invention.

Further, a preferable surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkyl phosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Also, fluorine-based surfactants described in JP-A-62-170950, JP-A-62-226143 and JP-A-60-168144 are also preferably exemplified.

The surfactants may be used individually or in combination of two or more thereof. The content of the surfactant is preferably from 0.001 to 10% by weight, more preferably from 0.01 to 7% by weight, based on the total solid content of the photosensitive layer.

(Hydrophilic Polymer)

Into the photosensitive layer, a hydrophilic polymer can be incorporated in order to improve the developing property and dispersion stability of microcapsule.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or sodium salt thereof, cellulose acetate, sodium alginate, a vinyl acetate-maleic acid copolymer, a styrene-maleic acid copolymer, polyacrylic acid or salt thereof, polymethacrylic acid or salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinyl pyrrolidone, a homopolymer or polymer of acrylamide, a homopolymer or copolymer of methacrylamide, a homopolymer or copolymer of N-methylolacrylamide, an alcohol-soluble nylon, and a polyether of 2,2-bis(4-hydroxyphenyl)propane with epichlorohydrin.

The weight average molecular weight of the hydrophilic polymer is preferably 5,000 or more, more preferably from 10,000 to 30,000. The hydrophilic polymer may be any of a random polymer, a block polymer, a graft polymer and the like. The content of the hydrophilic polymer in the photosensitive layer is preferably 20% by weight or less, more preferably 10% by weight or less, based on the total solid content of the photosensitive layer.

(Coloring Agent)

Into the photosensitive layer, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment, carbon black and titanium oxide can be preferably used.

It is preferable to add the coloring agent, because after the image formation, the image area and the non-image area can be easily distinguished. The amount of the coloring agent added is preferably from 0.01 to 10% by weight based on the total solid content of the photosensitive layer.

(Print-Out Agent)

To the photosensitive layer, a compound capable of undergoing discoloration with an acid or a radical can be added in order to form a print-out image. As such a compound, for example, various dyes, e.g., diphenylmethane-based, triphenylmethane-based, thiazine-based, oxazine-based, xanthene-based, anthraquinone-based, iminoquinone-based, azo-based and azomethine-based dyes are effectively used.

Specific examples thereof include dyes, for example, Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH (produced by Hodogaya Chemical Co., Ltd.), Oil Blue #603, Oil Pink #312, Oil Red 5B, Oil Scarlet #308, Oil Red OG, Oil Red RR and Oil Green #502 (produced by Orient Chemical Industry Co., Ltd.), Spiron Red BEH Special (produced by Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes, for example, p,p',p"-hexamethyltriaminotriphenyl methane (leuco Crystal Violet) and Pergascript Blue SRB (produced by Ciba Geigy).

Other preferable examples include leuco dyes which are known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide and 3-(4-diethylaminophenyl)-3-(1-ethyl-2-methylindol-3-yl) phthalide.

The amount of the compound capable of undergoing discoloration with an acid or a radical added is preferably from 0.01 to 15% by weight based on the total solid content of the photosensitive layer.

(Thermal Polymerization Inhibitor)

To the photosensitive layer, a small amount of a thermal polymerization inhibitor is preferably added in order to prevent the polymerizable compound from undergoing undesirable thermal polymerization during the production or preservation of the photosensitive layer.

Preferable examples of the thermal polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the photosensitive layer.

(Higher Fatty Acid Derivative)

In order to avoid polymerization inhibition due to oxygen, a higher fatty acid derivative, for example, behenic acid or behenic acid amide may be added to the photosensitive layer and localized on the surface of the photosensitive layer during the process of drying after coating. The amount of the higher fatty acid derivative added is preferably from about 0.1 to about 10% by weight based on the total solid content of the photosensitive layer.

(Plasticizer)

The photosensitive layer may contain a plasticizer. Preferable examples of the plasticizer include a phthalic acid ester, for example, dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate or diallyl phthalate, a glycol ester, for example, dimethyl glycol phthalate, ethyl phthalylethyl glycolate, methyl phthalylethyl glycolate, butyl phthalylbutyl glycolate or triethylene glycol dicaprylic acid ester, a phosphoric acid ester, for example, tricresyl phosphate or triphenyl phosphate, an aliphatic dibasic acid ester, for example, diisobutyl adipate, dioctyl adipate, dimethyl sebacate, dibutyl sebacate, dioctyl azelate or dibutyl maleate, polyglycidyl methacrylate, triethyl citrate, glycerin triacetyl ester and butyl laurate. The content of the plasticizer is preferably about 30% by weight or less based on the total solid content of the photosensitive layer.

(Fine Inorganic Particle)

The photosensitive layer may contain fine inorganic particle in order to increase strength of the cured layer in the image area. The fine inorganic particle preferably includes, for example, silica, alumina, magnesium oxide, titanium oxide, magnesium carbonate, calcium alginate and a mixture thereof. Even if the fine inorganic particle has no light-to-heat converting property, it can be used, for example, for strengthening the film or enhancing interface adhesion property due to surface roughening. The average particle size of the fine inorganic particle is preferably from 5 nm to 10 μm, and more preferably from 0.5 to 3 μm. In the above-described range, the fine inorganic particle is stably dispersed in the photosensitive layer, film strength of the photosensitive layer is sufficiently retained and the non-image area excellent in hydrophilicity to hardly occur stain at the printing is formed.

The fine inorganic particle is easily available as a commercial product, for example, colloidal silica dispersion.

The content of the fine inorganic particle is preferably 20% by weight or less, more preferably 10% by weight or less, based on the total solid content of the photosensitive layer.

(Hydrophilic Low Molecular Weight Compound)

The photosensitive layer may contain a hydrophilic low molecular weight compound in order to improve the developing property. Examples of the hydrophilic low molecular weight compound include a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl amine hydrochloride.

(Formation of Photosensitive Layer)

Several embodiments can be employed in order to form the photosensitive layer. One embodiment is a method of dissolving or dispersing the constituting components of photosensitive layer in an appropriate solvent followed by coating. The solvent used include, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

Another embodiment is a method of encapsulating a part or all of the constituting components of photosensitive layer into microcapsule to incorporate into the photosensitive layer as described, for example, in JP-A-2001-277740 and JP-A-2001-277742. In the embodiment, it is possible that each constituting component is present in or outside the micro capsule in an appropriate ratio.

As a method for microencapsulation of the constituting component of photosensitive layer, known methods can be used. Methods of producing the microcapsule include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinkage and has a solvent-swellable property. From this point of view, a preferable wall material of the microcapsule includes polyurea, polyurethane, polyester, polycarbonate, polyamide and a mixture thereof, and polyurea and polyurethane are particularly preferred. Further, a compound having a crosslinkable functional group, for example, an ethylenically unsaturated bond may be introduced into the microcapsule wall.

The average particle size of the microcapsule is preferably from 0.01 to 3.0 μm, more preferably from 0.05 to 2.0 μm, still more preferably from 0.10 to 1.0 μm from the standpoint of resolution and preservation stability.

The solid concentration of the coating solution for photosensitive layer is preferably from 1 to 50% by weight.

The photosensitive layer may also be formed by preparing plural coating solutions by dispersing or dissolving the same or different constituting components into the same or different solvents and conducting repeatedly the coating and drying plural times.

The coating amount (solid content) of the photosensitive layer may be varied according to the use, but ordinarily, it is preferably from 0.3 to 3.0 g/m² in view of good sensitivity, good film property of the photosensitive layer and the like.

Various methods can be used for the coating of the photosensitive layer. Examples of the coating method include bar coater coating, spin coating, spray coating, curtain coating, dip coating, air knife coating, blade coating and roll coating.

[Support]

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero element and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Since completely pure aluminum is difficult to be produced in view of the refining technique, an aluminum alloy plate containing a slight amount of hetero element is preferably used. The composition of the aluminum plate is not limited and those materials known and used conventionally can be appropriately utilized. The thickness of the aluminum plate is preferably from 0.1 to 0.6 mm, more preferably from 0.15 to 0.4 mm, and still more preferably from 0.2 to 0.3 mm.

The aluminum plate is preferably subjected to a surface treatment, for example, roughening treatment or anodizing treatment. The surface treatment facilitates improvement in the hydrophilic property and ensures the adhesion property between the photosensitive layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively). As the method of the mechanical roughening treatment, a known method, for example, a ball graining method, a brush graining method, a blast graining method or a buff graining method can be used. The electrochemical roughening treatment method includes, for example, a method of conducting it by passing alternating current or direct current in an electrolytic solution containing an acid, for example, hydrochloric acid or nitric acid. Also, a method of using a nixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

For the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm², voltage is from 1 to 100 V, and electrolysis time is from 10 seconds to 5 minutes. The amount of the anodized film formed is preferably from 1.0 to 5.0 g/m², more preferably from 1.5 to 4.0 g/m², from the standpoint of good printing durability, good scratch resistance in the non-image area and the like.

The aluminum plate subjected to the surface treatment and having the anodized film as described above is used as it is as the support. However, in order to more improve the adhesion property to a layer provided thereon, hydrophilicity, resistance to stain, heat insulating property or the like, a known treatment method, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted.

As the sealing treatment, a sealing treatment with water vapor, a sealing treatment with an aqueous solution containing an inorganic fluorine compound, for example, fluorozirconic acid alone or sodium fluoride, a sealing treatment with steam having lithium chloride added thereto or a sealing treatment with hot water may be employed. Among them, the sealing treatment with an aqueous solution containing an inorganic fluorine compound, the sealing treatment with water vapor and the sealing treatment with hot water are preferred.

The hydrophilizing treatment includes an alkali metal silicate method described in U.S. Pat. Nos. 2,714,066, 3,181,461, 3,280,734 and 3,902,734. According to the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461 and 4,689,272.

In the case of using a support having a surface of insufficient hydrophilicity, for example, a polyester film, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among them, the hydrophilic layer formed by coating a coating solution containing a colloid of oxide or hydroxide of silicon is preferred.

Further, in the case of using, for example, a polyester film as the support, it is preferred to provide an antistatic layer on the hydrophilic layer side, opposite side to the hydrophilic layer or both sides. When the antistatic layer is provided between the support and the hydrophilic layer, it also contributes to improve the adhesion property of the hydrophilic layer to the support. As the antistatic layer, for example, a polymer layer containing fine particles of metal oxide or a matting agent dispersed therein described in JP-A-2002-79772 can be used.

The center line average roughness of support is preferably from 0.10 to 1.2 μm from the standpoint of good adhesion property to the photosensitive layer, good printing durability, good resistance to stain and the like. The color density of the support is preferably from 0.15 to 0.65 in terms of the reflection density value from the standpoint of good image-forming property by preventing halation at the image exposure, good aptitude for plate inspection after development and the like.
(Backcoat Layer)

After applying the surface treatment to the support or forming the intermediate layer on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.
(Protective Layer)

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \leq (A) \leq 20$ (ml/m²·day). When the oxygen permeability (A) is extremely lower than 1.0 (ml/m²·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m²·day), decrease in sensitivity may be incurred. The oxygen permeability (A) is more preferably in a range of $1.5 \leq (A) \leq 12$ (ml/m²·day), stiff more preferably in a range of $2.0 \leq (A) \leq 10.0$ (ml/m²·day). Besides the above described oxygen permeability, as for the characteristics required of the protective layer, it is desired that the protective layer does not substantially hinder the transmission of light for the exposure, is excellent in the adhesion property to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics of the protective layer, for example, oxygen-blocking property and removability by development.

Polyvinyl alcohol for use in the protective layer may be partially substituted with an ester, ether or acetal as long as it contains unsubstituted vinyl alcohol units for achieving the necessary oxygen-blocking property and water solubility. Also, a part of polyvinyl alcohol may have other copolymer component. As specific examples of the polyvinyl alcohol, polyvinyl alcohols having a hydrolysis degree of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer chain a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, more preferably from 15 to 30% by weight, in the protective layer.

The components of the protective layer (selection of PVA and use of additives) and the coating amount are determined taking into consideration fog-preventing property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the polymer compound, for example, polyvinyl alcohol (PVA) is ordinarily from 2,000 to 10,000,000, preferably from 20,000 to 3,000,000.

As other composition of the protective layer, glycerin, dipropylene glycol or the like can be added in an amount of several % by weight of the polymer compound to provide flexibility. Further, an anionic surfactant, for example, sodium alkylsulfate or sodium alkylsulfonate, an amphoteric surfactant, for example, alkylaminocarboxylate or alkylaminodicarboxylate, or a nonionic surfactant, for example, polyoxyethylene alkyl phenyl ether can be added in an amount of several % by weight of the polymer compound.

The adhesion property of the protective layer to the photosensitive layer and scratch resistance are also extremely important in view of handling of the lithographic printing plate precursor. Specifically, when a hydrophilic layer comprising a water-soluble polymer is laminated on the oleophilic photosensitive layer, layer peeling due to an insufficient adhesion property is liable to occur, and the peeled portion causes such a defect as failure in curing of the photosensitive layer due to polymerization inhibition by oxygen. Various proposals have been made for improving the adhesion property between the photosensitive layer and the protective layer. For example, it is described in U.S. patent application Ser. Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on a photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer.

The inorganic stratiform compound used here is a particle having a thin tabular shape and includes, for instance, mica, for example, natural mica represented by the following formula: $A(B, C)_{2-5} D_4 O_{10} (OH, F, O)_2$, (wherein A represents any one of K, Na and Ca, B and C each represents any one of Fe (II), Fe(III), Mn, Al, Mg and V, and D represents Si or Al) or synthetic mica, talc represented by the following formula: $3MgO.4SiO.H_2O$, teniolite, montmorillonite, saponite, hectoliter, and zirconium phosphate.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}(Si_4O_{10})F_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and in order to compensate it, a cation, for example, $Na^+$, $Ca^{2+}$ or $Mg^{2+}$ is adsorbed between the lattice layers. The cation existing between the lattice layers is referred to as an exchangeable cation and is exchangeable with various cations. In particular, in the case where the cation between the lattice layers is Li+ or $Na^+$, because of a small ionic radius, a bond between the stratiform crystal lattices is week, and the inorganic stratiform compound greatly swells upon contact with water. When share is applied under such conditions, the stratiform crystal lattices are easily cleaved to form a stable sol in water. The bentnite and swellable synthetic mica have strongly such tendency and are useful in the invention. Particularly, the swellable synthetic mica is preferably used.

With respect to the shape of the inorganic stratiform compound for use in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, particularly preferably 200 or more. The aspect ratio is a ratio of major axis to thickness of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm preferably from 0.5 to 10 μm, particularly preferably from 1 to 5 μm. An average thickness of the particle is ordinarily 0.1 μm or less, preferably 0.05 μm or less, particularly preferably 0.01 μm or less. For example, in the swellable synthetic mica that is the representative compound of the inorganic stratiform compounds, thickness is approximately from 1 to 50 nm and plain size is approximately from 1 to 20 μm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/100 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferable inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added a known additive, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added a known additive for increasing adhesion property to the photosensitive layer or for improving preservation stability of the coating solution.

The coating solution for protective layer thus-prepared is coated on the photosensitive layer and dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

The coating amount of the protective layer is preferably in a range of 0.05 to 10 $g/m^2$ in terms of the coating amount after drying. When the protective layer contains the inorganic stratiform compound, it is more preferably in a range of 0.1 to 5 $g/m^2$, and when the protective layer does not contain the inorganic stratiform compound, it is more preferably in a range of 0.5 to 5 $g/m^2$.

[Method of Preparing Lithographic Printing Plate]

The preparation of lithographic printing plate according to the invention is performed by exposing imagewise the lithographic printing plate precursor according to the invention and removing the non-image area of the photosensitive layer with a developer having pH of 2 to 10.

(Exposure)

The lithographic printing plate precursor according to the invention is preferably exposed imagewise with a laser having an oscillation wavelength of 350 to 1,200 nm.

A semiconductor laser of 405 nm or 830 nm, an FD-YAG laser or the like is used as the laser light source. In recent years, a CTP system equipped with a semiconductor laser of 405 nm has become widespread in view of system cost and handling properties. For instance, the lithographic printing plate precursor is loaded in the inner drum exposure apparatus equipped with a light source having an oscillation wavelength in a range of 350 to 450 nm (wherein a light beam emitted from the light source is parallel divided into an ordinary beam and an extraordinary beam in an equal amount and these two beam spots are adjacently aligned with a partial overlap in the sub-scanning direction to form a spot shape of light beam) and is subjected to exposure with the spot shape of light beam to perform image recording.

Also, an infrared laser can be used as the laser light source. The infrared laser used is not particularly restricted and preferably includes a solid laser or semiconductor laser emitting an infrared ray having a wavelength of 760 to 1,200 nm. The output of the infrared laser is preferably 100 mW or more. Further, in order to shorten the exposure time, it is preferred to use a multibeam laser device. The exposure time is preferably 20 microseconds per pixel or less. The irradiation energy is preferably from 10 to 300 $mJ/cm^2$.

The exposure apparatus for use in the invention may be any of an internal drum system, an external drum system and a flat bed system. Further, the highly accurate image can be recorded at high speed by simultaneously recording the image using a multibeam exposure system.

The image-recording can be performed using an FM screen at the exposure of lithographic printing plate precursor according to the invention.

(Development Processing)

After the imagewise exposure, the lithographic printing plate precursor is subjected to the development processing. The development processing ordinarily includes (1) a method of developing with an alkali developer (having pH higher than 10), (2) a method of developing with a developer having pH of 2 to 10, and (3) a method (on-press development) of developing by supplying dampening water and/or ink on a printing machine. In the invention, the method of developing with a developer having pH of 2 to 10 is preferably used.

In the lithographic printing plate precursor according to the invention, a protective layer and the non-image area of photosensitive layer are together removed with the developer having pH of 2 to 10 and the resulting lithographic printing plate is instantly mounted on a printing machine to conduct printing. According to a conventional developing process using an alkali developer as the method (1), a protective layer is removed in a pre-water washing step, the alkali development is conducted, the alkali is removed in a post-water washing step, gum treatment is conducted in a gumming step and drying is conducted in a drying step. On the contrary, according to the invention the development and gumming are preferably conducted at the same time using a developer containing a water-soluble polymer compound. Therefore, the post-water washing step is not particularly necessary, and after conducting the development and gumming with one solution, the drying step can be performed. Moreover, since the removal of protective layer can also be conducted simultaneously with the development and gumming, the pre-water washing step is also unnecessary. It is preferred that after the development and gumming, the excess developer is removed using a squeeze roller, followed by drying. The development of the lithographic printing plate precursor according to the invention is performed, for example, by immersing the imagewise exposed lithographic printing plate precursor in a developer and rubbing with a brush.

The processing by the automatic processor in such a manner is advantageous in view of being free from the measures against development scum resulting from the protective layer and photosensitive layer encountered in case of performing on-press development.

The developer for use in the invention is an aqueous solution having pH of 2 to 10. For instance, the developer is preferably water alone or an aqueous solution containing water as a main component (containing 60% by weight or more of water). Particularly, an aqueous solution having the same composition as conventionally known dampening water, an aqueous solution containing a surfactant (for example, an anionic, nonionic, cationic or amphoteric surfactant) or an aqueous solution containing a water-soluble polymer compound is preferable. An aqueous solution containing both a surfactant and a water-soluble polymer compound is especially preferable. The pH of the developer is preferably from 3 to 8, and more preferably from 4 to 7.

The anionic surfactant for use in the developer includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, dialkylsulfosuccinic acid salts, alkyl sulfate ester salts and alkylnaphthalenesulfonic acid salts are particularly preferably used.

The cationic surfactant for use in the developer is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant for use in the developer includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher alkylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

Ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferable.

Further, from the standpoint of stable solubility in water or opacity, with respect to the nonionic surfactant used in the developer, the HLB (hydrophile-lipophile balance) value thereof is preferably 6 or more, more preferably 8 or more.

Furthermore, an oxyethylene adduct of acetylene glycol type or acetylene alcohol type or a surfactant, for example, a fluorine-based surfactant or a silicon-based surfactant can also be used.

The amphoteric surfactant for use in the developer includes, for example, 2-alkylimidazoline derivatives, alkyl aminoacetates, alkyl iminodiacetates, alkyl aminopropionates, alkyl iminodipropionates, alkyl dimethyl ammonio acetates, alkylamidopropyl dimethyl ammonio acetates, alkyl sulfobetaines, alkyl diaminoethyl glycine salts and alkyl phosphobetaines. In the invention, alkyl aminoacetates, alkyl iminodiacetates, alkyl aminopropionates, alkyl iminodipropionates, alkyl dimethyl ammonio acetates and alkylamidopropyl dimethyl ammonio acetates are preferable, and alkyl dimethyl ammonio acetates and alkylamidopropyl dimethyl ammonio acetates are more preferable.

Of the surfactants used in the developer, the nonionic surfactant is particularly preferable in view of foam inhibition property.

The surfactants may be used individually or as a mixture of two or more thereof. The content of the surfactant in the developer is preferably from 0.01 to 20% by weight, more preferably from 0.01 to 10% by weight.

The water-soluble polymer compound for use in the developer includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity in a range from 10 to 100 mPa/sec in a 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound in the developer is preferably from 0.1 to 20% by weight, more preferably from 0.5 to 10% by weight.

The developer may contain an organic solvent. The organic solvent include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (e.g., methylene dichloride, ethylene dichloride, trichlene or monochlorobenzene) and a polar solvent.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methyl amyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

When the organic solvent is insoluble in water, it may be employed by being solubilized in water using a surfactant or the like. In the case where the developer contains the organic solvent, the concentration of the organic solvent is desirably less than 40% by weight in view of safety and inflammability.

Into the developer, an antiseptic agent, a chelating agent, a defoaming agent, an organic acid, an inorganic acid, an inorganic salt or the like can be incorporated in addition to the above components.

As the antiseptic agent, for example, phenol or a derivative thereof, formalin, an imidazole derivative, sodium dehydroacetate, a 4-isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the chelating agent, for example, ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof; organic phosphonic acids, for example, 1-hydroxyethane-1,1-diphosphonic acid, potassium salt thereof, sodium salt thereof; aminotri(methylenephosphonic acid), potassium salt thereof, sodium salt thereof; and phosphonoalkanetricarboxylic acids are illustrated. A salt of an organic amine is also effectively used in place of the sodium salt or potassium salt in the chelating agents described above.

As the defoaming agent, for example, a conventional silicone-based self-emulsifying type or emulsifying type defoaming agent and a nonionic surfactant having HLB of 5 or less are used. The silicone defoaming agent is preferably used. Any of emulsifying dispersing type and solubilizing type can be used.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid are illustrated. The organic acid can also be used in the form of an alkali metal salt or an ammonium salt.

As the inorganic acid and inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate are illustrated.

The developer can be used at an appropriate temperature, and is preferably used at 10 to 50° C.

The developer described above can be used as a developer and a development replenisher for the exposed lithographic printing plate precursor and it is preferably applied to an automatic processor described hereinafter. In the case of conducting the development processing using the automatic processor, the developer becomes fatigued in accordance with the processing amount, and hence the processing ability may be restored using a replenisher or a fresh developer. Such a replenishment system can be preferably applied to the plate making method of the lithographic printing plate precursor according to the invention.

The development processing using the aqueous solution having pH of 2 to 10 according to the invention is preferably performed by an automatic processor equipped with a supplying means for a developer and a rubbing member. As the automatic processor, there are illustrated an automatic processor in which a lithographic printing plate precursor after image recording is subjected to a rubbing treatment while it is transporting described in JP-A-2-220061 and JP-A-60-59351, and an automatic processor in which a lithographic printing plate precursor after image recording placed on a cylinder is subjected to a rubbing treatment while rotating the cylinder described in U.S. Pat. Nos. 5,148,746 and 5,568,768 and British Patent 2,297,719. Among them, an automatic processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl (meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used. The outer diameter of the rotating brush roller is preferably from 30 to 200 mm, and the peripheral velocity at the tip of the brush rubbing the plate surface is preferably from 0.1 to 5 m/sec. It is preferred to use a plurality, that is, two or more of the rotating brush rollers.

The rotary direction of the rotating brush roller may be the same direction or the opposite direction with respect to the transporting direction of the lithographic printing plate precursor, but when two or more rotating brush rollers are used in an automatic processor as shown in FIG. 4, it is preferred that at least one rotating brush roller rotates in the same direction and at least one rotating brush roller rotates in the opposite direction with respect to the transporting direction. By such an arrangement, the photosensitive layer in the non-image area can be more steadily removed. Further, a technique of rocking the rotating brush roller in the rotation axis direction of the brush roller is also effective.

In the invention, the lithographic printing plate after the development processing may be subsequently subjected to water washing, a drying treatment and an oil-desensitization treatment, if desired. In the oil-desensitization treatment, a known oil-desensitizing solution can be used.

In the method of preparing a lithographic printing plate from the lithographic printing plate precursor according to the invention, the entire surface of the lithographic printing plate precursor may be heated, if desired, before or during the exposure or between the exposure and the development. By the heating, the image-forming reaction in the photosensitive layer is accelerated and advantages, for example, improvements in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that the non-image area is also fogged. On the other hand, the heating after the development can be performed using very strong conditions. Ordinarily, the heat treatment is carried out in a temperature range of 200 to 500° C. When the temperature is too low, a sufficient effect of strengthening the image may not be obtained, whereas when it is excessively high, problems of deterioration of the support and thermal decomposition of the image area may occur in some cases.

In the invention, although the development processing can be carried out just after the exposure step, the heat treatment step may intervene between the exposure step and the development step as described above. The heat treatment is effective for increasing the printing durability and improving uniformity of the image curing degree in the entire surface of lithographic printing plate precursor. The conditions of the heat treatment can be appropriately determined in a range for providing such effects. Examples of the heating means include a conventional convection oven, an IR irradiation apparatus, an IR laser, a microwave apparatus or a Wisconsin oven. Specifically, the heat treatment can be conducted by maintaining the lithographic printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the above-described range, the effects described above are efficiently achieved and an adverse affect, for example, change in shape of the lithographic printing plate precursor due to the heat can be preferably avoided.

According to the invention, the development processing step is conducted after the exposure step, preferably after the exposure step and the heat treatment step to prepare a lithographic printing plate. It is preferable that a plate setter used in the image exposure step, a heat treatment means used in the heat treatment step and a development apparatus used in the development processing step are connected with each other and the lithographic printing plate precursor is subjected to automatically continuous processing. Specifically, a plate making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate making line is blinded by a filter, a cover or the like.

After the image formation, the entire surface of lithographic printing plate may be exposed to active ray, for example, ultraviolet light to accelerate curing of the image area. As a light source for the entire surface exposure, for example, a carbon arc lamp, a mercury lamp, a gallium lamp, a metal halide lamp, a xenon lamp, a tungsten lamp or various laser beams are exemplified. In order to obtain sufficient printing durability, the amount of the entire surface exposure is preferably 10 mJ/cm$^2$ or more, more preferably 100 mJ/cm$^2$ or more.

Heating may be performed at the same time with the entire surface exposure. By performing the heating, further improvement in the printing durability is recognized. Examples of the heating means include a conventional convection oven, an IR irradiation apparatus, an IR laser, a microwave apparatus or a Wisconsin oven. The plate surface temperature at the heating is preferably from 30 to 150° C., more preferably from 35 to 130° C., and still more preferably from 40 to 120° C.

EXAMPLES

The present invention will be described in more detail with reference to the following examples, but the invention should not be construed as being limited thereto.

Examples 1 to 10 and Comparative Example 1

[Preparation of Lithographic Printing Plate Precursor 1]
(Preparation of Support)

An aluminum plate (material: JIS A1050) having a thickness of 0.3 mm was subjected to a degrease treatment with an aqueous 10% by weight sodium aluminate solution at 50° C. for 30 seconds in order to remove rolling oil on the surface thereof. Thereafter, the aluminum plate surface was grained using three nylon brushes implanted with bundled bristles having a diameter of 0.3 mm and an aqueous suspension (specific gravity: 1.1 g/cm$^3$) of pumice having a median diameter of 25 μm, and then thoroughly washed with water. The plate was etched by immersing it in an aqueous 25% by weight sodium hydroxide solution at 45° C. for 9 seconds and after washing with water, immersed in an aqueous 20% by weight nitric acid solution at 60° C. for 20 seconds, followed by washing with water. The etching amount of the grained surface was about 3 g/m$^2$.

Subsequently, the aluminum plate was subjected to a continuous electrochemical surface roughening treatment using alternate current voltage of 60 Hz. The electrolytic solution used was an aqueous 1% by weight nitric acid solution (containing 0.5% by weight of aluminum ion) at a liquid temperature of 50° C. The electrochemical surface roughening treatment was performed using a rectangular wave alternate current having a trapezoidal waveform such that the time TP necessary for the current value to reach the peak from zero was 0.8 msec and the duty ratio was 1:1, and disposing a carbon electrode as the counter electrode. The auxiliary anode used was a ferrite. The current density was 30 A/dm$^2$ in terms of the peak value of current, and 5% of the current flowing from the power source was divided to the auxiliary anode. The quantity of electricity at the nitric acid electrolysis was 175 C/dm$^2$ when the aluminum plate was serving as the anode. Then, the aluminum plate was washed with water by spraying.

Then, the aluminum plate was subjected to an electrochemical surface roughening treatment in the same manner as in the nitric acid electrolysis above using, as the electrolytic solution, an aqueous 0.5% by weight hydrochloric acid solution (containing 0.5% by weight of aluminum ion) at a liquid temperature of 50° C. under the conditions that the quantity of electricity was 50 C/dm$^2$ when the aluminum plate was serving as the anode, and then washed with water by spraying. The plate was then treated in an aqueous 15% by weight sulfuric acid solution (containing 0.5% by weight of aluminum ion) as the electrolytic solution at a current density of 15 A/dm$^2$ to provide a direct current anodic oxide film of 2.5 g/m$^2$, thereafter washed with water and dried. The center line average roughness (Ra) of the surface of aluminum support thus-obtained was measured using a stylus having a diameter of 2 μm and found to be 0.51 μm.

(Formation of Intermediate Layer)

Coating solution (1) for intermediate layer having the composition shown below was coated using a bar on the support described above and dried in an oven at 80° C. for 10 seconds to form an intermediate layer having a dry coating amount of 10 mg/m$^2$.

<Coating Solution (1) for Intermediate Layer>

| | |
|---|---|
| Polymer A-1 described hereinbefore | 0.017 g |
| Methanol | 9.00 g |
| Water | 1.00 g |

(Formation of Photosensitive Layer and Protective Layer)

On the intermediate layer described above, Coating solution (1) for photosensitive layer having the composition shown below was coated using a bar and dried in an oven at 70° C. for 60 seconds to form a photosensitive layer having a dry coating amount of 1.1 g/m². On the photosensitive layer, Coating solution (1) for protective layer having the composition shown below was coated using a bar so as to have a dry coating amount of 0.75 g/m² and dried at 125° C. for 70 seconds to form a protective layer, thereby preparing Lithographic Printing Plate Precursor 1.

<Coating Solution (1) for Photosensitive Layer>

| | |
|---|---|
| Binder Polymer (1) shown below (average molecular weight: 80,000; acid value: 0 meq/g) | 0.48 g |
| Polymerizable Compound (1) Dipentaerythritol pentaacrylate (SR39, produced by Nippon Kayaku Co., Ltd.) | 0.54 g |
| Sensitizing Dye (1) shown below | 0.06 g |
| Polymerization Initiator (1) shown below | 0.08 g |
| Co-Sensitizer (1) shown below | 0.07 g |
| Dispersion of ε-phthalocyanine pigment [pigment: 15 parts by weight; dispersing agent (Binder Polymer (1)): 10 parts by weight; solvent: (cyclohexanone/methoxypropyl acetate/1-methoxy-2-propanol = 15 parts by weight/20 parts by weight/40 parts by weight)] | 0.40 g |
| Thermal polymerization inhibitor N-nitrosophenylhydroxylamine aluminum salt | 0.01 g |
| Fluorine-Based Surfactant (1) shown below | 0.001 g |
| Polyoxyethylene-polyoxypropylene condensate (Pluronic L44, produced by ADEKA Corp.) | 0.04 g |
| Tetraethylamine hydrochloride | 0.01 g |
| 1-Methoxy-2-propanol | 3.5 g |
| Methyl ethyl ketone | 8.0 g |

Binder Polymer (1):

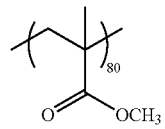

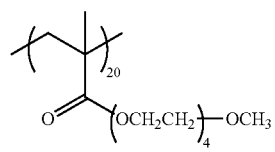

Sensitizing Dye (1):

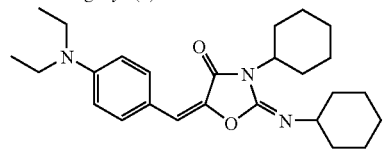

Polymerization Initiator (1):

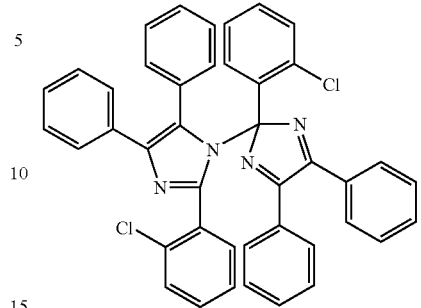

Co-Sensitizer (1):

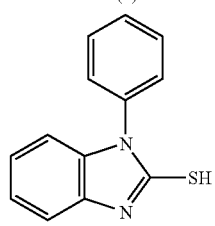

Fluorine-Based Surfactant (1):

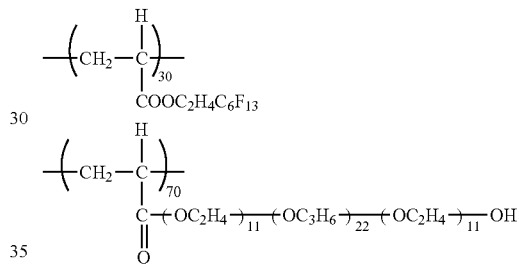

<Coating Solution (1) for Protective Layer>

| | |
|---|---|
| Polyvinyl alcohol (saponification degree: 98% by mole; polymerization degree: 500) | 40 g |
| Polyvinyl pyrrolidone (molecular weight: 50,000) | 5 g |
| Vinyl pyrrolidone/vinyl acetate (1/1) copolymer (molecular weight: 70,000) | 0.5 g |
| Surfactant (Emalex 710, produced by Nihon-Emulsion Co., Ltd.) | 0.5 g |
| Water | 950 g |

[Preparation of Lithographic Printing Plate Precursors 2 to 10 and Comparative Lithographic Printing Plate Precursor 1]

Lithographic Printing Plate Precursors 2 to 10 and Comparative Lithographic Printing Plate Precursor 1 were prepared in the same manner as Lithographic Printing Plate Precursor 1 except for changing the components used to those described in Table 1 below, respectively.

Binder Polymer (2)

Polyvinyl alcohol (molecular weight: 50,000; saponification degree: 55%)

Binder Polymer (3)

Polyvinyl butyral (molecular weight: 80,000; butyral ratio: 65% by mole; acetate ratio: less than 1% by mole)

Binder Polymer (4)

Methacrylic acid/methyl methacrylate copolymer (molecular weight: 40,000; molar ratio: 30/70)

Binder Polymer (5):
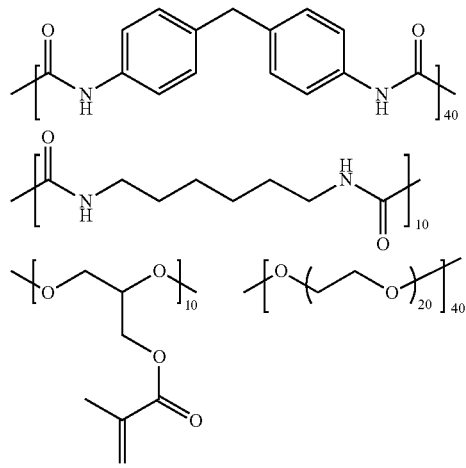
(molecular weight: 50,000)
Polymerizable Compound (2)
Isocyanuric acid EO modified triacrylate (Aronix M-315, produced by Toagosei Co., Ltd.)
Polymerizable Compound (3):
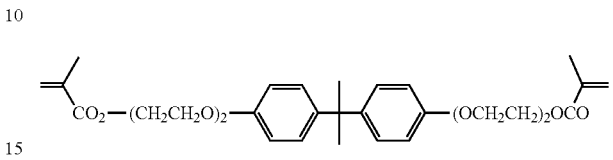
Polymerizable Compound (4):
A mixture of compounds shown below:
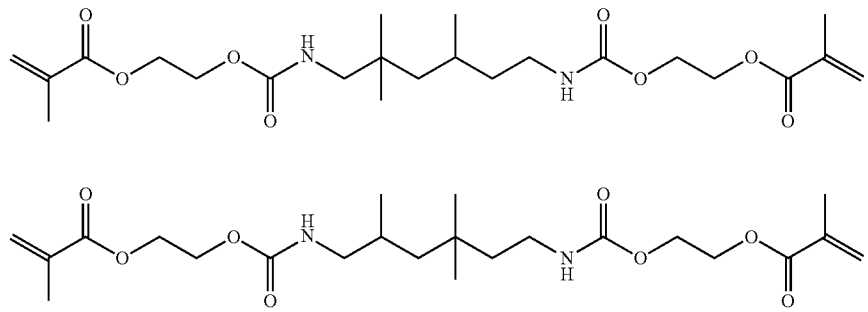
Sensitizing Dye (2):
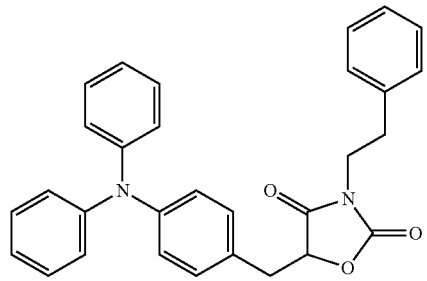
Sensitizing Dye (3):
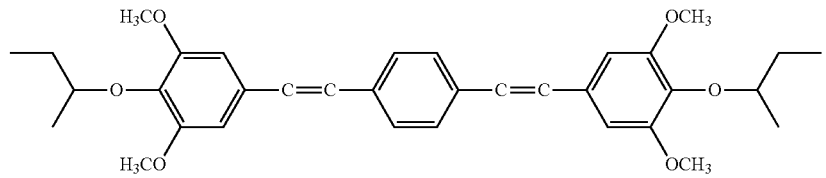

Polymerization Initiator (2):

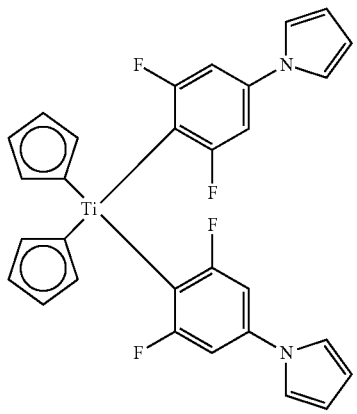

Co-Sensitizer (2):

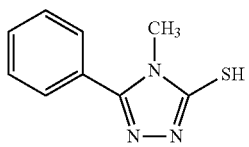

Co-Sensitizer (3):

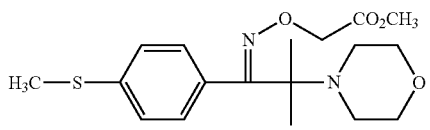

Co-Sensitizer (4):

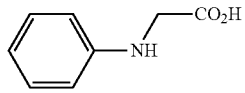

Comparative Polymer (1):

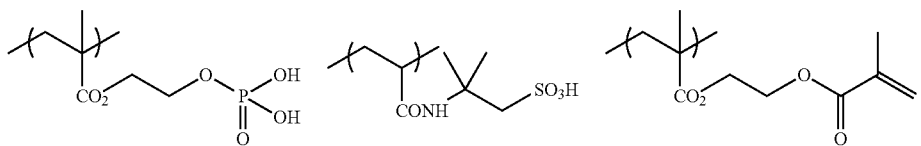

Composition ratio (% by mole): 15/80/5 in a left-to-right order
Weight average molecular weight: 80,000

[Exposure, Development and Printing]

Each of Lithographic Printing Plate Precursors 1 to 10 and Comparative Lithographic Printing Plate Precursor 1 was subjected to image exposure by Violet semiconductor laser plate setter Vx9600 (equipped with InGaN semiconductor laser; emission: 405 nm±10 nm/output: 30 mW) produced by FUJIFILM Electronic Imaging, Ltd. As for the image, halftone dots of 50% were drawn using an FM screen (TAFFETA 20, produced by Fuji Film Co., Ltd.) in a plate surface exposure amount of 0.05 mJ/cm$^2$ and at resolution of 2,438 dpi.

Then, the exposed lithographic printing plate precursor was subjected to development processing in an automatic development processor having a structure shown in FIG. 1 using Developer 1 having the composition shown below to prepare a lithographic printing plate (without heating). The pH of the developer was 4.6. The automatic development processor had two rotating brush rollers. As for the rotating brush rollers, the first brush roller was a brush roller having an outer diameter of 90 mm and being implanted with fiber of polybutylene terephthalate (bristle diameter: 200 μm, bristle length: 17 mm), and the brush roller was rotated at 200 rpm (peripheral velocity at the tip of brush: 0.94 m/sec) in the same direction as the transporting direction of the lithographic printing plate precursor. The second brush roller was a brush roller having an outer diameter of 60 mm and being implanted with fiber of polybutylene terephthalate (bristle diameter: 200 μm, bristle length: 17 mm), and the brush roller was rotated at 200 rpm (peripheral velocity at the tip of brush: 0.63 m/sec) in the opposite direction to the transporting direction of the lithographic printing plate precursor. The transportation of the lithographic printing plate precursor was performed at the transporting speed which allows the immersion time into the developer (developing time) to be 20 seconds.

The developer was supplied on the surface of the lithographic printing plate precursor by showering from a spray pipe using a circulation pump. The tank volume for the developer was 10 liters.

<Developer 1>

| | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Gum arabic | 1.00 g |
| Ethylene glycol | 0.50 g |
| Ammonium primary phosphate | 0.05 g |
| Citric acid | 0.05 g |
| Tetrasodium ethylenediaminetetraacetate | 0.05 g |

The lithographic printing plate thus-obtained was mounted on a printing machine, SOR-M, produced by Heidelberg, and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G (N) black ink (produced by Dai-Nippon Ink & Chemicals, Inc.).

[Evaluation]

Printing durability, stain resistance and stain resistance after preservation were evaluated in the following manner. The results obtained are shown in Table 1.

<Printing Durability>

As increase in the number of printing sheets according to the printing described above, the photosensitive layer was gradually abraded to cause decrease in the ink receptivity, resulting in decrease of ink density on a printed material. A number of printed materials obtained until the ink density (reflection density) decreased by 0.1 from that at the initiation of printing was determined to evaluate the printing durability. Specifically, the printing durability was relatively evaluated by calculating according to the formula shown below using the number of printing sheets (10,000 sheets) of Comparative Example 1 as the criterion (100). As the value increases, the printing durability becomes higher.

Printing durability=(Number of printed materials of subject lithographic printing plate)/(Number of printed materials of criterion lithographic printing plate)×100

<Stain Resistance>

The 500th sheet of the printed material from the initiation of printing was picked up and the density of ink adhered on the non-image area was measured to relatively evaluate the stain resistance. Specifically, the stain resistance was calculated according to the formula shown below using Comparative Example 1 as the criterion (100). As the value increases, the density of ink adhered on the non-image area decreases, that is, the stain resistance becomes better.

Stain resistance=(Ink density of non-image area on printed material of criterion lithographic printing plate)/(Ink density of non-image area on printed material of subject lithographic printing plate)×100

<Stain Resistance after Preservation>

The lithographic printing plate precursor was preserved at 60° C. for 3 days and then subjected to the exposure, development, printing and evaluation of stain resistance in the same manner as described above. As the criterion (100), the stain resistance of Comparative Example 1 without preservation was used.

TABLE 1

| | Coating Solution for Intermediate Layer Polymer for Intermediate Layer | Coating Solution for Photosensitive Layer | | | | | Stain Resistance | Stain Resistance after Preservation | Printing Durability |
|---|---|---|---|---|---|---|---|---|---|
| | | Binder Polymer | Polymerizable Compound | Sensitizing Dye | Polymerization Initiator | Co-Sensitizer | | | |
| Example 1 | A-1 | 1 | 1 | 1 | 1 | 1 | 700 | 600 | 140 |
| Example 2 | A-2 | 1 | 3 | 3 | 1 | 2 | 600 | 600 | 120 |
| Example 3 | A-3 | 2 | 2 | 2 | 2 | 3 | 700 | 600 | 120 |
| Example 4 | A-4 | 1 | 4 | 1 | 1 | 1 | 600 | 500 | 130 |
| Example 5 | A-5 | 1 | 3 | 1 | 1 | 4 | 800 | 800 | 120 |
| Example 6 | A-6 | 3 | 2 | 2 | 2 | 3 | 600 | 500 | 120 |
| Example 7 | A-7 | 1 | 4 | 1 | 1 | 2 | 500 | 600 | 120 |
| Example 8 | A-8 | 4 | 1 | 3 | 1 | 1 | 400 | 500 | 120 |
| Example 9 | A-9 | 1 | 4 | 2 | 2 | 3 | 600 | 600 | 130 |
| Example 10 | A-10 | 5 | 1 | 1 | 1 | 1 | 900 | 800 | 140 |
| Comparative Example 1 | Comparative Polymer (1) | 1 | 1 | 1 | 1 | 1 | 100 | 10 | 100 |

Examples 11 to 20 and Comparative Example 2

Each of Lithographic Printing Plate Precursors 1 to 10 and Comparative Lithographic Printing Plate Precursor 1 was subjected to the laser imagewise exposure in the same manner as in Example 1. Within 30 seconds after the laser imagewise exposure, the exposed lithographic printing plate precursor was put in an oven, heated the entire surface of the lithographic printing plate precursor by blowing hot air to maintain at 110° C. for 15 seconds and then subjected to the development processing within 30 seconds in the same manner as in Example 1 to prepare a lithographic printing plate (with heating). The resulting lithographic printing plate was subjected to the evaluation of printing durability, stain resistance and stain resistance after preservation in the same manner as in Example 1. The printing durability of Comparative Example 2 (without preservation) which was used as the criterion (100) was 15,000 sheets. The results obtained are shown in Table 2.

<Coating Solution (2) for Photosensitive Layer>

| | |
|---|---|
| Binder Polymer (6) shown below | 0.623 g |
| Polymerization Initiator (3) shown below | 0.155 g |
| Polymerizable Compound (5) shown below | 0.428 g |
| Sensitizing Dye (4) shown below | 0.038 g |
| Dispersion of copper phthalocyanine pigment | 0.159 g |
| Co-Sensitizer A: Co-Sensitizer (1) shown above | 0.015 g |
| Co-Sensitizer B: Co-Sensitizer (5) shown below | 0.081 g |
| Thermal polymerization inhibitor | 0.0012 g |
| N-nitrosophenyhydroxylamine aluminum salt | |
| Fluorine-based surfactant (Megafac F-176, produced by Dai-Nippon Ink & Chemicals, Inc. | 0.0081 g |
| Methyl ethyl ketone | 5.856 g |
| Methanol | 2.733 g |
| 1-Methoxy-2-propanol | 5.886 g |

(Formation of Protective Layer)

On the photosensitive layer described above, Coating solution (2) for protective layer having the composition shown below was coated using a bar so as to have a dry coating

TABLE 2

| | Coating Solution for Intermediate Layer Polymer for Intermediate Layer | Coating Solution for Photosensitive Layer | | | | | Stain Resistance | Stain Resistance after Preservation | Printing Durability |
|---|---|---|---|---|---|---|---|---|---|
| | | Binder Polymer | Polymerizable Compound | Sensitizing Dye | Polymerization Initiator | Co-Sensitizer | | | |
| Example 11 | A-1 | 1 | 1 | 1 | 1 | 1 | 700 | 500 | 120 |
| Example 12 | A-2 | 1 | 3 | 3 | 1 | 2 | 500 | 500 | 140 |
| Example 13 | A-3 | 2 | 2 | 2 | 2 | 3 | 700 | 600 | 130 |
| Example 14 | A-4 | 1 | 4 | 1 | 1 | 1 | 700 | 600 | 130 |
| Example 15 | A-5 | 1 | 3 | 1 | 1 | 4 | 500 | 600 | 130 |
| Example 16 | A-6 | 3 | 2 | 2 | 2 | 3 | 700 | 600 | 130 |
| Example 17 | A-7 | 1 | 4 | 1 | 1 | 2 | 600 | 600 | 120 |
| Example 18 | A-8 | 4 | 1 | 3 | 1 | 1 | 500 | 600 | 130 |
| Example 19 | A-9 | 1 | 4 | 2 | 2 | 3 | 400 | 500 | 150 |
| Example 20 | A-10 | 5 | 1 | 1 | 1 | 1 | 800 | 800 | 140 |
| Comparative Example 2 | Comparative Polymer (1) | 1 | 1 | 1 | 1 | 1 | 100 | 10 | 100 |

Examples 21 to 30 and Comparative Example 3

[Preparation of Lithographic Printing Plate Precursor 11]

(Formation of Intermediate Layer)

Coating solution (2) for intermediate layer having the composition shown below was coated using a bar on the support used in the preparation of Lithographic Printing Plate Precursor 1 and dried at 100° C. for 10 seconds to form an intermediate layer. The coating amount was 10 mg/m².

<Coating Solution (2) for Intermediate Layer>

| | |
|---|---|
| Polymer A-1 described hereinbefore | 0.05 g |
| Methanol | 27 g |
| Ion-exchanged water | 3 g |

(Formation of Photosensitive Layer)

On the intermediate layer described above, Coating solution (2) for photosensitive layer having the composition shown below was coated using a wire bar so as to have a coating amount after drying of 0.9 g/m² and dried in a hot-air drying devise at 115° C. for 34 seconds to form a photosensitive layer.

amount of 1.2 g/m² and dried at 125° C. for 70 seconds to form a protective layer, thereby preparing Lithographic Printing Plate Precursor 11.

<Coating Solution 2 for Protective Layer>

| | |
|---|---|
| Dispersion (1) of Mica shown below | 13.00 g |
| Polyvinyl alcohol (saponification degree: 98% by mole; polymerization degree: 500) | 1.30 g |
| Sodium 2-ethylhexylsulfosuccinate | 0.20 g |
| Vinyl pyrrolidone/vinyl acetate (1/1) copolymer (molecular weight: 70,000) | 0.050 g |
| Surfactant (Emalex 710, produced by Nihon-Emulsion Co., Ltd.) | 0.050 g |
| Water | 133.00 g |

(Preparation of Dispersion (1) of Mica)

In 368 g of water was added 32 g of synthetic mica (Somasif ME-100, produced by CO-OP Chemical Co., Ltd.; aspect ratio: 1,000 or more) and the mixture was dispersed using a homogenizer until the average particle diameter (measured by a laser scattering method) became 0.5 μm to obtain Dispersion (1) of Mica.

[Preparation of Lithographic Printing Plate Precursors 12 to 20 and Comparative Lithographic Printing Plate Precursor 2]

Lithographic Printing Plate Precursors 12 to 20 and Comparative Lithographic Printing Plate Precursor 2 were prepared in the same manner as Lithographic Printing Plate Precursor 11 except for changing the components used to those described in Table 3 below, respectively.

Binder Polymer (6):

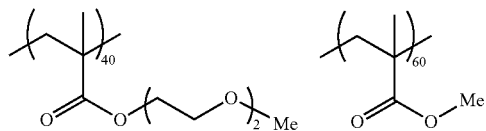

Polymerization Initiator (3):

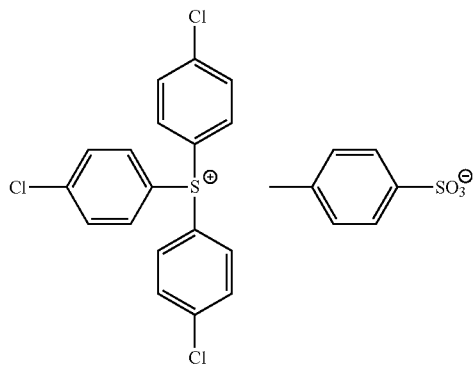

Polymerization Initiator (4):

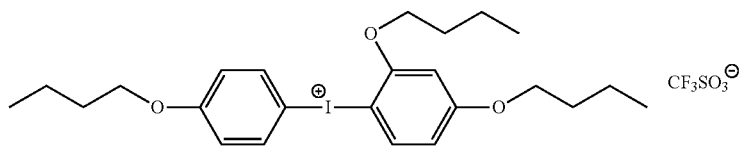

Polymerization Initiator (5):

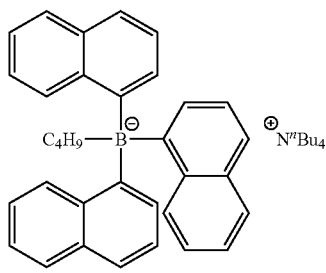

Polymerizable Compound (5):

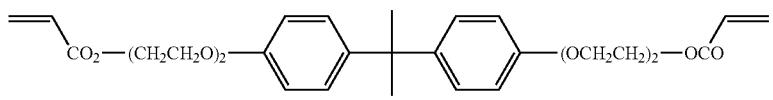

Sensitizing Dye (4):

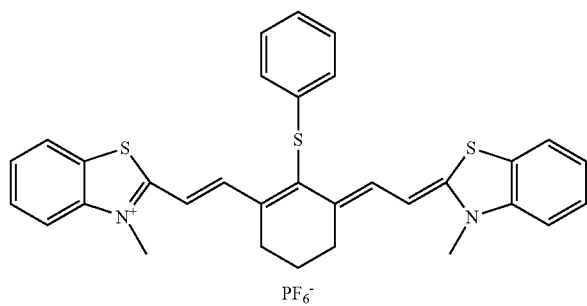

Sensitizing Dye (5):
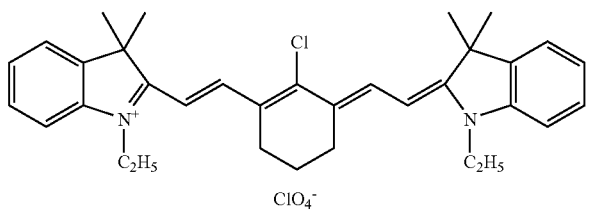
Sensitizing Dye (6):
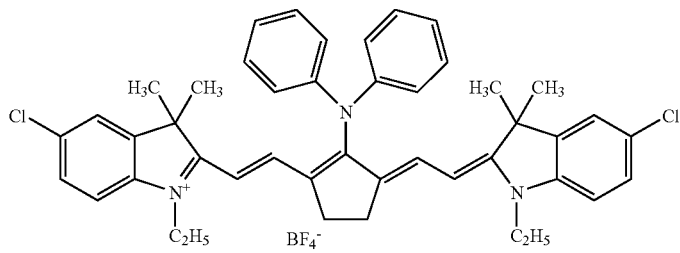
Sensitizing Dye (7):
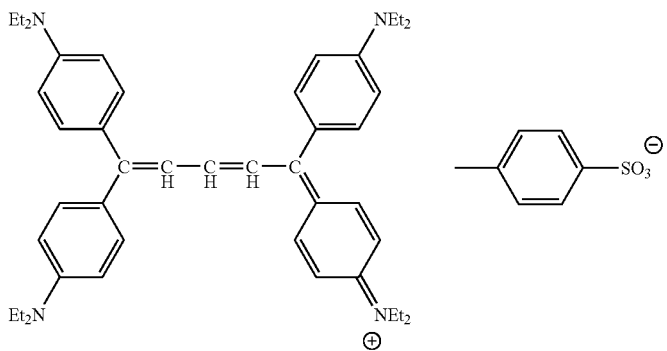
Co-Sensitizer (5):
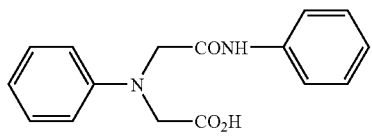
Co-Sensitizer (6):
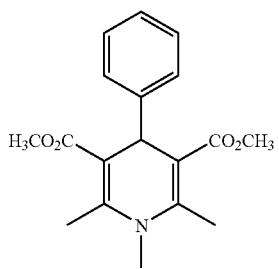

[Exposure, Development and Printing]

Each of Lithographic Printing Plate Precursors 11 to 20 and Comparative Lithographic Printing Plate Precursor 2 was exposed by Trendsetter 3244VX, produced by Creo Co., equipped with a water-cooled 40 W infrared semiconductor laser under the conditions of output of 9 W, a rotational number of an external drum of 210 rpm and resolution of 2,400 dpi.

Then, the development processing was performed in the same manner as in Example 1 except for changing the developer to Developer 2 shown below to prepare a lithographic printing plate (without heating).

<Developer 2>

| | |
|---|---|
| Water | 100.00 g |
| N-Lauryl dimethyl betaine | 10.00 g |
| (Pionin C157K, produced by Takemoto Oil & Fat Co., Ltd.) | |
| Polystyrenesulfonic acid | 1.00 g |
| Ammonium primary phosphate | 0.05 g |
| Citric acid | 0.05 g |
| Tetrasodium ethylenediaminetetraacetate | 0.05 g |
| (pH was adjusted to 5.0 with phosphoric acid) | |

[Evaluation]

The resulting lithographic printing plate was subjected to the evaluation of printing durability, stain resistance and stain resistance after preservation in the same manner as in Example 1. The printing durability of Comparative Example 3 (without preservation) which was used as the criterion (100) was 10,000 sheets. The results obtained are shown in Table 3.

TABLE 3

| | Coating Solution for Intermediate Layer Polymer for Intermediate Layer | Coating Solution for Photosensitive Layer | | | | | | Stain Resistance | Stain Resistance After Preservation | Printing Durability |
|---|---|---|---|---|---|---|---|---|---|---|
| | | Binder Polymer | Polymerizable Compound | Sensitizing Dye | Polymerization Initiator | Co-Sensitizer A | Co-Sensitizer B | | | |
| Example 21 | A-1 | 6 | 5 | 4 | 3 | 1 | 5 | 500 | 500 | 120 |
| Example 22 | A-2 | 4 | 2 | 5 | 3 | 4 | 5 | 600 | 600 | 130 |
| Example 23 | A-3 | 2 | 2 | 7 | 3 | 2 | 4 | 500 | 600 | 120 |
| Example 24 | A-4 | 1 | 1 | 6 | 4 | 1 | 4 | 700 | 600 | 130 |
| Example 25 | A-5 | 3 | 1 | 6 | 4 | 1 | 6 | 700 | 600 | 120 |
| Example 26 | A-6 | 3 | 2 | 7 | 5 | 2 | 5 | 800 | 600 | 140 |
| Example 27 | A-7 | 1 | 2 | 4 | 4 | 4 | 6 | 600 | 600 | 120 |
| Example 28 | A-8 | 4 | 1 | 4 | 4 | 2 | 4 | 700 | 500 | 130 |
| Example 29 | A-9 | 2 | 2 | 6 | 3 | 4 | 5 | 600 | 600 | 130 |
| Example 30 | A-10 | 5 | 1 | 6 | 4 | 1 | 4 | 900 | 800 | 150 |
| Comparative Example 3 | Comparative Polymer (1) | 6 | 5 | 4 | 3 | 1 | 5 | 100 | 30 | 100 |

Examples 31 to 40 and Comparative Example 4

Each of Lithographic Printing Plate Precursors 11 to 20 and Comparative Lithographic Printing Plate Precursor 2 was subjected to the laser imagewise exposure in the same manner as in Example 21. Within 30 seconds after the laser imagewise exposure, the exposed lithographic printing plate precursor was put in an oven, heated the entire surface of the lithographic printing plate precursor by blowing hot air to maintain at 110° C. for 15 seconds and then subjected to the development processing within 30 seconds in the same manner as in Example 21 to prepare a lithographic printing plate (with heating). The resulting lithographic printing plate was subjected to the evaluation of printing durability, stain resistance and stain resistance after preservation in the same manner as in Example 21. The printing durability of Comparative Example 4 (without preservation) which was used as the criterion (100) was 15,000 sheets. The results obtained are shown in Table 4.

TABLE 4

| | Coating Solution for Intermediate Layer Polymer for Intermediate Layer | Coating Solution for Photosensitive Layer | | | | | | Stain Resistance | Stain Resistance After Preservation | Printing Durability |
|---|---|---|---|---|---|---|---|---|---|---|
| | | Binder Polymer | Polymerizable Compound | Sensitizing Dye | Polymerization Initiator | Co-Sensitizer A | Co-Sensitizer B | | | |
| Example 31 | A-1 | 6 | 5 | 4 | 3 | 1 | 5 | 600 | 600 | 120 |
| Example 32 | A-2 | 4 | 2 | 5 | 3 | 4 | 5 | 500 | 500 | 130 |
| Example 33 | A-3 | 2 | 2 | 7 | 3 | 2 | 4 | 600 | 400 | 130 |
| Example 34 | A-4 | 1 | 1 | 6 | 4 | 1 | 4 | 500 | 400 | 110 |
| Example 35 | A-5 | 3 | 1 | 6 | 4 | 1 | 6 | 500 | 500 | 130 |
| Example 36 | A-6 | 3 | 2 | 7 | 5 | 2 | 5 | 600 | 500 | 130 |
| Example 37 | A-7 | 1 | 2 | 4 | 4 | 4 | 6 | 600 | 600 | 120 |
| Example 38 | A-8 | 4 | 1 | 4 | 4 | 2 | 4 | 600 | 600 | 130 |
| Example 39 | A-9 | 2 | 2 | 6 | 3 | 4 | 5 | 700 | 600 | 130 |
| Example 40 | A-10 | 5 | 1 | 6 | 4 | 1 | 4 | 800 | 700 | 140 |
| Comparative Example 3 | Comparative Polymer (1) | 6 | 5 | 4 | 3 | 1 | 5 | 100 | 20 | 100 |

From the results described above, it can be seen that as to the lithographic printing plate precursor according to the invention, both stain resistance and printing durability are good and deterioration of the stain resistance due to preservation is remarkably improved.

What is claimed is:

1. A lithographic printing plate precursor comprising, in the following order: a support; an intermediate layer; and an image-forming layer, wherein the intermediate layer comprises a polymer (A) comprising a repeating unit (a1) represented by the following formula (I):

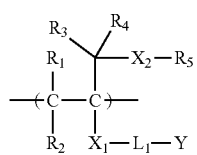

(I)

wherein $R_1$ and $R_2$ each independently represents a hydrogen atom, an alkyl group having from 1 to 6 carbon atoms, an aryl group or an aralkyl group;

$R_3$ and $R_4$ each independently represents a hydrogen atom, an alkyl group having from 1 to 6 carbon atoms, an aryl group or an aralkyl group;

$R_5$ represents a hydrogen atom, an alkyl group having from 1 to 6 carbon atoms, an aryl group, an aralkyl group or $-L_2-Z$;

$X_1$ represents $-O-$, $-CO-$, $-CO-O-$, $-O-CO-$, $-NR_{500}-$, $-NR_{500}-CO-$ or $-CO-NR_{500}-$;

$X_2$ represents $-O-$, $-S-$ or $-NR_{500}-$;

$L_1$ represents a single bond, $-CO-$, $-O-$, $-NR_{500}-$, $-S-$, a divalent aliphatic group, a divalent aromatic group or a divalent connecting group selected from groups formed by combination of these groups;

Y represents a hydrogen atom, an alkyl group having from 1 to 6 carbon atoms, an aryl group, $-OH$, an alkoxy group, $-N(R_{500})(R_{501})$, a cyano group, a group selected from the following group Q, an amido group, a poly(ethyleneoxy) group or a carboxylic acid group not belonging to the group Q or a salt of the carboxylic acid group not belonging to the group Q;

Q is a phosphonic acid group or a salt thereof, a phosphoric acid ester group or a salt thereof, a sulfonic acid group or a salt thereof, a sulfuric acid ester group or a salt thereof, an ammonium group or a salt thereof, a pyridinium group or a salt thereof, a 1,2-dicarboxylic acid group or a salt thereof, a phthalic acid group or a salt thereof, a 1,3-dicarboxylic acid group or a salt thereof, a 1,2-diol group, a catechol group or a salt thereof, a salicylic acid group or a salt thereof, a boronic acid group or a salt thereof, a trialkoxysilyloxy group or a 1,3-dicarbonyl group;

$L_2$ represents $-CO-$, $-O-$, $-NR_{500}-$, $-S-$, a divalent aliphatic group, a divalent aromatic group or a divalent connecting group selected from groups formed by combination of these groups;

Z represents a hydrogen atom, an alkyl group having from 1 to 6 carbon atoms, an aryl group, $-OH$, an alkoxy group, $-N(R_{500})(R_{501})$, a cyano group, a group selected from the group Q, an amido group, a poly(ethyleneoxy) group or a carboxylic acid group not belonging to the group Q or a salt of the carboxylic acid group not belonging to the group Q; and $R_{500}$ and $R_{501}$ each independently represents a hydrogen atom, an alkyl group, an aryl group or an aralkyl group, wherein:

(1) $R_5$ in the formula (I) is -$L_2$-Z, and Z is a group selected from the group Q, an amido group, a poly(ethyleneoxy) group or a carboxylic acid group not belonging to the group Q or a salt of the carboxylic acid group not belonging to the group Q, and/or (2) Y in the formula (I) is a group selected from the group Q, an amido group, a poly(ethyleneoxy) group or a carboxylic acid group not belonging to the group Q or a salt of the carboxylic acid group not belonging to the group Q.

2. The lithographic printing plate precursor as claimed in claim 1, wherein $X_2$ in the formula (I) is —O—.

3. The lithographic printing plate precursor as claimed in claim 2, wherein $R_5$ in the formula (I) is a hydrogen atom.

4. The lithographic printing plate precursor as claimed in claim 1, wherein $R_5$ in the formula (I) -$L_2$-Z, and Z is a group selected from the group Q, an amido group, a poly(ethyleneoxy) group or a carboxylic acid group not belonging to the group Q or a salt of the carboxylic acid group not belonging to the group Q.

5. The lithographic printing plate precursor as claimed in claim 4, wherein Z is a phosphoric acid ester group or a salt thereof, a phosphonic acid group or a salt thereof, an ammonium group, a sulfonic acid group or a salt thereof, an amido group, a poly(ethyleneoxy) group or a carboxylic acid group or a salt thereof.

6. The lithographic printing plate precursor as claimed in claim 1, wherein Y in the formula (I) is a group selected from the group Q, an amido group, a poly(ethyleneoxy) group or a carboxylic acid group not belonging to the group Q or a salt of the carboxylic acid group not belonging to the group Q.

7. The lithographic printing plate precursor as claimed in claim 6, wherein Y in the formula (I) is a phosphoric acid ester group or a salt thereof, a phosphonic acid group or a salt thereof, an ammonium group, a sulfonic acid group or a salt thereof, an amido group, a poly(ethyleneoxy) group or a carboxylic acid group or a salt thereof.

8. The lithographic printing plate precursor as claimed in claim 1, wherein the polymer (A) further comprises a repeating unit (a2) having at least one ethylenically unsaturated bond.

9. The lithographic printing plate precursor as claimed in claim 8, wherein the polymer (A) further comprises at least one of a repeating unit (a3) having at least one functional group capable of interacting with a surface of the support and a repeating unit (a4) having at least one hydrophilic group, other than the repeating unit (a1).

10. The lithographic printing plate precursor as claimed in claim 1, wherein the image-forming layer comprises (B) a polymerization initiator, (C) a polymerizable compound and (D) a binder polymer.

11. The lithographic printing plate precursor as claimed in claim 10, wherein the image-recording layer further comprises (E) a sensitizing dye.

12. A method for preparing a lithographic printing plate comprising: imagewise exposing the lithographic printing plate precursor as claimed in claim 1; and subjecting the exposed lithographic printing plate precursor to development processing and gum treatment with one solution in an automatic processor.

13. The method for preparing a lithographic printing plate as claimed in claim 12. wherein pH of the solution is from 2 to 10.

* * * * *